United States Patent
Xu et al.

(10) Patent No.: US 10,787,385 B2
(45) Date of Patent: *Sep. 29, 2020

(54) LOW-E MATCHABLE COATED ARTICLES HAVING ABSORBER FILM AND CORRESPONDING METHODS

(71) Applicant: GUARDIAN GLASS, LLC, Auburn Hills, MI (US)

(72) Inventors: Yongli Xu, Plymouth, MI (US); Salah Boussaad, Auburn Hills, MI (US); Jingyu Lao, Saline, MI (US)

(73) Assignee: GUARDIAN GLASS, LLC, Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/784,588

(22) Filed: Feb. 7, 2020

(65) Prior Publication Data
US 2020/0255330 A1    Aug. 13, 2020

Related U.S. Application Data

(63) Continuation-in-part of application No. 16/355,966, filed on Mar. 18, 2019, now Pat. No. 10,640,418, (Continued)

(51) Int. Cl.
  *B32B 15/04*    (2006.01)
  *B32B 17/06*    (2006.01)
  (Continued)

(52) U.S. Cl.
  CPC ........ *C03C 17/366* (2013.01); *C03C 17/3639* (2013.01); *C03C 17/3644* (2013.01); (Continued)

(58) Field of Classification Search
  USPC ........ 428/426, 428, 432, 434, 688, 701, 702
  See application file for complete search history.

(56) References Cited

U.S. PATENT DOCUMENTS 4,610,771 A * 9/1986 Gillery .................... C03C 17/36
                                                    204/192.1
4,769,291 A * 9/1988 Belkind .............. C03C 17/3644
                                                        428/630
(Continued)

FOREIGN PATENT DOCUMENTS

EP        1641723 B1    1/2008
WO    03/020656 A1    3/2003
(Continued)

OTHER PUBLICATIONS

International Search Report and Written Opinion for International Application No. PCT/IB2019/056043, dated Dec. 16, 2019, pp. 13.
(Continued)

*Primary Examiner* — Lauren R Colgan

(57) ABSTRACT

A low-E coating has good color stability (a low ΔE* value) upon heat treatment (HT). Thermal stability may be improved by the provision of an as-deposited crystalline or substantially crystalline layer of or including zinc oxide, doped with at least one dopant (e.g., Sn), immediately under an infrared (IR) reflecting layer of or including silver; and/or by the provision of at least one dielectric layer of or including an oxide of zirconium. These have the effect of significantly improving the coating's thermal stability (i.e., lowering the ΔE* value). An absorber film may be designed to adjust visible transmission and provide desirable coloration, while maintaining durability and/or thermal stability. The dielectric layer (e.g., of or including an oxide of Zr) may be sputter-deposited so as to have a monoclinic phase in order to improve thermal stability.

60 Claims, 64 Drawing Sheets

Related U.S. Application Data which is a continuation-in-part of application No. 16/220,037, filed on Dec. 14, 2018, and a continuation-in-part of application No. 16/035,810, filed on Jul. 16, 2018, now Pat. No. 10,301,215.

(51) Int. Cl.
| | | |
|---|---|---|
| *C03C 17/36* | (2006.01) | |
| *C23C 14/00* | (2006.01) | |
| *C23C 14/08* | (2006.01) | |
| *C23C 14/18* | (2006.01) | |
| *C23C 14/34* | (2006.01) | |

(52) U.S. Cl.
CPC ........ *C23C 14/0036* (2013.01); *C23C 14/083* (2013.01); *C23C 14/086* (2013.01); *C23C 14/185* (2013.01); *C23C 14/3464* (2013.01); *C03C 2218/155* (2013.01)

(56) References Cited

U.S. PATENT DOCUMENTS

| | | | | |
|---|---|---|---|---|
| 5,199,979 | A * | 4/1993 | Lin | C09D 1/00 |
| | | | | 106/287.14 |
| 5,279,722 | A * | 1/1994 | Szczyrbowski | C03C 17/36 |
| | | | | 204/192.26 |
| 5,376,455 | A | 12/1994 | Hartig et al. | |
| 5,552,180 | A * | 9/1996 | Finley | C03C 17/09 |
| | | | | 204/192.27 |
| 5,563,734 | A | 10/1996 | Wolfe et al. | |
| 5,688,585 | A | 11/1997 | Lingle et al. | |
| 5,800,933 | A | 9/1998 | Hartig et al. | |
| 5,821,001 | A * | 10/1998 | Arbab | C03C 17/36 |
| | | | | 428/623 |
| 5,942,338 | A * | 8/1999 | Arbab | C03C 17/36 |
| | | | | 428/623 |
| 6,010,602 | A | 1/2000 | Arbab et al. | |
| 6,014,872 | A | 1/2000 | Hartig et al. | |
| 6,045,896 | A * | 4/2000 | Boire | C03C 17/36 |
| | | | | 204/192.23 |
| 6,106,605 | A * | 8/2000 | Basil | C09D 183/06 |
| | | | | 106/287.12 |
| 6,291,867 | B1 * | 9/2001 | Wallace | H01L 21/28185 |
| | | | | 257/410 |
| 6,440,592 | B1 * | 8/2002 | Meyer | C03C 17/245 |
| | | | | 204/192.22 |
| 6,495,251 | B1 * | 12/2002 | Arbab | C03C 17/3435 |
| | | | | 428/336 |
| 6,576,349 | B2 * | 6/2003 | Lingle | B32B 17/10009 |
| | | | | 428/426 |
| 6,579,427 | B1 | 6/2003 | Arbab et al. | |
| 6,586,102 | B1 * | 7/2003 | Stachowiak | C03C 17/36 |
| | | | | 428/426 |
| 6,589,658 | B1 * | 7/2003 | Stachowiak | C03C 17/36 |
| | | | | 428/426 |
| 6,632,491 | B1 * | 10/2003 | Thomsen | C03C 17/36 |
| | | | | 156/109 |
| 6,716,532 | B2 * | 4/2004 | Neuman | C03C 17/3435 |
| | | | | 428/428 |
| 6,749,941 | B2 * | 6/2004 | Lingle | C03C 17/36 |
| | | | | 427/165 |
| 6,797,389 | B1 * | 9/2004 | Depauw | B32B 17/10036 |
| | | | | 427/163.1 |
| 6,802,943 | B2 * | 10/2004 | Stachowiak | C03C 17/36 |
| | | | | 204/192.12 |
| 6,808,606 | B2 * | 10/2004 | Thomsen | B05D 5/083 |
| | | | | 204/192.26 |
| 7,153,578 | B2 * | 12/2006 | Chonlamaitri | C03C 17/3626 |
| | | | | 428/428 |
| 7,473,471 | B2 | 1/2009 | Finley et al. | |
| 7,632,571 | B2 * | 12/2009 | Hartig | C03C 17/36 |
| | | | | 428/432 |
| 8,389,121 | B2 | 3/2013 | Disteldorf et al. | |
| 8,663,433 | B2 | 3/2014 | Chonlamaitri et al. | |
| 9,630,875 | B2 * | 4/2017 | McSporran | C03C 17/36 |
| 9,932,267 | B2 | 4/2018 | Polcyn et al. | |
| 10,100,202 | B2 * | 10/2018 | Disteldorf | C03C 17/366 |
| 10,138,158 | B2 * | 11/2018 | Ding | C03C 17/3652 |
| 10,138,159 | B2 * | 11/2018 | Ding | C03C 17/36 |
| 10,301,215 | B1 * | 5/2019 | Xu | C03C 17/3649 |
| 2003/0170466 | A1 * | 9/2003 | Stachowiak | C03C 17/36 |
| | | | | 428/432 |
| 2003/0232197 | A1 * | 12/2003 | Disteldorf | C03C 17/36 |
| | | | | 428/411.1 |
| 2004/0197574 | A1 * | 10/2004 | Stachowiak | C03C 17/36 |
| | | | | 428/432 |
| 2004/0214012 | A1 * | 10/2004 | Stachowiak | C03C 17/3626 |
| | | | | 428/426 |
| 2004/0214013 | A1 * | 10/2004 | Stachowiak | C03C 17/3639 |
| | | | | 428/426 |
| 2004/0224167 | A1 * | 11/2004 | Stachowiak | C03C 17/3626 |
| | | | | 428/432 |
| 2005/0155695 | A1 * | 7/2005 | O'Shaughnessy | C03C 17/3618 |
| | | | | 156/99 |
| 2006/0121290 | A1 * | 6/2006 | Chonlamaitri | C03C 17/3626 |
| | | | | 428/428 |
| 2007/0082205 | A1 * | 4/2007 | Anzaki | C03C 17/36 |
| | | | | 428/432 |
| 2008/0138547 | A1 | 6/2008 | Maschwitz | |
| 2008/0311389 | A1 * | 12/2008 | Roquiny | C03C 17/366 |
| | | | | 428/336 |
| 2009/0136765 | A1 * | 5/2009 | Maschwitz | C03C 17/3613 |
| | | | | 428/432 |
| 2010/0178492 | A1 * | 7/2010 | Schicht | C23C 14/086 |
| | | | | 428/336 |
| 2011/0027562 | A1 | 2/2011 | Di Stefano | |
| 2011/0236715 | A1 * | 9/2011 | Polcyn | C03C 17/366 |
| | | | | 428/623 |
| 2012/0087005 | A1 * | 4/2012 | Reymond | C03C 17/3613 |
| | | | | 359/360 |
| 2012/0177899 | A1 * | 7/2012 | Unquera | C03C 17/3626 |
| | | | | 428/213 |
| 2014/0141261 | A1 * | 5/2014 | Imran | C03C 17/3435 |
| | | | | 428/432 |
| 2016/0122235 | A1 * | 5/2016 | Zhang | C03C 17/3681 |
| | | | | 428/622 |
| 2018/0251886 | A1 * | 9/2018 | Lu | C23C 14/18 |
| 2020/0017405 | A1 | 1/2020 | Xu et al. | |

FOREIGN PATENT DOCUMENTS

| | | |
|---|---|---|
| WO | 2006/062903 A1 | 6/2006 |
| WO | 2020016762 A1 | 1/2020 |
| WO | 2020021387 A1 | 1/2020 |

OTHER PUBLICATIONS

International Search Report and Written Opinion for International Application No. PCT/IB2019/060863, dated Mar. 11, 2020, pp. 9.
Notice of Allowance received for U.S. Appl. No. 16/596,632, dated Feb. 5, 2020, 20 pages.
International search report and written opinion received for PCT application No. PCT/IB2020/052404, dated May 28, 2020, 13 pages.

* cited by examiner

Example 1

| | materials | Power, kW | Voltage | Ar, ml | O2 setpoint | N2 setpoint | O2 tune, ml | N2 tune | O2 offset, ml | N2 offset, ml | LS, m/min | PC | Thickness (nm) |
|---|---|---|---|---|---|---|---|---|---|---|---|---|---|
| P1 | ZnSnO, C-16 | 60 | 650 | 600 | 840 | 0 | 250 | | 130 | | 2.36 | 16 | 47.0 |
| P2 | Ag, C-8 | 7.89 | 429 | 700 | | 0 | 0 | | | | 6 | | 15.1 |
| | NiCr, C-10 | 16.4 | | 130 | 66 | 0 | 66 | | | | 6 | | 4.1 |
| | ZnSn, C-14 | 60 | 522 | 400 | 1200 | 0 | 250 | | 130 | | 0.88 | 22 | 73.6 |
| P2 Rev | ZnSnO, C-16 | 60 | 650 | 600 | 840 | 0 | 250 | | 130 | | 6 | 16 | 17.7 |
| P3 | Ag, C-8 | 12.13 | 422 | 700 | 0 | 0 | 0 | | | | 6.0 | | 23.2 |
| | NiCr, C-10 | 16.4 | | 150.54 | 66 | 0 | 66 | | 130 | | 6.0 | | 4.1 |
| | ZnSn, C-14 | 60 | 522 | 400 | 1,200 | 0 | 250 | | 130 | | 6.0 | 22 | 10.8 |
| P4 | SiAl, C-12 | 60 | 533 | 400 | 0 | 420 | 250 | 250 | | 130 | 3.37 | 9 | 29.1 |

Fig. 2

Example 2

| | materials | Power, kW | Voltage | Ar, ml | O2 setpoint | N2 setpoint | O2 tune, ml | N2 tune | O2 offset, ml | N2 offset, ml | LS, m/min | RC | Thickness (nm) |
|---|---|---|---|---|---|---|---|---|---|---|---|---|---|
| P1 | ZnSnO, C-16 | 60 | 650 | 600 | 840 | 0 | 250 | | 130 | | 2.26 | 16 | 43.0 |
| P2 | Ag, C-8 | 7.89 | 429 | 700 | 0 | 0 | 0 | | | | 6 | | 13.1 |
| | NiCr, C-10 | 16.4 | 513/369sw | 150 | 61 | 0 | 61 | | | | 6 | | 4.1 |
| P2 Rev | ZnSn, C-14 | 60 | 522 | 400 | 1200 | 0 | 250 | | 130 | | 0.88 | 23 | 73.6 |
| P3 | ZnSnO, C-16 | 60 | 650 | 600 | 840 | 0 | 250 | | 130 | | 6 | 16 | 17.7 |
| | Ag, C-8 | 8.12 / 2.24 | 422 | 700 | 0 | 0 | 0 | | | | 6 | | 23.2 |
| | Ble-NiCr, C-10 | 16.4 | 513/266sw | 150 | 61 | 0 | 61 | sputter | 130 | | 6 | 23 | 4.1 |
| | Si-ZnSn, C-14 | 60 | 522 | 400% | 1200 | 0 | 250 | sputter/react | 130 | | 6 | 23 | 10.8 |
| P4 | SiN, C-12 | 60 | 623 | 400 | 0 | 420 | 0 | 250% | | 130 | 3.37 | 9 | 19.1 |

Fig. 3

| Example 1 | | | | |
|---|---|---|---|---|
| Glass | 3376 | HT | HTK | HTHXB |
| TY | 74.7 | 77.0 | 72.0 | 75.9 |
| L* | 89.3 | 90.3 | 90.3 | 89.8 |
| a* | -4.7 | -3.5 | -3.5 | -3.2 |
| b* | 5.8 | 4.9 | 4.4 | 2.2 |
| RgY | 9.6 | 9.8 | 10.5 | 11.3 |
| L* | 37.1 | 37.5 | 38.6 | 40.1 |
| a* | -1.1 | -0.7 | -3.6 | -8.2 |
| b* | -10.1 | -10.5 | -9.2 | -4.4 |
| RfY | 9.9 | 10.7 | 10.7 | 11.0 |
| L* | 37.7 | 38.1 | 39.0 | 39.6 |
| a* | -1.5 | -1.8 | -3.1 | -5.6 |
| b* | -5.7 | -8.0 | -7.6 | -4.5 |
| SR | 2.09 | 1.75 | 1.71 | 1.69 |
| ΔE TY | | 1.8 | 2.1 | 1.9 |
| ΔE Rg | | 0.7 | 3.1 | 9.6 |
| ΔE Rf | | 2.4 | 2.8 | 4.7 |
| Sum ΔE | | 4.9 | 8.0 | 18.7 |

| Example 2 | | | | |
|---|---|---|---|---|
| Glass | 3324 | HT | HTK | HTHXB |
| TY | 73.8 | 76.1 | 75.8 | 76.2 |
| L* | 88.8 | 89.9 | 90.2 | 90.0 |
| a* | -4.7 | -3.4 | -3.4 | -3.7 |
| b* | 7.8 | 6.6 | 5.9 | 3.5 |
| RgY | 11.1 | 11.1 | 11.4 | 11.1 |
| L* | 40.1 | 40.1 | 40.2 | 39.7 |
| a* | -0.6 | -0.1 | -2.3 | -5.4 |
| b* | -13.5 | -13.6 | -12.9 | -8.6 |
| RfY | 11.5 | 12.0 | 11.8 | 11.0 |
| L* | 40.6 | 41.2 | 40.9 | 39.6 |
| a* | -2.7 | -2.8 | -3.8 | -3.7 |
| b* | -7.1 | -8.7 | -10.1 | -8.5 |
| SR | 2.05 | 0.00 | 0.00 | 1.79 |
| ΔE TY | | 2.1 | 2.7 | 4.6 |
| ΔE Rg | | 0.5 | 1.8 | 6.9 |
| ΔE Rf | | 1.5 | 3.1 | 2.0 |
| Sum ΔE | | 4.2 | 7.7 | 13.5 |

Example 3

| | materials | Power, kW | Voltage | Ar, ml | O2 setpoint | N2 setpoint | O2 tune, ml | N2 tune | O2 offset, ml | N2 offset, ml | LS, m/min | AC | Thickness (nm) |
|---|---|---|---|---|---|---|---|---|---|---|---|---|---|
| P1 | ZnSnO, C-14 | 68 | 650 | 600 | 840 | 0 | 250 | | 130 | | 2.84 | 16 | 42.50 |
| | Ag, C-8 | 7.52 | 429 | 700 | 69 | 0 | 0 | | | | 6 | | |
| P2 | NiCr, C-10 | 5.7 | 7 | 150 | | | | | | | 6 | | |
| | ZnSn, C-16 | 60 | 522 | 400 | 1200 | 0 | 250 | | 130 | | 0.90 | 22 | 72.67 |
| P3 | ZnSnO, C-14 | 60 | 650 | 600 | 840 | 0 | 250 | | 130 | | 6.17 | 16 | 18.18 |
| | Ag, C-8 | 12.3 | 432 | 700 | 0 | 0 | 0 | | | | 6 | | |
| P4 | NiCr, C-10 | | 7 | 150 | 69 | 0 | 69 | | | | 6 | 22 | 16.90 |
| | ZnSn, C-16 | 60 | 532 | 400 | 1200 | 0 | 250 | | 130 | | 6 | | |
| P5 | SiAl, C-12 | 60 | 671 | 400 | 0 | 420 | | 250 | | 130 | 3.10 | 9 | 20.90 |

Fig. 6

Example 4

| | materials | Power, kW | Voltage | Ar, ml | O2 setpoint | N2 setpoint | O2 tune, ml | N2 tune | O2 offset, ml | N2 offset, ml | LS, m/min | RC | Thickness (nm) |
|---|---|---|---|---|---|---|---|---|---|---|---|---|---|
| P1 | ZnSn90, C.14 | 60 | 650 | 600 | 840 | 0 | 250 | | 130 | | 2.68 | 16 | 42.50 |
| P2 | Ag, C.8 | 7.52 | 429 | 700 | 0 | 0 | 0 | | | | 6 | | |
| | NiCr, C.10 | 6.5 | ? | 150 | 0 | 0 | 55 | | | | 6 | | |
| P3 | ZnSn, C.16 | 60 | 522 | 400 | 1200 | 0 | 250 | | 130 | | 0.90 | 22 | 72.57 |
| | ZnSn90, C.14 | 60 | 650 | 600 | 840 | 0 | 250 | | 130 | | 6.17 | 16 | 18.18 |
| P4 | Ag, C.8 | 12.3 | 422 | 700 | 0 | 0 | 0 | | | | 6 | | |
| | NiCr, C.10 | 6 | ? | 150 | 55 | 0 | 55 | | | | 6 | | |
| | ZnSn, C.16 | 60 | 521 | 400 | 1200 | 0 | 250 | | 130 | | 6 | | 10.90 |
| P5 | SiN, C.12 | 60 | 631 | 400 | 0 | 420 | 0 | 250 | | 130 | 3.10 | 9 | 20.90 |

Example 5

| | materials | Power, kW | Voltage | Ar, ml | O2 setpoint | N2 setpoint | O2 tune, ml | N2 tune | O2 offset, ml | N2 offset, ml | LS, m/min | SC | Thickness (nm) |
|---|---|---|---|---|---|---|---|---|---|---|---|---|---|
| E3 | ZnSnO, C-1 | 60 | 650 | 600 | 840 | 0 | 250 | | 130 | | 2.38 | 16 | 45.3 |
| | Ag, C-8 | 8.36 | 429 | 700 | 0 | 0 | 0 | | | | 0 | | 9.3 |
| | NiCr, C-10 | 4.09 | | 150 | 30 | 0 | 30 | | | | 0 | | 2.4 |
| | ZnSn, C-34 | 60 | 522 | 400 | 1200 | 0 | 250 | | 130 | | 0.86 | 22 | 69.8 |
| E2 | ZnSnO, C-1 | 60 | 650 | 600 | 840 | 0 | 250 | | 130 | | 0 | 16 | 19.5 |
| | Ag, C-8 | 12.27 | 429 | 700 | 0 | 0 | 0 | | | | 0 | | 12.3 |
| | NiCr, C-10 | 9.54 | | 150 | 28 | 0 | 29 | | | | 0 | | 2.4 |
| | ZnSn, C-14 | 60 | 522 | 400 | 1200 | 0 | 250 | | 130 | | 0 | 22 | 10.0 |
| | SiAl, C-16 | 60 | 631 | 400 | 0 | 420 | 0 | 250 | | 130 | 0 | | 10.3 |
| E5 | SiAl, C-16 | 60 | 631 | 400 | 0 | 420 | 0 | 250 | | 130 | 4.65 | 0 | 13.3 |

Fig. 9

Example 6

| | materials | Power, kW | Voltage | Ar, ml | O2 setpoint | N2 setpoint | O2 tune, ml | N2 tune | O2 offset, ml | N2 offset, ml | LS, m/min | AC | Thickness (nm) |
|---|---|---|---|---|---|---|---|---|---|---|---|---|---|
| P1 | ZnSnSiO, C-1 | 60 | 650 | 600 | 840 | 0 | 250 | | 130 | | 2.58 | 16 | 42.9 |
| | Ag, C-8 | 8.36 | 429 | 700 | 0 | 0 | 0 | | | | 6 | | 8.4 |
| | NiCr, C-10 | 11% | 513/277 | 150 | 0 | 0 | 59 | | | | 6 | | 2.7 |
| | ZnSn, C-14 | 60 | 522 | 400 | 1200 | 0 | 250 | | 130 | | 0.84 | 32 | 70.9 |
| P2 | ZnSnSiO, C-1 | 60 | 659 | 600 | 840 | 0 | 250 | | 130 | | 6 | 16 | 18.5 |
| | Ag, C-8 | 12.6 | 422 | 700 | 0 | 0 | 0 | | | | 6 | | 12.8 |
| | NiCr, C-10 | 11.9 | 553/277 | 150 | 0 | 0 | 59 | | | | 6 | | 2.7 |
| | ZnSn, C-14 | 60 | 522 | 400 | 1200 | 0 | 250 | | 130 | | 6 | 22 | 9.9 |
| | SnA, C-16 | 60 | 621 | 400 | 0 | 470 | | 250 | | 130 | 6 | 9 | 10.5 |
| P3 | SnA, C-18 | 60 | 621 | 400 | 0 | 420 | | 250 | | 130 | 4.83 | 9 | 13.5 |

Fig. 11

Example 6

| | AF | MF | MB | MBX |
|---|---|---|---|---|
| TY | 74.0 | 76.9 | 77.8 | 77.5 |
| L* | 88.9 | 90.3 | 90.7 | 90.6 |
| a* | -4.8 | -2.9 | -2.8 | -2.6 |
| b* | 4.5 | 3.7 | 3.6 | 2.5 |
| RgY | 9.5 | 9.4 | 10.2 | 10.9 |
| L* | 36.9 | 36.7 | 38.1 | 39.3 |
| a* | -1.4 | -0.8 | -3.0 | -4.9 |
| b* | -8.8 | -9.3 | -8.1 | -5.4 |
| RrY | 9.0 | 9.4 | 10.2 | 10.5 |
| L* | 35.9 | 36.7 | 38.1 | 38.6 |
| a* | 0.4 | -3.5 | -4.1 | -7.1 |
| b* | -5.3 | -5.3 | -4.5 | -7.2 |
| SB | 2.73 | 1.83 | 1.76 | 1.75 |
| ΔET | | 2.5 | 2.8 | 3.5 |
| ΔE Rg | | 1.1 | 2.1 | 6.9 |
| ΔE Rr | | 2.0 | 5.1 | 8.6 |
| Sum ΔE | | 5.6 | 10.0 | 19.0 |

Fig. 12

Example 7

| | materials | Power, kW | Voltage | Ar, ml | O2 setpoint | N2 setpoint | O2 tune, ml | N2 tune | O2 offset, ml | N2 offset, ml | LS, m/min | RC | Thickness (nm) |
|---|---|---|---|---|---|---|---|---|---|---|---|---|---|
| P1 | ZnSnO, C-1 | 60 | 529 | 600 | 840 | 0 | 250 | | 130 | | 2.32 | 16 | 47.6 |
| | Ag, C-8 | 7.4 | 429 | 700 | 0 | 0 | 0 | | | | 6 | | 7.4 |
| | NiCr, C-10 | 11.2 | 488/340 | 150 | 88 | 0 | 88 | | | | 6 | | 2.8 |
| | ZnSn, C-16 | 60 | 435 | 400 | 1200 | 0 | 250 | | 130 | | 0.782 | 22 | 76.0 |
| P2 | ZnSnO, C-1 | 60 | 525 | 600 | 840 | 0 | 250 | | 130 | | 6 | 16 | 18.4 |
| | Ag, C-8 | 12.06 | 422 | 700 | 0 | 0 | 0 | | | | 6 | | 12.1 |
| | NiCr, C-10 | 11.2 | 488/340 | 150 | 88 | 0 | 88 | | | | 6 | | 2.8 |
| | ZnSn, C-16 | 60 | 532 | 400 | 1200 | 0 | 250 | | 130 | | 5.76 | 22 | 10.3 |
| P3 | SiN, C-14 | 60 | 621 | 400 | 0 | 420 | | 250 | | 130 | 3.08 | 9 | 21.0 |

Fig. 13

Example 7

| | GL25 | M5 | M15 | M100 |
|---|---|---|---|---|
| TY | 73.2 | 77.8 | 77.8 | 76.9 |
| L* | 88.5 | 90.7 | 90.7 | 90.3 |
| a* | -4.9 | -3.0 | -3.0 | -2.1 |
| b* | 4.3 | 3.8 | 3.7 | 2.3 |
| RgY | 10.3 | 10.1 | 10.9 | 12.2 |
| L* | 38.0 | 37.9 | 37.9 | 41.6 |
| a* | -0.5 | 0.0 | -4.0 | -7.2 |
| b* | -8.5 | -7.6 | -8.5 | -2.1 |
| RfY | 9.7 | 10.4 | 11.2 | 12.4 |
| L* | 37.2 | 38.6 | 40.0 | 41.8 |
| a* | 0.6 | 1.5 | -3.5 | -7.0 |
| b* | -2.5 | -1.6 | -2.5 | 1.9 |
| SR | 2.16 | 1.63 | 1.63 | 1.55 |
| ΔET | | 2.9 | 3.0 | 3.9 |
| ΔE Rg | | 1.1 | 3.5 | 10.0 |
| ΔE Rf | | 2.6 | 5.1 | 9.8 |
| Sum ΔE | | 6.7 | 11.6 | 23.7 |

Fig. 14

Example 8

| 5450 | materials | Power, kW | Voltage | Ar, ml | O2 setpoint | N2 setpoint | O2 tune, ml | N2 tune | O2 offset, ml | N2 offset, ml | LS, m/min | RC | Thickness (nm) |
|---|---|---|---|---|---|---|---|---|---|---|---|---|---|
| P1 | ZnSnSi, C-12 | 60 | 650 | 600 | 840 | 0 | 250 | | 130 | | 2.8 | 16 | 42.7 |
| P2 | Ag, C-8 | 9.25 | 429 | 700 | 0 | 0 | 0 | | | | 6 | | 17.7 |
| | NiCr, C-10 | 3A.5 | 555/256.4 | 150 | 49 | 0 | 49 | | | | 6 | | 3.6 |
| | ZnSn, C-14 | 60 | 522 | 460 | 1200 | 0 | 250 | | | | 0.88 | 22 | 68.2 |
| P3 | ZnSnSiO, C-17 | 60 | 650 | 600 | 840 | 0 | 250 | | 130 | | 6 | 16 | 18.5 |
| P4 | Ag, C-8 | 14.89 | 422 | 780 | 0 | 0 | 0 | | | | 6 | | 26.6 |
| | NiCr, C-10 | 3A.5 | 555/256.5 | 150 | 49 | 0 | 49 | | | | 6 | 22 | 3.6 |
| | ZnSn, C-14 | 60 | 522 | 400 | 1200 | 0 | 250 | | 130 | | 6 | | 10.0 |
| | SiAl, C-16 | 60 | 621 | 400 | 0 | 420 | 0 | 250 | | 130 | 8 | 9 | 10.2 |
| P5 | SiAl, C-15 | 60 | 621 | 400 | 0 | 420 | 0 | 250 | | 130 | 4.25 | 9 | 14.4 |

Fig. 15

Example 9

| Layer stack | thickness, nm |
|---|---|
| SiAlN | 34.1 |
| Zn2SnO4 | 10.0 |
| NiCrOx | 3.9 |
| Ag2 | 15.6 |
| ZnO - doped | 18.2 |
| Zn2SnO4 | 72.3 |
| NiCrOx | 3.9 |
| Ag1 | 9.8 |
| ZnO - doped | 45.2 |
| Glass | |

Example 10

| | materials | Power, kW | Voltage | Ar, ml | O2 setpoint | N2 setpoint | O2 tune, ml | N2 tune | O2 offset, ml | N2 offset, ml | LS, m/min | RC | Thickness (nm) |
|---|---|---|---|---|---|---|---|---|---|---|---|---|---|
| RU 5400 | | | | | | | | | | | | | |
| P1 | ZnSnO, C-12 | 60 | 650 | 600 | 840 | 0 | 250 | | 130 | | 2.48 | 16 | 45.2 |
| P2 | Ag, C-8 | 9.83 | 429 | 700 | 49 | 0 | 0 | | | | 6 | | 9.8 |
| | NiCr, C-10 | | | 150 | | | | | | | | | |
| | ZnSn, C-14 | | | 400 | 1200 | 0 | 45 | | 130 | | 6 | 22 | 3.9 |
| P3 | ZnSnO, C-12 | 60 | 650 | 600 | 840 | 0 | 250 | | 130 | | 0.83 | 16 | 72.3 |
| P4 | Ag, C-8 | 15.84 | 422 | 700 | 0 | 0 | 0 | | | | 6.13 | | 18.2 |
| | NiCr, C-10 | | | 150 | 49 | | 45 | | | | 6 | 22 | 15.6 |
| | ZnSn, C-14 | 60 | 522 | 400 | 1200 | 0 | 250 | | 130 | | 6 | | 3.9 |
| P5 | SiAl, C-38 | 60 | 621 | 400 | 0 | 420 | 0 | 250 | | 130 | 6 | 9 | 10.0 |
| | SiAl, C-38 | 60 | 621 | 400 | 0 | 420 | 0 | 250 | | 130 | 4.9 | 9 | 10.9 |

Fig. 12

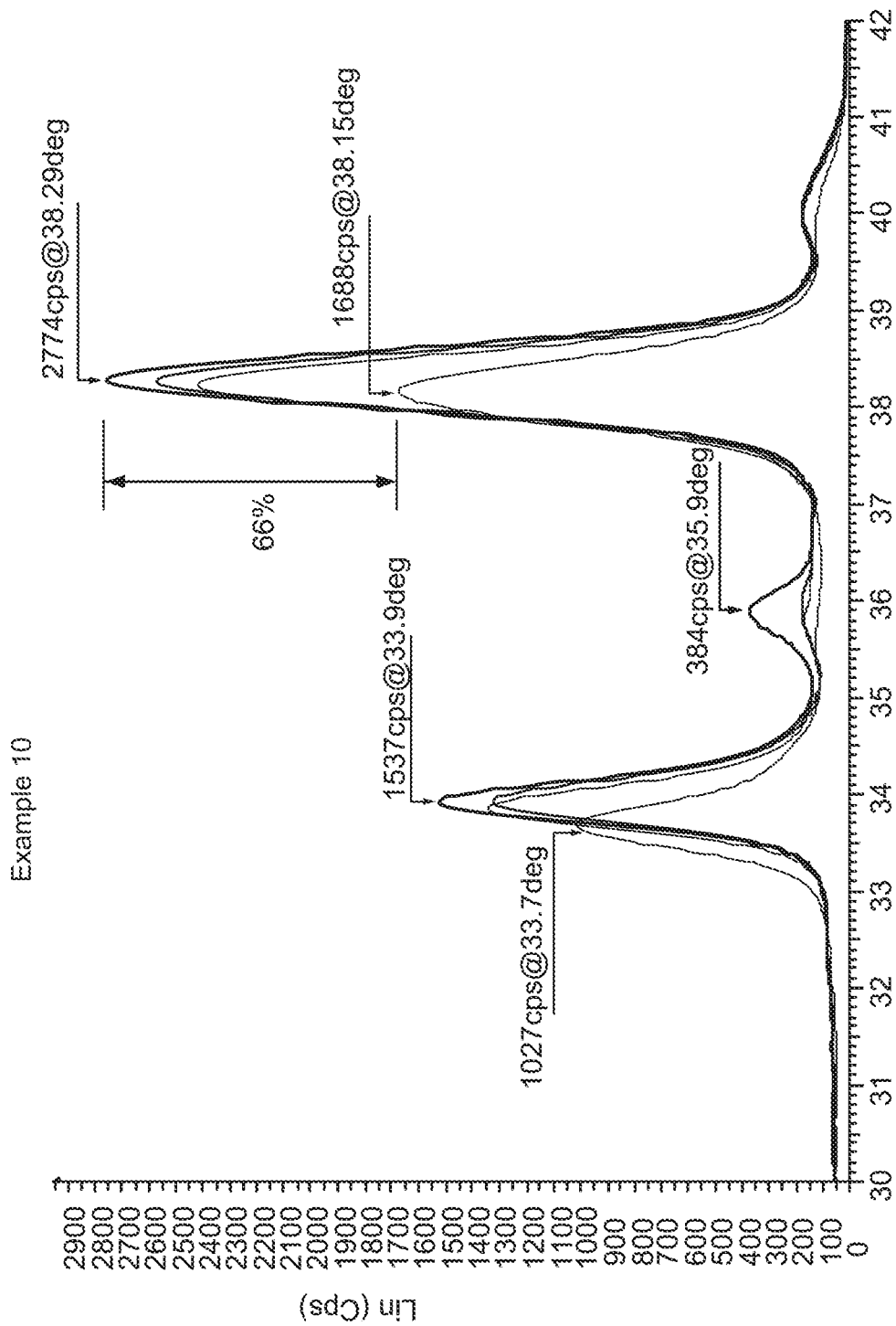

Fig. 24

Example 12

| KU 5450 | materials | Power, kW | Voltage | Ar, ml | O2 setpoint | N2 setpoint | O2 tune, ml | N2 tune | O2 offset, ml | N2 offset, ml | LS, m/min | RC | Thickness (nm) |
|---|---|---|---|---|---|---|---|---|---|---|---|---|---|
| reverse | SiZrO, C-3 | 60 | 650 | 600 | 490 | 0 | 150 | 0 | 0 | 0 | 3.60 | 8.5 | 10.0 |
|  | ZnSnSiO, C-1 | 80 | 429 | 600 | 840 | 0 | 250 | 0 | 130 | 0 | 2.70 | 16 | 11.0 |
| P1 | Ag, C-8 | 8.36 | 429 | 700 | 0 | 0 | 0 | 0 | 0 | 0 | 6 | | 8.4 |
|  | NiCr, C-10 | 10.6 | | 130 | 0 | 0 | 54 | 0 | 0 | 0 | 6 | | 2.7 |
|  | ZnSn, C-14 | 60 | 522 | 400 | 1200 | 0 | 250 | 0 | 130 | 0 | 0.84 | 22 | 10.9 |
| P2 | ZnSnOx, C-3 | 60 | 550 | 600 | 840 | 0 | 250 | 0 | 130 | 0 | 6 | 16 | 18.5 |
|  | Ag, C-8 | 12.8 | 422 | 700 | 0 | 0 | 0 | 0 | 0 | 0 | 6 | | 12.8 |
|  | NiCr, C-10 | 10.6 | | 150 | 0 | 0 | 54 | 0 | 0 | 0 | 6 | | 2.7 |
|  | ZnSn, C-14 | 60 | 522 | 400 | 1200 | 0 | 250 | 0 | 130 | 0 | 6 | 22 | 9.9 |
|  | SnA, C-16 | 60 | 613 | 400 | 0 | 420 | 0 | 250 | 0 | 130 | 6 | 9 | 10.5 |
| P3 | SnA, C-16 | 60 | 613 | 400 | 0 | 420 | 0 | 250 | 0 | 130 | 4.65 | 9 | 33.5 |

Fig. 25

Example 13

| XS 5450 | materials | Power, kW | Voltage | V, ml | O2 setpoint | N2 setpoint | O2 tune, ml | N2 tune | O2 offset, ml | N2 offset, ml | LS, m/min | %C | Thickness (nm) |
|---|---|---|---|---|---|---|---|---|---|---|---|---|---|
| Innolux | SiO2, C.3 | 60 | 650 | 600 | 880 | 0 | 150 | 0 | 0 | 0 | 1.80 | 9.5 | 160 |
| | ZnSnO, C.1 | 60 | 475 | 400 | 880 | 0 | 250 | 0 | 130 | 0 | 2.83 | 18 | 200 |
| P1 | Ag, C.6 | 0.36 | | 150 | 0 | 0 | 0 | 0 | 0 | 0 | 6 | | 12 |
| | NiCr, C.10 | 60 | 522 | 400 | 1200 | 0 | 50 | 0 | 190 | 0 | 0.84 | | 22 |
| | ZnSn, C.14 | 60 | 650 | 600 | 880 | 0 | 250 | 0 | 130 | 0 | 6 | 17 | 220 |
| P2 | Ag, C.8 | 0.38 | | 300 | 0 | 0 | 0 | 0 | 0 | 0 | 6 | | 16 |
| | NiCr, C.10 | 37.8 | 522 | 150 | 1200 | 0 | 50 | 0 | 0 | 0 | 6 | | |
| | ZnSn, C.14 | 60 | 650 | 600 | 880 | 0 | 250 | 0 | 130 | 0 | 6 | 22 | 270 |
| P3 | SiN, C.15 | 60 | 673 | 800 | 0 | 470 | 0 | 290 | 0 | 130 | 4.85 | 9 | 65 |

Fig. 26

| glass title | SZrO5nmUC | 10.6kW/0.54O3 | 10.6kW/0.54O3 | SZrO10nmUC | 10.6kW/0.54O3 | 10.6kW/0.54O3 | SZrO20nmUC | 10.6kW/0.54O3 |
|---|---|---|---|---|---|---|---|---|
| TY | 72.3 | 78.0 | 78.4 | 77.6 | 72.0 | 77.3 | 78.3 | 79.0 | 71.9 | 76.5 | 77.7 | 78.7 |
| L* | 88.1 | 90.8 | 91.0 | 90.6 | 88.0 | 90.5 | 90.9 | 91.2 | 87.9 | 90.1 | 90.6 | 91.1 |
| a* | -5.3 | -3.8 | -3.6 | -3.9 | -5.2 | -3.7 | -3.8 | -3.7 | -5.1 | -3.6 | -3.8 | -3.8 |
| b* | 5.3 | 5.2 | 5.2 | 4.5 | 5.0 | 5.1 | 5.3 | 4.4 | 5.2 | 5.2 | 5.6 | 5.2 |
| RgY | 9.5 | 9.7 | 9.9 | 10.8 | 9.6 | 9.7 | 9.7 | 9.4 | 9.7 | 9.8 | 9.6 | 9.1 |
| L* | 36.9 | 37.3 | 37.7 | 39.2 | 37.0 | 37.3 | 37.3 | 36.8 | 37.3 | 37.6 | 37.0 | 36.1 |
| a* | 0.0 | 0.7 | -0.2 | -2.7 | -0.7 | 0.4 | 0.3 | -1.2 | -0.9 | 0.3 | 0.8 | 0.4 |
| b* | -11.5 | -9.8 | -10.7 | -8.4 | -10.6 | -8.6 | -9.5 | -8.9 | -10.9 | -8.8 | -10.4 | -10.5 |
| RfY | 8.8 | 9.7 | 10.0 | 10.6 | 8.7 | 9.5 | 9.7 | 9.3 | 8.8 | 9.6 | 9.4 | 8.9 |
| L* | 35.5 | 37.3 | 37.8 | 38.0 | 35.4 | 37.0 | 37.2 | 36.8 | 35.6 | 37.0 | 36.8 | 35.7 |
| a* | 1.9 | 0.5 | -0.5 | -2.1 | 1.4 | 0.7 | 0.2 | -0.6 | 0.9 | 0.9 | 0.7 | 0.9 |
| b* | -7.8 | -6.4 | -7.6 | -8.4 | -6.6 | -5.2 | -6.2 | -6.9 | -6.9 | -5.6 | -7.1 | -8.3 |
| SR | 2.41 | 1.83 | 1.88 | 1.98 | 2.40 | 1.95 | 1.85 | 1.88 | 2.44 | 2.06 | 1.92 | 1.97 |
| ΔET | | 3.1 | 3.3 | 3.3 | | 2.9 | 3.3 | 3.6 | | 2.7 | 3.0 | 3.4 |
| ΔE Rg | | 1.8 | 1.2 | 4.7 | | 2.1 | 1.4 | 1.8 | | 2.4 | 1.7 | 1.8 |
| ΔE Rf | | 2.6 | 3.3 | 5.5 | | 2.3 | 2.2 | 2.3 | | 2.0 | 1.3 | 1.4 |
| Sum ΔE | | 7.6 | 7.8 | 13.5 | | 7.4 | 6.9 | 7.7 | | 7.0 | 6.1 | 6.6 |
| Brush Score | | | | | | | | | | | | |
| Haze | | 0.17 | 0.17 | 0.69 | | 0.21 | 0.2 | 0.46 | | 0.23 | 0.18 | 0.38 |
| SHGC, PE | | | | | | | | | | | | |

Ex. 11: HT HTX HTXXX
Ex. 12: HT HTX HTXXX
Ex. 13: HT HTX HTXXX

Fig. 27

Example 14

| materials | Power, kW | Voltage | Ar, ml | O2 setpoint | N2 setpoint | O2 tune, ml | N2 tune | O2 offset, ml | N2 offset, ml | LS, m/min | RC | Thickness (nm) |
|---|---|---|---|---|---|---|---|---|---|---|---|---|
| xu 5450 | | | | | | | | | | | | |
| ZnSnO, C-1 | 60 | 529 | 600 | 840 | 0 | 250 | | 130 | | 2.56 | 16 | 30.0 |
| Ag, C-8 | 8.68 | 429 | 700 | 0 | 0 | 0 | | | | 6 | | 40.9 |
| NiCr, C-10 | 10.6 | 516/340.7 | 150 | 48 | 0 | 48 | | | | 6 | | 8.7 |
| P1 | | | | | | | | | | | | |
| ZnSn, C-16 | 60 | 435 | 400 | 1200 | 0 | 250 | | 130 | | 0.79 | 22 | 2.7 |
| ZnSnO, C-1 | 60 | 525 | 600 | 840 | 0 | 250 | | 130 | | 6 | 16 | 69.3 |
| Ag, C-8 | 13.81 | 427 | 700 | 0 | 0 | 0 | | | | 6 | | 17.4 |
| P2 | | | | | | | | | | | | |
| NiCr, C-10 | 10.6 | 516/340.7 | 150 | 48 | 0 | 48 | | | | 6 | | 19.8 |
| ZnSn, C-16 | 60 | 532 | 400 | 1200 | 0 | 250 | | 130 | | 6 | 22 | 2.7 |
| P3 | | | | | | | | | | | | |
| SiAl, C-14 | 60 | 621 | 400 | 0 | 420 | 0 | 350 | | 130 | 3.09 | 9 | 21.0 |

| Glass Pry | Xerro H2O | XK-45 | | |
|---|---|---|---|---|
| TY | 72.3 | 73.5 | 77.4 | 78.0 |
| L* | 88.2 | 89.6 | 90.5 | 90.8 |
| a* | -4.9 | 3.1 | -3.6 | -3.8 |
| b* | 5.1 | 5.4 | 5.7 | 5.5 |
| RgY | 9.7 | 9.3 | 9.5 | 9.6 |
| L* | 37.4 | 36.9 | 37.0 | 37.3 |
| a* | -0.4 | 1.0 | 0.7 | -0.3 |
| b* | -9.6 | -9.0 | -9.2 | -9.6 |
| RfY | 9.2 | 9.7 | 8.8 | 9.7 |
| L* | 36.4 | 37.3 | 37.5 | 37.3 |
| a* | -0.1 | -0.5 | -0.5 | -0.1 |
| b* | -3.7 | -3.7 | -4.9 | -7.5 |
| SR | 2.39 | 2.03 | 1.85 | 1.96 |
| ΔET | | 2.4 | 2.7 | 2.8 |
| ΔE Rg | | 3.6 | 1.1 | 0.3 |
| ΔE Rf | | 0.9 | 1.7 | 3.9 |
| Sum ΔE | | 4.8 | 5.5 | 7.0 |
| Brush Score | | | | |
| Haze | | 0.16 | 0.17 | 0.24 |
| SHGC, PE | | | | |

HT HTX HTXXX

Fig. 29

Example 16

| XU 5450 | materials | Power, kW | Voltage | Ar, ml | O2 setpoint | N2 setpoint | O2 tune, ml | N2 tune | O2 offset, ml | N2 offset, ml | LS, m/min | RC | Thickness (nm) |
|---|---|---|---|---|---|---|---|---|---|---|---|---|---|
| | ZnSnO, C.1 | | | | | | | | | | | | 23.0 |
| P1 | Ag, C.8 | 60 | 529 | 600 | 840 | 0 | 250 | | 130 | | 5.00 | 16 | 20.9 |
| | NiCr, C.10 | 8.68 | 429 | 700 | 0 | 0 | 0 | | | | 6 | | 8.7 |
| | ZnSnO, C.15 | 10.6 | 516/340.7 | 150 | 48 | 0 | 48 | | | | 0.79 | 22 | 7.7 |
| | ZnSnO, C.1 | 60 | 495 | 400 | 1200 | 0 | 250 | | 130 | | 6 | 16 | 69.3 |
| P2 | Ag, C.8 | 60 | 525 | 600 | 840 | 0 | 250 | | 130 | | 6 | | 17.4 |
| | NiCr, C.10 | 13.81 | 422 | 700 | 0 | 0 | 0 | | | | 6 | | 13.8 |
| | ZnSnO, C.10 | 10.6 | 516/340.7 | 150 | 48 | 0 | 48 | | | | 0.79 | 22 | 2.7 |
| P3 | ZnSn, C.10 | 60 | 522 | 400 | 1700 | 0 | 250 | | 130 | | 6 | | 9.1 |
| | SiAl, C.14 | 60 | 621 | 400 | 0 | 420 | 0 | 250 | | 130 | 3.28 | 9 | 20.5 |

Example 15

| XU 5450 | materials | Power, kW | Voltage | Ar, ml | O2 setpoint | N2 setpoint | O2 tune, ml | N2 tune | O2 offset, ml | N2 offset, ml | LS, m/min | RC | Thickness (nm) |
|---|---|---|---|---|---|---|---|---|---|---|---|---|---|
| | ZnSnO, C.1 | | | | | | | | | | | | 5.0 |
| P1 | Ag, C.8 | 60 | 529 | 600 | 840 | 0 | 250 | | 130 | | 5.00 | 16 | 16.1 |
| | NiCr, C.10 | 8.68 | 429 | 700 | 0 | 0 | 0 | | | | 6 | | 8.7 |
| | ZnSnO, C.26 | 10.6 | 516/340.7 | 150 | 48 | 0 | 48 | | | | 0.79 | 22 | 7.7 |
| | ZnSnO, C.1 | 60 | 495 | 400 | 1200 | 0 | 250 | | 130 | | 6 | 16 | 69.3 |
| P2 | Ag, C.8 | 60 | 525 | 600 | 840 | 0 | 250 | | 130 | | 6 | | 17.4 |
| | NiCr, C.10 | 13.81 | 422 | 700 | 0 | 0 | 0 | | | | 6 | | 13.8 |
| | ZnSnO, C.10 | 10.6 | 516/340.7 | 150 | 48 | 0 | 48 | | | | 0.79 | 22 | 2.7 |
| P3 | ZnSn, C.10 | 60 | 522 | 400 | 1700 | 0 | 250 | | 130 | | 6 | | 9.1 |
| | SiAl, C.14 | 60 | 621 | 400 | 0 | 420 | 0 | 250 | | 130 | 3.28 | 9 | 20.3 |

Fig. 30

|  | Ex. 15 |||| Ex. 16 ||||
|---|---|---|---|---|---|---|---|---|
|  | ZrO2, 5nm || 4S-4S || ZrO2, 20nm || 4S-4S ||
|  |  |  |  |  |  |  |  |  |
| TY | 74.8 | 79.3 | 80.0 | 80.5 | 75.0 | 80.0 | 80.0 | 80.2 |
| L* | 89.3 | 91.5 | 91.7 | 91.9 | 89.4 | 91.7 | 91.7 | 91.8 |
| a* | -4.1 | -2.8 | -2.6 | -2.8 | -3.7 | -2.7 | -2.7 | -2.8 |
| b* | 4.2 | 4.2 | 4.1 | 3.7 | 2.3 | 2.7 | 2.6 | 2.1 |
| RgY | 9.7 | 9.8 | 10.2 | 9.8 | 9.6 | 10.1 | 10.3 | 9.9 |
| L* | 37.3 | 37.4 | 38.1 | 37.5 | 37.2 | 38.0 | 38.3 | 37.6 |
| a* | 0.0 | 0.8 | -0.2 | -0.2 | 0.5 | 0.2 | -0.2 | -0.2 |
| b* | -8.5 | -7.3 | -7.3 | -8.3 | -5.6 | -3.3 | -3.2 | -3.8 |
| RfY | 9.7 | 10.4 | 10.8 | 10.4 | 9.5 | 10.6 | 10.8 | 10.3 |
| L* | 37.4 | 38.6 | 39.2 | 38.6 | 37.0 | 38.9 | 39.2 | 38.4 |
| a* | -0.2 | -0.8 | -1.2 | -0.1 | 0.7 | -0.2 | -0.5 | 0.6 |
| b* | -3.5 | -3.7 | -4.4 | -6.7 | 0.4 | 0.0 | -0.2 | -2.2 |
| SR | 2.26 | 1.74 | 1.74 | 1.68 | 2.22 | 1.67 | 1.66 | 1.65 |
| ΔET |  | 2.6 | 2.8 | 2.9 |  | 2.5 | 2.6 | 2.6 |
| ΔE Rg |  | 1.4 | 1.4 | 0.4 |  | 2.5 | 2.7 | 1.9 |
| ΔE Rf |  | 1.4 | 2.3 | 3.5 |  | 2.2 | 2.6 | 3.0 |
| Sum ΔE |  | 5.4 | 6.5 | 6.7 |  | 7.2 | 7.9 | 7.5 |
| Brush Score |  |  |  |  |  |  |  |  |
| Haze |  | 0.25 | 0.22 | 0.35 |  | 0.26 | 0.28 | 0.31 |
| SHGC, PE |  |  |  |  |  |  |  |  |

Example 17

| | materials | Power, kW | Voltage | Ar, ml | O2 setpoint | N2 setpoint | O2 tune, ml | N2 tune | O2 offset, ml | N2 offset, ml | LS, m/min | SC | thickness, nm |
|---|---|---|---|---|---|---|---|---|---|---|---|---|---|
| RU 5450 | ZnSnO, C-1 | 60 | 529 | 600 | 840 | 0 | 250 | | | | 2.30 | | 20.0 |
| P2 | Ag, C-8 | 8.68 | 429 | 700 | 0 | 0 | 0 | | | | 6 | 16 | 45.5 |
| | NiCr, C-10 | 10.6 | 516/340.7 | 150 | 48 | 0 | 48 | | 130 | | 6 | | 8.7 |
| | ZnSn, C-16 | 60 | 435 | 400 | 1200 | 0 | 250 | | 130 | | 6 | | 2.7 |
| P3 | ZnSnO, C-1 | 60 | 525 | 600 | 840 | 0 | 250 | | | | 0.79 | 22 | 69.3 |
| | Ag, C-8 | 13.81 | 422 | 700 | 0 | 0 | 0 | | | | 6 | 16 | 17.4 |
| | NiCr, C-10 | 10.6 | 516/340.7 | 150 | 48 | 0 | 48 | | 130 | | 6 | | 13.8 |
| | ZnSn, C-16 | 60 | 522 | 400 | 1200 | 0 | 250 | | | | 6 | 22 | 2.7 |
| P4 | SiAl, C-14 | 60 | 671 | 400 | 0 | 420 | 0 | 250 | | 130 | 3.09 | 9 | 21.0 |

Example 18

| | materials | Power, kW | Voltage | Ar, ml | O2 setpoint | N2 setpoint | O2 tune, ml | N2 tune | O2 offset, ml | N2 offset, ml | LS, m/min | SC | thickness, nm |
|---|---|---|---|---|---|---|---|---|---|---|---|---|---|
| RU 5450 | ZnSnO, C-1 | 60 | 529 | 600 | 840 | 0 | 250 | | | | 2.30 | | 30.1 |
| P2 | Ag, C-8 | 8.68 | 429 | 700 | 0 | 0 | 0 | | | | 6 | 16 | 44.5 |
| | NiCr, C-10 | 10.6 | 516/340.7 | 150 | 48 | 0 | 48 | | 130 | | 6 | | 8.7 |
| | ZnSn, C-16 | 60 | 435 | 400 | 1200 | 0 | 250 | | 130 | | 6 | | 2.7 |
| P3 | ZnSnO, C-1 | 60 | 525 | 600 | 840 | 0 | 250 | | | | 0.79 | 22 | 69.3 |
| | Ag, C-8 | 13.81 | 422 | 700 | 0 | 0 | 0 | | | | 6 | 16 | 17.4 |
| | NiCr, C-10 | 10.6 | 516/340.7 | 150 | 48 | 0 | 48 | | 130 | | 6 | | 13.8 |
| | ZnSn, C-16 | 60 | 522 | 400 | 1200 | 0 | 250 | | | | 6 | 22 | 2.7 |
| P4 | SiAl, C-14 | 60 | 671 | 400 | 0 | 420 | 0 | 250 | | 130 | 3.09 | 9 | 21.0 |

|              | Ex. 17 |||| Ex. 18 ||||
|--------------|--------|--------|--------|--------|--------|--------|--------|--------|
| glass thx    | 20nm SiO || 48-48 ||  30nm SiO || 48-48 ||
| Optics       |  |  HT  | aITX | itmool | 48.1 | HT | aITX | itmool |
| TY           | 72.5 | 76.8 | 77.6 | 78.0 | 72.4 | 76.3 | 77.2 | 77.7 |
| L*           | 88.2 | 90.3 | 90.6 | 90.8 | 88.2 | 90.0 | 90.4 | 90.7 |
| a*           | -5.4 | -3.8 | -4.1 | -4.0 | -5.5 | -3.7 | -4.1 | -4.3 |
| b*           | 5.7  | 5.6  | 5.7  | 5.1  | 5.6  | 5.3  | 5.6  | 5.6  |
| RgY          | 9.6  | 9.6  | 9.8  | 10.2 | 9.7  | 9.7  | 9.8  | 9.7  |
| L*           | 37.2 | 37.0 | 37.4 | 38.2 | 37.4 | 37.3 | 37.4 | 37.4 |
| a*           | 1.1  | 2.1  | 1.6  | -0.9 | 1.4  | 2.6  | 2.2  | 1.5  |
| b*           | -10.7 | -8.4 | -8.3 | -7.8 | -10.0 | -7.7 | -8.0 | -9.7 |
| RfY          | 9.4  | 9.9  | 10.1 | 10.3 | 9.4  | 10.0 | 10.1 | 10.0 |
| L*           | 36.7 | 37.6 | 37.9 | 38.4 | 36.8 | 37.8 | 37.9 | 37.8 |
| a*           | 1.2  | 1.4  | 1.4  | 0.3  | 1.9  | 2.1  | 2.1  | 2.1  |
| b*           | -6.0 | -5.0 | -5.8 | -7.3 | -5.5 | -4.3 | -5.6 | -8.8 |
| SR           | 2.51 | 1.98 | 1.96 | 2.08 | 2.45 | 2.04 | 1.91 | 2.08 |
| ΔET          |      | 2.6  | 2.7  | 3.0  |      | 2.6  | 2.7  | 2.8  |
| ΔE Rg        |      | 2.5  | 2.5  | 3.7  |      | 2.6  | 2.2  | 0.3  |
| ΔE Rf        |      | 1.3  | 1.3  | 2.4  |      | 1.6  | 1.2  | 3.5  |
| Sum ΔE       |      | 6.4  | 6.5  | 9.0  |      | 6.7  | 6.0  | 6.5  |

Fig. 33

Comparative Example 2

| XU 5450 | materials | Power, kW | Voltage | Ar, ml | O2 setpoint | N2 setpoint | O2 tune, ml | N2 tune | O2 offset, ml | N2 offset, ml | LS, m/min | RC | Thickness (nm) |
|---|---|---|---|---|---|---|---|---|---|---|---|---|---|
| reverse | SiAl C-16 | 60 | 621 | 400 | 0 | 420 | | 250 | 130 | | 6 | 9 | 10.9 |
| P1 | ZnSnSG C-2 | 60 | 650 | 600 | 840 | 0 | 250 | | 130 | | 3.80 | 18 | 32.9 |
| | Ag C-8 | 8.36 | 429 | 700 | 0 | 0 | | | | | 6 | | 8.4 |
| | NiCr C-10 | 10.6 | | 150 | 0 | 0 | 54 | | | | 6 | | 2.7 |
| | ZnSn C-14 | 60 | 522 | 400 | 1200 | 0 | 250 | | 130 | | 0.80 | 22 | 70.9 |
| P2 | ZnSn90 C-1 | 60 | 650 | 600 | 840 | 0 | 250 | | 130 | | 6 | 15 | 18.5 |
| | Ag C-8 | 13.5 | 432 | 700 | 0 | 0 | | | | | 6 | | 22.8 |
| | NiCr C-10 | 10.6 | | 150 | 0 | 0 | 54 | | | | 6 | | 2.7 |
| | ZnSn C-14 | 60 | 522 | 400 | 1200 | 0 | 250 | | 130 | | 6 | 17 | 9.9 |
| | SiAl C-16 | 60 | 621 | 400 | 0 | 420 | | 250 | | 130 | 6 | 9 | 10.5 |
| P3 | SiAl C-16 | 60 | 621 | 400 | 0 | 420 | | 250 | | 130 | 14.65 | 9 | 13.5 |

Fig. 34

Comparative Example 2

|  | SB (mm) | | 10 BW/0 MG | |
|---|---|---|---|---|
| TY | 7.2 | 76.1 | 77.3 | 78.7 |
| L* | 88.1 | 90.8 | 90.5 | 90.8 |
| a* | -4.9 | -3.4 | -3.2 | -3.1 |
| b* | 4.6 | 4.2 | 4.2 | 3.8 |
| RgY | 9.1 | 10.4 | 10.7 | 9.6 |
| L* | 37.0 | 38.6 | 39.0 | 37.1 |
| a* | -0.9 | -2.8 | -3.0 | -3.3 |
| b* | -10.8 | -6.3 | -6.4 | -5.7 |
| RfY | 5.5 | 10.4 | 10.6 | 9.4 |
| L* | 55.6 | 38.5 | 38.8 | 36.8 |
| a* | 0.4 | -2.6 | -2.7 | -2.3 |
| b* | -6.4 | -2.7 | -2.1 | -5.2 |
| SR | 2.99 | 1.80 | 1.80 | 1.8 |
| ΔET | | 3.2 | 3.0 | 3.4 |
| ΔE Rg | | 4.8 | 5.2 | 5.6 |
| ΔE Rf | | 5.5 | 5.6 | 4.3 |
| Sum ΔE | | 13.5 | 13.8 | 13.3 |
| Brush Scar | | | | |
| Haze | | 0.30 | 0.3 | 0.36 |
| SHGC, PE | | | | |

Example 19

| | Target Materials | Power, kW | Voltage | Ar, ml | O2 setpoint | N2 setpoint | O2 tune, ml | N2 tune | O2 offset, ml | N2 offset, ml | Layer Thickness (nm) |
|---|---|---|---|---|---|---|---|---|---|---|---|
| P1 | SiZrOx, C5 | 60 | 515 | 600 | 490 | | 150 | | 130 | | 20.0 |
| P3 | ZnSn90, C-1 | 60 | 650 | 600 | 490 | | 600 | | 130 | | 39.10 |
| | Ag, C-8 | 8.45 | 379 | 700 | | | | | | | 10.72 |
| | NiCr, C-10 | 13 | 563 | 150 | 55 | | 55 | | | | 3.79 |
| | ZnSn50, C-16 | 60 | 520 | 400 | 1200 | | 250 | | 130 | | 67.17 |
| P4-rev | ZnSn85, C-12 | 60 | 643 | 600 | 840 | | 250 | | 130 | | 18.35 |
| P5 | Ag, C-8 | 11.61 | 396 | 700 | | | | | | | 14.73 |
| | NiCr, C-10 | 13 | 567 | 150 | 55 | | 55 | | | | 3.79 |
| | ZnSn50, C-16 | 60 | 522 | 400 | 1200 | | 250 | | 130 | | 9.41 |
| P7 | SiAl, C-3 | 60 | 563 | 400 | | 420 | | 250 | | 130 | 21.08 |

| | TY(%) | RFY(%) | RFa* | RFb* | RGY(%) | RGa* | RGb* | Rs | ΔE*$_G$ | ΔE*$_F$ | ΔE*$_T$ |
|---|---|---|---|---|---|---|---|---|---|---|---|
| AC | 74.80 | 6.90 | -2.83 | -7.21 | 7.90 | -0.11 | -12.92 | 2.31 | | | |
| HT | 78.70 | 7.30 | -3.65 | -7.72 | 7.60 | 0.53 | -12.79 | | 0.9 | 1.3 | 2.3 |
| HTX | 79.80 | 7.50 | -4.13 | -7.65 | 7.80 | -0.81 | -11.66 | 1.83 | 1.5 | 1.9 | 2.6 |
| HTXX | 80.40 | 7.10 | -2.93 | -9.17 | 7.60 | -1.66 | -10.63 | 1.82 | 2.8 | 2.0 | 2.8 |

Fig. 37

Example 20

| | Target Materials | Power, kW | Voltage | Ar, ml | O2 setpoint | N2 setpoint | O2 tune, ml | N2 tune | O2 offset, ml | N2 offset, ml | Layer Thickness (nm) |
|---|---|---|---|---|---|---|---|---|---|---|---|
| P1 | SiZrOx, C5 | 60 | 515 | 600 | 490 | | 150 | | 130 | | 20.0 |
| P3 | ZnSn90, C-1 | 60 | 650 | 600 | 490 | | 600 | | 130 | | 39.10 |
| | Ag, C-8 | 8.45 | 379 | 700 | | | | | | | 10.72 |
| | NiCr, C-10 | 13 | 563 | 150 | 55 | | 55 | | | | 3.79 |
| | ZnSn50, C-16 | 60 | 520 | 400 | 1200 | | 250 | | 130 | | 62.42 |
| P4 rev | SiZrOx, C5 | 60 | 515 | 600 | 490 | | 150 | | 130 | | 5.0 |
| P5 | ZnSn90, C-1 | 60 | 650 | 600 | 490 | | 600 | | 130 | | 18.35 |
| | Ag, C-8 | 11.61 | 396 | 700 | | | | | | | 14.73 |
| | NiCr, C-10 | 13 | 567 | 150 | 55 | | 55 | | | | 3.79 |
| | ZnSn50, C-16 | 60 | 522 | 400 | 1200 | | 250 | | 130 | | 9.41 |
| P7 | SiAl, C-3 | 60 | 563 | 400 | | 420 | | 250 | | 130 | 22.91 |

| | TY(%) | RFY(%) | RFa* | RFb* | RGY(%) | RGa* | RGb* | Rs | $\Delta E^*_G$ | $\Delta E^*_F$ | $\Delta E^*_T$ |
|---|---|---|---|---|---|---|---|---|---|---|---|
| AC | 74.70 | 6.80 | -1.57 | -6.20 | 8.00 | 0.29 | -13.09 | 2.35 | | | |
| HT | 78.70 | 7.00 | -2.55 | -6.07 | 7.60 | 1.25 | -12.79 | 1.94 | 1.3 | 1.1 | 2.2 |
| HTX | 78.60 | 7.20 | -2.92 | -6.62 | 7.70 | 0.36 | -12.32 | 1.88 | 1.0 | 1.7 | 2.2 |
| HTXXX | 79.40 | 7.10 | -2.30 | -8.21 | 7.70 | -0.46 | -11.31 | 1.88 | 2.0 | 2.2 | 2.4 |

Fig. 38

Example 21

| | Target Materials | Power, kW | Voltage | Ar, ml | O2 setpoint | N2 setpoint | O2 tune, ml | N2 tune | O2 offset, ml | N2 offset, ml | Layer Thickness (nm) |
|---|---|---|---|---|---|---|---|---|---|---|---|
| P1 | SiZrOx, C5 | 60 | 515 | 600 | 490 | | 150 | | 130 | | 20.0 |
| P3 | ZnSn90, C-1 | 60 | 650 | 600 | 490 | | 600 | | 130 | | 39.10 |
| | Ag, C-8 | 8.45 | 379 | 700 | | | | | | | 10.72 |
| | NiCr, C-10 | 13 | 563 | 150 | 55 | | 55 | | | | 3.79 |
| | ZnSn50, C-16 | 60 | 520 | 400 | 1200 | | 250 | | 130 | | 59.90 |
| P4 rev | SiZrOx, C5 | 60 | 515 | 600 | 490 | | 150 | | 130 | | 15.0 |
| P5 | ZnSn90, C-1 | 60 | 650 | 600 | 490 | | 600 | | 130 | | 18.35 |
| | Ag, C-8 | 11.61 | 396 | 700 | | | | | | | 14.73 |
| | NiCr, C-10 | 13 | 567 | 150 | 55 | | 55 | | | | 3.79 |
| | ZnSn50, C-16 | 60 | 522 | 400 | 1200 | | 250 | | 130 | | 9.41 |
| P7 | SiAl, C-3 | 60 | 563 | 400 | | 420 | | 250 | | 130 | 22.91 |

| | TY(%) | RFY(%) | RFa* | RFb* | RGY(%) | RGa* | RGb* | Rs | $\Delta E^*_G$ | $\Delta E^*_F$ | $\Delta E^*_T$ |
|---|---|---|---|---|---|---|---|---|---|---|---|
| AC | 73.2 | 8.4 | 1.3 | -6.4 | 10.0 | 2.1 | -16.0 | 2.44 | | | |
| HT | 74.8 | 8.2 | 0.9 | -5.8 | 9.4 | 3.8 | -15.6 | 2.2 | 2.1 | 0.8 | 2.3 |
| HTX | 76.5 | 8.6 | -0.4 | -5.1 | 9.4 | 2.5 | -14.1 | 2.04 | 2.2 | 2.2 | 2.2 |
| HTXXX | 76.9 | 8.6 | -2.4 | -6.4 | 9.4 | 1.1 | -13.7 | 2.07 | 2.7 | 3.7 | 2.7 |

Fig. 39
Example 22

| | Target Materials | Power, kW | Voltage | Ar, ml | O2 setpoint | N2 setpoint | O2 tune, ml | N2 tune | O2 offset, ml | N2 offset, ml | Layer Thickness (nm) |
|---|---|---|---|---|---|---|---|---|---|---|---|
| P1 | Si3N4, C3 | 60 | | 400 | | 420 | | 250 | | 130 | 10.01 |
| P2 rev | NiCr-N, C10 | 4.5 | | 150 | | 10 | | 10 | | | 1.48 |
| | Si3N4, C3 | 60 | | 400 | | 420 | | 250 | | 130 | 10.01 |
| P4 rev | SiZrOx, C5 | 60 | 449 | 600 | 490 | 0 | 150 | | 130 | | 4.00 |
| P5 | ZnSn90, C1 | 60 | 650 | 600 | 490 | 0 | 600 | | 130 | | 10.73 |
| | Ag, C-8 | 8.45 | 429 | 700 | 0 | 0 | 0 | | | | 9.70 |
| | NiCr, C-10 | 13 | 552/336.3 | 150 | 58 | 0 | 58 | | | | 4.91 |
| | ZnSn, C-16 | 60 | 522 | 400 | 1200 | 0 | 250 | | 130 | | 66.28 |
| P7 | ZnSn90, C-1 | 60 | 650 | 600 | 490 | 0 | 600 | | 130 | | 15.20 |
| | Ag, C-8 | 11.61 | 422 | 700 | 0 | 0 | 0 | | | | 13.30 |
| | NiCr, C-10 | 13 | 552/336.3 | 150 | 55 | 0 | 55 | | | | 4.91 |
| | ZnSn, C-16 | 60 | 522 | 400 | 1200 | 0 | 250 | | 130 | | 9.50 |
| P9 | SiAl, C-3 | 60 | 621 | 400 | 0 | 420 | | 250 | | 130 | 23.59 |

| | TY | RFY | RFa* | RFb* | RGY | RGa* | RGb* | Rs | ΔE*$_G$ | ΔE*$_F$ | ΔE*$_T$ |
|---|---|---|---|---|---|---|---|---|---|---|---|
| AC | 72.4 | 6.4 | -6.0 | -7.6 | 7.7 | -0.2 | -13.3 | 2.18 | | | |
| HT | 76.1 | 6.9 | -7.3 | -7.2 | 7.6 | -1.4 | -11.4 | 1.76 | 2.3 | 1.9 | 2.2 |
| HTX | 76.6 | 7.1 | -7.7 | -8.3 | 7.9 | -2.8 | -10.6 | 1.69 | 3.8 | 2.5 | 2.2 |
| HTXXX | 76.3 | 6.6 | -5.9 | -9.6 | 7.8 | -3.6 | -9.3 | 1.69 | 5.2 | 2.1 | 2.2 |

Fig. 40
Example 23

| | Target Materials | Power, kW | Voltage | Ar, ml | O2 setpoint | N2 setpoint | O2 tune, ml | N2 tune | O2 offset, ml | N2 offset, ml | Layer Thickness (nm) |
|---|---|---|---|---|---|---|---|---|---|---|---|
| P1 | Si3N4, C3 | 60 | | 400 | | 420 | | 250 | | 130 | 10.01 |
| P2 rev | NiCr-N, C10 | 4.5 | | 150 | | 10 | | 10 | | | 1.48 |
| | Si3N4, C3 | 60 | | 400 | | 420 | | 250 | | 130 | 10.01 |
| P4 rev | SiZrOx, C5 | 60 | 449 | 600 | 490 | 0 | 150 | | 130 | | 4.00 |
| P5 | ZnSn90, C1 | 60 | 650 | 600 | 490 | 0 | 600 | | 130 | | 10.73 |
| | Ag, C-8 | 8.45 | 429 | 700 | 0 | 0 | 0 | | | | 9.70 |
| | NiCr, C-10 | 13 | 552/336.3 | 150 | 58 | 0 | 58 | | | | 4.91 |
| | ZnSn, C-16 | 60 | 522 | 400 | 1200 | 0 | 250 | | 130 | | 63.28 |
| P6 rev | SiZrOx, C5 | 60 | 449 | 600 | 490 | 0 | 150 | | 130 | | 15.00 |
| P7 | ZnSn90, C-1 | 60 | 650 | 600 | 490 | 0 | 600 | | 130 | | 15.20 |
| | Ag, C-8 | 11.61 | 422 | 700 | 0 | 0 | 0 | | | | 13.30 |
| | NiCr, C-10 | 13 | 552/336.3 | 150 | 55 | 0 | 55 | | | | 4.91 |
| | ZnSn, C-16 | 60 | 522 | 400 | 1200 | 0 | 250 | | 130 | | 9.50 |
| P9 | SiAl, C-3 | 60 | 621 | 400 | 0 | 420 | | 250 | | 130 | 23.59 |

| | TY | Ta* | Tb* | RFY | RFa* | RFb* | RGY | RGa* | RGb* | Rs | ΔE*$_G$ | ΔE*$_F$ | ΔE*$_T$ |
|---|---|---|---|---|---|---|---|---|---|---|---|---|---|
| AC | 69.2 | -4.4 | 8.4 | 10.1 | -2.1 | -7.8 | 12.0 | -0.3 | -15.3 | 2.32 | | | |
| HT | 69.8 | -3.4 | 7.1 | 9.5 | -2.6 | -7.8 | 11.4 | 0.4 | -14.7 | 2.09 | 1.3 | 1.2 | 1.7 |
| HTX | 70.0 | -4.1 | 6.7 | 9.6 | -3.4 | -8.5 | 11.7 | 0.2 | -13.6 | 2.07 | 1.8 | 1.7 | 1.8 |
| HTXXX | 69.5 | -5.2 | 4.7 | 9.3 | -2.9 | -9.6 | 12.2 | -0.6 | -10.5 | 2.07 | 4.7 | 2.5 | 3.8 |

Fig. 41
Example 24

| | Target Materials | Power, kW | Voltage | Ar, ml | O2 setpoint | N2 setpoint | O2 tune, ml | N2 tune | O2 offset, ml | N2 offset, ml | Layer Thickness (nm) |
|---|---|---|---|---|---|---|---|---|---|---|---|
| P1 | Si3N4, C3 | 60 | | 400 | | 420 | | 250 | | 130 | 10.01 |
| P2 rev | NiCr-N, C10 | 4.5 | | 150 | | 10 | | 10 | | | 1.48 |
| | Si3N4, C3 | 60 | | 400 | | 420 | | 250 | | 130 | 10.01 |
| P4 rev | SiZrOx, C5 | 60 | 449 | 600 | 490 | 0 | 150 | | | 130 | 4.00 |
| P5 | ZnSn90, C1 | 60 | 650 | 600 | 490 | 0 | 600 | | | 130 | 10.73 |
| | Ag, C-8 | 8.45 | 429 | 700 | 0 | 0 | 0 | | | | 9.70 |
| | NiCr, C-10 | 13 | 552/336.3 | 150 | 58 | 0 | 58 | | | | 4.91 |
| | ZnSn, C-16 | 60 | 522 | 400 | 1200 | 0 | 250 | | | 130 | 61.28 |
| P6 rev | SiZrOx, C5 | 60 | 449 | 600 | 490 | 0 | 150 | | | 130 | 25.00 |
| P7 | ZnSn90, C-1 | 60 | 650 | 600 | 490 | 0 | 600 | | | 130 | 15.20 |
| | Ag, C-8 | 11.61 | 422 | 700 | 0 | 0 | 0 | | | | 13.30 |
| | NiCr, C-10 | 13 | 552/336.3 | 150 | 55 | 0 | 55 | | | | 4.91 |
| | ZnSn, C-16 | 60 | 522 | 400 | 1200 | 0 | 250 | | | 130 | 9.50 |
| P9 | SiAl, C-3 | 60 | 621 | 400 | 0 | 420 | | 250 | | 130 | 23.59 |

| | TY | Ta* | Tb* | RFY | RFa* | RFb* | RGY | RGa* | RGb* | Rs | ΔE*$_G$ | ΔE*$_F$ | ΔE*$_T$ |
|---|---|---|---|---|---|---|---|---|---|---|---|---|---|
| AC | 66.4 | -4.5 | 10.3 | 13.0 | 0.8 | -6.9 | 15.4 | 0.0 | -14.3 | 2.34 | | | |
| HT | 67.5 | -3.5 | 8.8 | 12.1 | -0.1 | -5.8 | 14.6 | 0.7 | -13.4 | 2.15 | 1.5 | 2.0 | 1.8 |
| HTX | 67.0 | -4.2 | 8.3 | 11.7 | -0.7 | -7.0 | 14.6 | 0.7 | -13.7 | 2.16 | 1.5 | 2.6 | 2.1 |
| HTXXX | 67.1 | -5.2 | 6.8 | 12.5 | -1.8 | -8.7 | 16.0 | 0.7 | -12.3 | 2.11 | 2.3 | 3.2 | 3.6 |

Fig. 42
Example 25

| | Target Materials | Power, kW | Voltage | Ar, ml | O2 setpoint | N2 setpoint | O2 tune, ml | N2 tune | O2 offset, ml | N2 offset, ml | Layer Thickness (nm) |
|---|---|---|---|---|---|---|---|---|---|---|---|
| P1 | SiZrOx, C8 | 60 | 515 | 600 | 490 | | 150 | | 130 | | 20.0 |
| P2 Rev | ZnSn90, C-1 | 60 | 650 | 600 | 490 | | 600 | | 130 | | 29.1 |
| P3 | SiZrOx, C8 | 60 | 515 | 600 | 490 | | 150 | | 130 | | 6.0 |
| P4 | ZnAl, C3 | 50 | 457 | 400 | 930 | | 250 | | 130 | | 10.1 |
| | Ag, C-10 | 8.8 | 379 | 700 | | | | | | | 10.9 |
| | NiCr, C-12 | 14 | 563 | 150 | 70 | | 70 | | | | 3.7 |
| P5 rev | ZnSn50, C-16 | 60 | 520 | 400 | 1200 | | 250 | | 130 | | 60.0 |
| | SiZrOx, C8 | 60 | 515 | 600 | 490 | | 150 | | 130 | | 6.0 |
| P6 | ZnAl, C3 | 50 | 457 | 400 | 930 | | 250 | | 130 | | 19.1 |
| | Ag, C-10 | 11.85 | 396 | 700 | | | | | | | 14.9 |
| | NiCr, C-12 | 14 | 567 | 150 | 70 | | 70 | | | | 3.7 |
| P7 rev | ZnSn50, C-16 | 60 | 522 | 400 | 1200 | | 250 | | 130 | | 9.4 |
| P8 | SiAl, C-14 | 30 | 563 | 400 | | 150 | | 250 | | 130 | 20.3 |

| | TY(%) | Ta* | Tb* | RFY(%) | RFa* | RFb* | RGY(%) | RGa* | RGb* | Rs | $\Delta E^*_G$ | $\Delta E^*_F$ | $\Delta E^*_T$ |
|---|---|---|---|---|---|---|---|---|---|---|---|---|---|
| AC | 74.8 | -5.0 | 6.4 | 6.8 | -3.3 | -9.6 | 7.6 | 2.9 | -18.3 | 2.37 | | | |
| HT | 77.1 | -3.4 | 5.3 | 7.2 | -3.1 | -9.7 | 7.6 | 2.4 | -16.5 | 2.09 | 1.8 | 1.0 | 2.2 |
| HTX | 78.0 | -3.4 | 5.7 | 7.3 | -3.8 | -10.3 | 7.4 | 2.3 | -17.4 | 2.01 | 1.2 | 1.4 | 2.2 |
| HTXXX | 79.1 | -3.8 | 6.2 | 7.4 | -3.9 | -12.2 | 7.5 | 2.1 | -17.8 | 2.03 | 1.0 | 3.0 | 2.3 |

Fig. 43
Example 26

|  | Target Materials | Power, kW | Voltage | Ar, ml | O2 setpoint | N2 setpoint | O2 tune, ml | N2 tune | O2 offset, ml | N2 offset, ml | Layer Thickness (nm) |
|---|---|---|---|---|---|---|---|---|---|---|---|
| P1 | SiZrOx, C8 | 60 | 515 | 600 | 490 |  | 150 |  | 130 |  | 20.0 |
| P3 | ZnSn90, C-1 | 60 | 650 | 600 | 490 |  | 600 |  | 130 |  | 27.5 |
|  | ZnAl, C3 | 50 | 457 | 600 | 930 |  | 250 |  | 130 |  | 13.5 |
|  | Ag, C-10 | 8.8 | 379 | 700 |  |  |  |  |  |  | 10.9 |
|  | NiCr, C-12 | 14 | 563 | 150 | 70 |  | 70 |  |  |  | 3.7 |
| P4 rev | ZnSn50, C-16 | 60 | 520 | 400 | 1200 |  | 250 |  | 130 |  | 60.6 |
|  | SiZrOx, C8 | 60 | 515 | 600 | 490 |  | 150 |  | 130 |  | 6.0 |
| P5 | ZnAl, C3 | 50 | 457 | 600 | 930 |  | 250 |  | 130 |  | 19.1 |
|  | Ag, C-10 | 11.85 | 396 | 700 |  |  |  |  |  |  | 14.9 |
|  | NiCr, C-12 | 14 | 567 | 150 | 70 |  | 70 |  |  |  | 3.7 |
| P6 rev | ZnSn50, C-16 | 60 | 522 | 400 | 1200 |  | 250 |  | 130 |  | 9.4 |
| P7 | SiAl, C-14 | 50 | 563 | 400 |  | 330 |  | 250 |  | 130 | 20.4 |

|  | TY(%) | Ta* | Tb* | RFY(%) | RFa* | RFb* | RGY(%) | RGa* | RGb* | Rs | $\Delta E^*_G$ | $\Delta E^*_F$ | $\Delta E^*_T$ |
|---|---|---|---|---|---|---|---|---|---|---|---|---|---|
| AC | 74.5 | -4.4 | 5.1 | 7.0 | -3.5 | -3.6 | 7.8 | 0.1 | -12.4 | 2.37 |  |  |  |
| HT | 75.9 | -3.2 | 4.0 | 7.1 | -2.5 | -5.6 | 7.8 | 0.2 | -10.6 | 2.15 | 1.8 | 2.2 | 1.7 |
| HTX | 76.9 | -3.4 | 4.3 | 7.2 | -2.7 | -6.3 | 7.8 | -0.2 | -10.5 | 2.09 | 1.9 | 2.8 | 1.7 |
| HTXXX | 77.3 | -3.9 | 3.9 | 7.0 | -2.0 | -7.6 | 7.6 | -0.6 | -9.9 | 2.09 | 2.6 | 4.3 | 1.8 |

Fig. 44
Example 27

| | Target Material | Power, kW | Voltage | Ar, ml | O2 setpoint | N2 setpoint | O2 tune, ml | N2 tune | O2 offset, ml | N2 offset, ml | Layer Thickness (nm) |
|---|---|---|---|---|---|---|---|---|---|---|---|
| P1 | SiZrOx, C8 | 60 | 515 | 600 | 490 | | 150 | | 130 | | 20.0 |
| P3 | ZnSn90, C-1 | 60 | 650 | 600 | 490 | | 600 | | 130 | | 39.10 |
| | Ag, C-10 | 9.20 | 379 | 700 | | | | | | | 11.42 |
| | NiCr, C-12 | 14 | 563 | 150 | 75 | | 75 | | | | 3.73 |
| P4 rev | ZnSn50, C-16 | 60 | 520 | 400 | 1200 | | 250 | | 130 | | 55.18 |
| P5 | ZnSn90, C-1 | 60 | 650 | 600 | 490 | | 600 | | 130 | | 18.35 |
| | Ag, C-10 | 10.64 | 396 | 700 | | | | | | | 13.34 |
| | NiCr, C-12 | 14 | 567 | 150 | 75 | | 75 | | | | 3.73 |
| P6 rev | ZnSn50, C-16 | 60 | 522 | 400 | 1200 | | 250 | | 130 | | 9.41 |
| P7 | SiAl, C-14 | 30 | 563 | 400 | | 150 | | 250 | | 130 | 20.80 |

| | TY(%) | Ta* | Tb* | RFY(%) | RFa* | RFb* | RGY(%) | RGa* | RGb* | Rs | $\Delta E^*_G$ | $\Delta E^*_F$ | $\Delta E^*_T$ |
|---|---|---|---|---|---|---|---|---|---|---|---|---|---|
| AC | 76.4 | -4.0 | 2.8 | 4.8 | -5.5 | -6.7 | 6.1 | -0.2 | -2.2 | 2.32 | | | |
| HT | 78.0 | -2.4 | 2.2 | 5.2 | -3.3 | -8.4 | 6.1 | -0.8 | -2.9 | 2.21 | 0.9 | 3.0 | 1.9 |
| HTX | 78.8 | -2.6 | 2.6 | 5.4 | -3.0 | -8.5 | 6.3 | -0.9 | -3.1 | 2.12 | 1.3 | 3.6 | 1.8 |
| HTXXX | 79.8 | -3.1 | 2.8 | 5.7 | -1.5 | -8.8 | 6.6 | -0.5 | -3.6 | 2.2 | 1.8 | 5.3 | 1.8 |

Fig. 45
Example 28

| | Target Materials | Power, kW | Voltage | Ar, ml | O2 setpoint | N2 setpoint | O2 tune, ml | N2 tune | O2 offset, ml | N2 offset, ml | Layer Thickness (nm) |
|---|---|---|---|---|---|---|---|---|---|---|---|
| P1 | SiZrOx, C8 | 60 | 515 | 600 | 490 | | 150 | | 130 | | 20.0 |
| | ZnSn90, C-1 | 60 | 650 | 600 | 490 | | 600 | | 130 | | 39.10 |
| P3 | Ag, C-10 | 9.20 | 379 | 700 | | | | | | | 11.42 |
| | NiCr, C-12 | 14 | 563 | 150 | 75 | | 75 | | | | 3.73 |
| P4 rev | ZnSn50, C-16 | 60 | 520 | 400 | 1200 | | 250 | | 130 | | 53.74 |
| | SiZrOx, C8 | 60 | 515 | 600 | 490 | | 150 | | 130 | | 5.0 |
| | ZnSn90, C-1 | 60 | 650 | 600 | 490 | | 600 | | 130 | | 18.35 |
| P5 | Ag, C-10 | 10.64 | 396 | 700 | | | | | | | 13.34 |
| | NiCr, C-12 | 14 | 567 | 150 | 75 | | 75 | | | | 3.73 |
| P6 rev | ZnSn50, C-16 | 60 | 522 | 400 | 1200 | | 250 | | 130 | | 9.41 |
| P7 | SiAl, C-14 | 30 | 563 | 400 | | 150 | | 250 | | 130 | 20.80 |

| | TY(%) | Ta* | Tb* | RFY(%) | RFa* | RFb* | RGY(%) | RGa* | RGb* | Rs | ΔE*G | ΔE*F | ΔE*T |
|---|---|---|---|---|---|---|---|---|---|---|---|---|---|
| AC | 76.5 | -4.1 | 3.0 | 4.6 | -5.8 | -5.4 | 5.8 | 1.2 | -4.3 | 2.39 | | | |
| HT | 76.8 | -2.4 | 2.0 | 4.7 | -3.8 | -7.3 | 5.7 | 0.4 | -4.2 | | 0.8 | 2.7 | 2.0 |
| HTX | 78.2 | -2.6 | 2.4 | 5.1 | -3.1 | -7.0 | 5.9 | 0.1 | -3.8 | 2.21 | 1.2 | 3.4 | 1.7 |
| HTXXX | 79.1 | -3.5 | 2.4 | 5.1 | -1.1 | -8.1 | 6.0 | -0.1 | -4.2 | 2.11 | 1.4 | 5.6 | 1.4 |

Fig. 46
Example 29

| | Target Material | Power, kW | Voltage | Ar, ml | O2 setpoint | N2 setpoint | O2 tune, ml | N2 tune | O2 offset, ml | N2 offset, ml | Layer Thickness (nm) |
|---|---|---|---|---|---|---|---|---|---|---|---|
| P1 | SiZrOx, C8 | 60 | 515 | 600 | 490 | | 150 | | 130 | | 20.0 |
| | ZnSn90, C-1 | 60 | 650 | 600 | 490 | | 600 | | 130 | | 26.3 |
| P3 | ZnAl, C3 | 50 | 457 | 600 | 930 | | 250 | | 130 | | 12.8 |
| | Ag, C-10 | 9.20 | 379 | 700 | | | | | | | 11.42 |
| | NiCr, C-12 | 14 | 563 | 150 | 75 | | 75 | | | | 3.73 |
| P4 rev | ZnSn50, C-16 | 60 | 520 | 400 | 1200 | | 250 | | 130 | | 55.18 |
| P5 | ZnAl, C3 | 50 | 457 | 600 | 930 | | 250 | | 130 | | 18.3 |
| | Ag, C-10 | 10.64 | 396 | 700 | | | | | | | 13.34 |
| | NiCr, C-12 | 14 | 567 | 150 | 75 | | 75 | | | | 3.73 |
| P6 rev | ZnSn50, C-16 | 60 | 522 | 400 | 1200 | | 250 | | 130 | | 9.41 |
| P7 | SiAl, C-14 | 30 | 563 | 400 | | 150 | | 250 | | 130 | 20.80 |

| | TY(%) | Ta* | Tb* | RFY(%) | RFa* | RFb* | RGY(%) | RGa* | RGb* | Rs | ΔE*$_G$ | ΔE*$_F$ | ΔE*$_T$ |
|---|---|---|---|---|---|---|---|---|---|---|---|---|---|
| AC | 76.3 | -3.7 | 1.4 | 3.6 | -5.1 | -3.2 | 5.7 | 0.6 | 0.4 | 2.21 | | | |
| HT | 77.3 | -3.0 | 0.7 | 4.1 | -1.9 | -5.4 | 5.9 | -0.2 | -0.5 | 2.14 | 1.3 | 4.2 | 1.1 |
| HTX | 77.6 | -3.5 | 0.7 | 4.4 | -1.2 | -5.2 | 5.6 | -0.1 | -1.6 | 2.09 | 2.1 | 5.0 | 0.9 |
| HTXXX | 77.7 | -4.2 | 0.3 | 4.8 | 0.9 | -5.2 | 6.4 | 0.7 | -0.2 | 2.03 | 1.7 | 7.3 | 1.3 |

Fig. 47
Example 30

| Target Materials (in order moving away from glass) | Power, kW | Voltage | Ar, ml | O2 setpoint | N2 setpoint | O2 tune, ml | N2 tune | O2 offset, ml | N2 offset, ml | Layer Thickness (nm) |
|---|---|---|---|---|---|---|---|---|---|---|
| Zr, C-12 | 50 | 515 | 600 | 0 | | 520 | | | | 10.0 |
| ZnSn90, C-1 | 60 | 650 | 600 | 840 | | 250 | | 130 | | 22.3 |
| Ag, C-8 | 13.55 | 379 | 700 | | | | | | | 15.3 |
| NiCr, C-10 | 10.2 | 332mv/564v | 150 | 56 | | 56 | | | | 4.0 |
| ZnSn50, C-16 | 60 | 225mv/439v | 400 | 1200 | | 250 | | 130 | | 28.0 |
| Zr, C12 | 50 | 515 | 600 | 0 | | 520 | | 0 | | 10.0 |
| ZnSn90, C-1 | 60 | 650 | 600 | 840 | | 250 | | 130 | | 10.0 |
| Ag, C-8 | 1.4 | 379 | 700 | | | | | | | 0.9 |
| NiCr, C-10 | 10.2 | 332mv/564v | 150 | 56 | | 56 | | | | 6.6 |
| ZnSn90, C-1 | 60 | 228mv/700v | 600 | 840 | | 250 | | 130 | | 33.1 |
| Ag, C-8 | 12.86 | 326mv/535v | 700 | | | | | | | 15.6 |
| NiCr, C-10 | 10.2 | 333mv/561v | 150 | 56 | | 56 | | | | 4.0 |
| ZnSn50, C-16 | 60 | 225mv/439v | 400 | 1200 | | 250 | | 130 | | 10.3 |
| SiAl, C-3 | 60 | 563 | 400 | | 420 | | 250 | | 130 | 21.4 |

|  | TY(%) | RFY(%) | RFa* | RFb* | RGY(%) | RGa* | RGb* | Rs | ΔE*G | ΔE*F | ΔE*T |
|---|---|---|---|---|---|---|---|---|---|---|---|
| AC | 53.8 | 9.7 | -13.2 | -18.2 | 16.2 | -1.3 | -10.9 | 1.61 | | | |
| HT | 53.7 | 10.8 | -14.6 | -15.9 | 16.2 | -0.9 | -10.6 | 1.53 | 0.5 | 3.3 | 2.6 |
| HTX | 52.8 | 10.4 | -14.2 | -17.6 | 16.0 | 0.8 | -10.9 | 1.5 | 2.1 | 1.7 | 3.0 |

Fig. 48
Example 31

| Target Materials (in order moving away from glass) | Power, kW | Voltage | Ar, ml | O2 setpoint | N2 setpoint | O2 tune, ml | N2 tune | O2 offset, ml | N2 offset, ml | Layer Thickness (nm) |
|---|---|---|---|---|---|---|---|---|---|---|
| Zr, C-12 | 50 | 515 | 600 | 0 | | 520 | | | | 10.0 |
| ZnSn90, C-1 | 60 | 650 | 600 | 840 | | 250 | | 130 | | 22.3 |
| Ag, C-8 | 13.55 | 379 | 700 | | | | | | | 15.3 |
| NiCr, C-10 | 10.2 | 332mv/564v | 150 | 58 | | 58 | | | | 4.0 |
| ZnSn50, C-16 | 60 | 225mv/439v | 400 | 1200 | | 250 | | 130 | | 28.0 |
| Zr, C12 | 50 | 515 | 600 | 0 | | 520 | | 0 | | 10.0 |
| ZnSn90, C-1 | 60 | 650 | 600 | 840 | | 250 | | 130 | | 10.0 |
| Ag, C-8 | 1.4 | 379 | 700 | | | | | | | 0.9 |
| NiCr, C-10 | 10.2 | 332mv/564v | 150 | 58 | | 58 | | | | 6.6 |
| ZnSn90, C-1 | 60 | 228mv/700v | 600 | 840 | | 250 | | 130 | | 33.1 |
| Ag, C-8 | 12.86 | 326mv/535v | 700 | | | | | | | 15.6 |
| NiCr, C-10 | 10.2 | 333mv/561v | 150 | 58 | | 58 | | | | 4.0 |
| ZnSn50, C-16 | 60 | 225mv/439v | 400 | 1200 | | 250 | | 130 | | 10.3 |
| SiAl, C-3 | 60 | 563 | 400 | | 420 | | 250 | | 130 | 21.4 |

| | TY(%) | RFY(%) | RFa* | RFb* | RGY(%) | RGa* | RGb* | Rs | ΔE*$_G$ | ΔE*$_F$ | ΔE*$_T$ |
|---|---|---|---|---|---|---|---|---|---|---|---|
| AC | 53.8 | 10.8 | -14.8 | -16.3 | 17.1 | -2.4 | -10.0 | 1.6 | | | |
| HT | 51.8 | 11.4 | -15.9 | -15.5 | 17.2 | -2.8 | -9.6 | 1.52 | 0.6 | 1.8 | 3.0 |
| HTX | 51.8 | 10.8 | -16.0 | -18.1 | 17.2 | -1.4 | -10.1 | 1.5 | 1.0 | 2.2 | 3.1 |

Fig. 49
Example 32

| Target Materials (in order moving away from glass) | Power, kW | Voltage | Ar, ml | O2 setpoint | N2 setpoint | O2 tune, ml | N2 tune | O2 offset, ml | N2 offset, ml | Layer Thickness (nm) |
|---|---|---|---|---|---|---|---|---|---|---|
| Zr, C-5 | 50 | 515 | 600 | 0 | | 520 | | | | 10.0 |
| ZnSn90, C-1 | 60 | 650 | 600 | 840 | | 250 | | 130 | | 22.3 |
| Ag, C-8 | 13.87 | 379 | 700 | | | | | | | 15.3 |
| NiCr, C-10 | 10.4 | 337mv/552v | 150 | 55 | | 55 | | | | 4.0 |
| ZnSn50, C-16 | 60 | 225mv/439v | 400 | 1200 | | 250 | | 130 | | 28.0 |
| Zr, C-5 | 50 | 515 | 600 | 0 | | 520 | | 0 | | 10.0 |
| ZnSn90, C-1 | 60 | 650 | 600 | 840 | | 250 | | 130 | | 10.0 |
| Ag, C-8 | 1.4 | 379 | 700 | | | | | | | 1.0 |
| NiCr, C-10 | 10.4 | 332mv/564v | 150 | 58 | | 58 | | | | 7.8 |
| ZnSn90, C-1 | 60 | 228mv/700v | 600 | 840 | | 250 | | 130 | | 33.3 |
| Ag, C-8 | 13.31 | 326mv/535v | 700 | | | | | | | 15.6 |
| NiCr, C-10 | 10.4 | 333mv/561v | 150 | 55 | | 55 | | | | 4.0 |
| ZnSn90, C-1 | 60 | 650 | 600 | 840 | | 250 | | 130 | | 10.0 |
| SiAl, C-12 | 60 | 563 | 400 | | 420 | | 250 | | 130 | 21.5 |

| | TY(%) | RFY(%) | RFa* | RFb* | RGY(%) | RGa* | RGb* | Rs | ΔE*G | ΔE*F | ΔE*T |
|---|---|---|---|---|---|---|---|---|---|---|---|
| AC | 53.6 | 10.8 | -12.4 | -14.7 | 17.0 | -0.8 | -10.3 | 1.68 | | | |
| HT | 54.8 | 11.7 | -13.2 | -13.9 | 16.6 | -1.8 | -9.8 | 1.53 | 1.3 | 1.9 | 2.9 |
| HTX | 53.0 | 12.0 | -12.4 | -13.2 | 16.5 | 0.5 | -10.2 | 1.52 | 1.4 | 2.6 | 3.7 |

Fig. 50
Example 33

| Target Materials (in order moving away from glass) | Power, kW | Voltage | Ar, ml | O2 setpoint | N2 setpoint | O2 tune, ml | N2 tune | O2 offset, ml | N2 offset, ml | Layer Thickness (nm) |
|---|---|---|---|---|---|---|---|---|---|---|
| Zr, C-5 | 50 | 515 | 600 | 0 | | 520 | | | | 10.0 |
| ZnSn90, C-1 | 60 | 650 | 600 | 840 | | 250 | | 130 | | 22.3 |
| Ag, C-8 | 13.95 | 379 | 700 | | | | | | | 15.3 |
| NiCr, C-10 | 10.4 | 337mv/552v | 150 | 56 | | 56 | | | | 4.0 |
| ZnSn50, C-16 | 60 | 225mv/439v | 400 | 1200 | | 250 | | 130 | | 28.0 |
| Zr, C-5 | 50 | 515 | 600 | 0 | | 520 | | 0 | | 10.0 |
| ZnSn90, C-1 | 60 | 650 | 600 | 840 | | 250 | | 130 | | 10.0 |
| Ag, C-8 | 1.4 | 379 | 700 | | | | | | | 1.1 |
| NiCr, C-10 | 10.4 | 332mv/564v | 150 | 58 | | 58 | | | | 8.1 |
| ZnSn90, C-1 | 60 | 228mv/700v | 600 | 840 | | 250 | | 130 | | 33.8 |
| Ag, C-8 | 13.24 | 326mv/535v | 700 | | | | | | | 15.6 |
| NiCr, C-10 | 10.4 | 333mv/561v | 150 | 56 | | 56 | | | | 4.0 |
| ZnSn90, C-1 | 60 | 650 | 600 | 840 | | 250 | | 130 | | 10.0 |
| SiAl, C-12 | 60 | 563 | 400 | | 420 | | 250 | | 130 | 21.4 |

| | TY(%) | RFY(%) | RFa* | RFb* | RGY(%) | RGa* | RGb* | Rs | ΔE*$_G$ | ΔE*$_F$ | ΔE*$_T$ |
|---|---|---|---|---|---|---|---|---|---|---|---|
| AC | 52.6 | 11.9 | -14.9 | -11.6 | 18.0 | -2.9 | -8.4 | 1.66 | | | |
| HT | 52.9 | 11.5 | -15.8 | -12.6 | 17.5 | -3.1 | -8.6 | 1.54 | 0.7 | 1.5 | 2.4 |
| HTX | 52.8 | 12.5 | -14.3 | -11.2 | 18.4 | -3.1 | -8.5 | 1.72 | 0.5 | 1.2 | 0.5 |

Fig. 53
(Examples 34-42)
[Metal Target & monoclinic structure for ZrO$_2$ layers 2 & 2"]

Fig. 54
(Comparative Examples 43-47)
[Ceramic Target & non-monoclinic structure for ZrO₂ layers 2 & 2"]

| SN650 IGU Ag abs, PE data | 8392 | | 8394 | | 8395 | | 8396 UC | | 8397 UC | |
|---|---|---|---|---|---|---|---|---|---|---|
| | AC | HT | AC | HT | AC | HT | AC | HT | AC | HT |
| T Y [8°] | 48.0 | 49.0 | 48.4 | 49.1 | 48.2 | 49.1 | 50.0 | 50.8 | 49.3 | 50.7 |
| T L* [8°] | 74.9 | 75.5 | 75.1 | 75.5 | 74.9 | 75.5 | 76.1 | 76.5 | 75.6 | 76.5 |
| T a* [8°] | -8.6 | -8.0 | -8.4 | -7.9 | -8.4 | -7.8 | -6.9 | -6.3 | -7.5 | -6.3 |
| T b* [8°] | 2.3 | -1.4 | 2.0 | -1.7 | 2.1 | -1.4 | 1.8 | -1.9 | 0.7 | -2.1 |
| R-out Y [8°] | 20.1 | 19.6 | 19.5 | 18.9 | 19.9 | 19.5 | 19.9 | 19.6 | 20.1 | 19.8 |
| R-out L* [8°] | 52.0 | 51.4 | 51.2 | 50.6 | 51.8 | 51.2 | 51.8 | 51.4 | 51.9 | 51.6 |
| R-out a* [8°] | -1.6 | -2.2 | -2.3 | -2.8 | -2.6 | -3.2 | -0.8 | -1.3 | -0.2 | -0.3 |
| R-out b* [8°] | -7.4 | -8.3 | -7.3 | -8.4 | -7.0 | -8.2 | -7.2 | -8.2 | -6.0 | -7.0 |
| R-in Y [8°] | 17.1 | 17.4 | 17.1 | 17.5 | 17.4 | 17.7 | 17.3 | 17.5 | 17.0 | 17.2 |
| R-in L* [8°] | 48.3 | 48.8 | 48.4 | 48.8 | 48.8 | 49.2 | 48.6 | 48.9 | 48.3 | 48.5 |
| R-in a* [8°] | -9.5 | -9.5 | -9.6 | -9.4 | -9.9 | -9.8 | -8.3 | -8.1 | -7.9 | -7.6 |
| R-in b* [8°] | -7.8 | -9.7 | -6.8 | -8.8 | -6.5 | -8.8 | -6.7 | -9.1 | -6.9 | -9.3 |
| SHGC | 0.245 | 0.251 | 0.248 | 0.252 | 0.246 | 0.252 | 0.248 | 0.256 | 0.244 | 0.254 |
| Emissivity | | | | | | | | | | |
| LSG | 1.97 | 1.96 | 1.96 | 1.95 | 1.96 | 1.95 | 2.02 | 1.99 | 2.02 | 1.99 |
| U-value | 0.287 | 0.287 | 0.287 | 0.287 | 0.287 | 0.287 | 0.287 | 0.287 | 0.287 | 0.287 |
| DE-Rg IGU | 1.2 | | 1.4 | | 1.5 | | 1.2 | | 1.0 | |
| DE-Rf IGU | 2.0 | | 2.1 | | 2.3 | | 2.4 | | 2.5 | |
| DE-T IGU | 3.9 | | 3.8 | | 3.5 | | 3.8 | | 3.2 | |
| dTY | 1.0 | | 0.7 | | 0.9 | | 0.8 | | 1.4 | |

Fig. 55
(Deposition Process & layer thicknesses for Example 37)
[Other monoclinic deposition processes & thicknesses similar for Exs. 34-42]

| | materials | Power, kW | Voltage | Ar, ml | O2 setpoint | N2 setpoint | O2 tune, ml | N2 tune | O2 offset, ml | N2 offset, ml | LS, m/min | RC | DDR | Thx, nm |
|---|---|---|---|---|---|---|---|---|---|---|---|---|---|---|
| P1 | Zr, C-5 | 50 | 515 | 600 | 0 | | 520 | | 0 | | 0.90 | 6.5 | 0.18 | 10.0 |
| | ZnSn90, C-1 | 80 | 650 | 600 | 840 | | 250 | | 130 | | 4.17 | 16 | 1.55 | 22.3 |
| P3 | Ag, C-8 | 13.96 | 379 | 700 | | | | | | | 6.00 | | 6.00 | 15.3 |
| | NiCr, C-10 | 10.4 | 337mv/552 | 150 | 56 | | 56 | | | | 6.00 | 8.2 | 1.6 | 4.0 |
| P4 Rev | ZnSn90, C-16 | 60 | 225mv/439 | 400 | 1200 | | | | | | 2.16 | 22 | 1.01 | 29.0 |
| | Zr, C-5 | 50 | 515 | 600 | 0 | | 250 | | 0 | | 0.90 | 6.5 | 0.18 | 10.0 |
| P5 | ZnSn90, C-1 | 60 | 650 | 600 | 840 | | 250 | | 130 | | 9.30 | 16 | 1.55 | 10.0 |
| | Ag, C-8 | 1.40 | 379 | 700 | | | | | | | 8.80 | | 6.70 | 1.1 |
| | NiCr, C-10 | 10.4 | 332mv/564 | 150 | 58 | | 58 | | | | 8.80 | 8.2 | 1.6 | 7.9 |
| P7 | ZnSn90, C-1 | 60 | 228mv/700 | 600 | 840 | | 250 | | 130 | | 2.75 | 16 | 1.55 | 33.8 |
| | Ag, C-8 | 13.24 | 326mv/535 | 700 | | | | | | | 6.00 | | 6 | 15.6 |
| | NiCr, C-10 | 10.4 | 333mv/561 | 150 | 56 | | 56 | | | | 6.00 | 8.2 | 1.5 | 4.0 |
| P9 | ZnSn90, C-1 | 60 | 650 | 600 | 840 | | 250 | | 130 | | 9.30 | 16 | 1.55 | 10.0 |
| | SiAl, C-12 | 80 | 563 | 400 | | 420 | | 250 | | 130 | 3.90 | 9 | 1.25 | 21.4 |

| 78.65/7980/8080 mock up recipe | materials | Power, kW | Voltage | Ar, ml | O2 setpoint | N2 setpoint | O2 tune, ml | N2 tune, ml | O2 offset, ml | N2 offset, ml | LS, m/min | R | OCR | Thy, nm | thxofdk |
|---|---|---|---|---|---|---|---|---|---|---|---|---|---|---|---|
| P2 Rev | Zr, C-1 | 50 | 515 | 300 | 52 | | 0 | 300Ar | 0 | | 3.50 | 1.0 | 0.7 | 10.00 | 34.5 |
| | ZnSn85, C-5 | 50 | 650 | 600 | 400 | | 600 | | 130 | | 3.77 | 16 | 1.77 | 23.50 | |
| P3 | Ag, C-8 | 2.75 | 379 | 700 | | | | | | | 6.00 | 8.2 | 6.00 | 15.30 | |
| | NiCr, C-10 | 11.4 | 332/522 | 150 | 66 | | 66 | | | | 6.00 | 1.6 | 1.6 | 4.00 | |
| P4 Rev | Zr, C-1 | 50 | 515 | 300 | 52 | | 0 | 300Ar | 0 | | 1.75 | 1.0 | 0.7 | 20.00 | |
| | ZnSn85, C-5 | 50 | 650 | 600 | 400 | | 600 | | 130 | | 3.06 | 16 | 1.77 | 29.00 | |
| P5 | Ag, C-8 | 2.75 | 379 | 700 | | | | | | | 8.80 | 8.2 | 6.70 | 2.09 | |
| | NiCr, C-10 | 11.4 | 332/522 | 150 | 64 | | 64 | | | | 8.80 | 16 | 1.6 | 8.88 | |
| | ZnSn85, C-5 | 50 | | 600 | 400 | | 600 | | 130 | | 2.57 | 16 | 1.77 | 34.50 | 85.5 |
| P7 | Ag, C-8 | | | 700 | | | | | | | 6.00 | 8.2 | 6 | 15.60 | |
| | NiCr, C-10 | 11.4 | 332/522 | 150 | 66 | | 66 | | | | 5.00 | 16 | 1.6 | 4.00 | |
| | ZnSn85, C-5 | 50 | | 600 | 400 | | 600 | | 130 | | 0.00 | 9 | 1.77 | 10.04 | 31.0 |
| P9 | SiAl, C-14 | 60 | | 400 | 420 | | | 250 | | 130 | 3.17 | | 1.1 | 20.80 | |

Fig. 56
(Deposition Process & layer thicknesses for Comparative Example 44)
[Other nonmonoclinic deposition processes & thicknesses similar for CEs. 43-47]

Fig. 57
(Deposition Process & layer thicknesses for Example 48)
[Monoclinic layer deposition via ceramic target; thicknesses similar to Exs. 34-42]

| 271SNE50 | Material | Power Setpoint (0-150 kw) | Voltage | Argon Setpoint (0-2500 sccm) | O2 setpoint (0-2500 sccm) | N2 setpoint (0-2500 sccm) | Tuning Gas (Ar/O2/N2) | Tuning flow (0-2500 sccm) | Line Speed (0-12 m/min) | Ratio Control | DDR | Thickness (nm) |
|---|---|---|---|---|---|---|---|---|---|---|---|---|
| P1 | ZrOx-C12 | 50.0 | | 600 | | | Oxygen | 400 | 0.73 | | 0.29 | 20.0 |
| P2 - Rev | ZnSn-C3 | 60.0 | | 600 | 840 | | Oxygen | 250 | 8.12 | 16.0 | 1.84 | 13.6 |
| P3 | Ag-C8 | 12.3 | | 700 | | | Argon | 60 | 6.00 | | 6.70 | 15.5 |
| | NiCr-C10 | 11.5 | | 150 | 60 | | Oxygen | 250 | 6.00 | | 2.10 | 4.0 |
| P4 - Rev | ZnSn-C16 | 60 | | 400 | 1200 | | Oxygen | 250 | 1.93 | 22 | 1.16 | 39 |
| P5 | ZnSn-C3 | 60.0 | | 600 | 840 | | Oxygen | 250 | 11.04 | 16.0 | 1.84 | 10.0 |
| | Ag-C8 | 1.3 | | 700 | | | Argon | 60 | 4.80 | | 6.70 | 1.1 |
| P6 - Rev | NiCr-C10 | 11.5 | | 150 | 60 | | Oxygen | 250 | 4.80 | | 2.10 | 8.8 |
| P7 | ZnSn-C3 | 60.0 | | 600 | 840 | | Oxygen | 250 | 2.45 | 16.0 | 1.84 | 42.8 |
| | Ag-C8 | 12.4 | | 700 | | | Argon | 60 | 6.00 | | 6.70 | 15.6 |
| | NiCr-C10 | 11.5 | | 150 | 60 | | Oxygen | 250 | 6.00 | | 2.10 | 4.0 |
| P8 - Rev | ZnSn-C3 | 60.0 | | 600 | 840 | | Oxygen | 250 | 11.04 | 16.0 | 1.84 | 10.0 |
| P9 | SiAl-C5 | 60.0 | | 400 | | 420 | Nitrogen | 250 | 3.21 | | 1.15 | 22.2 |

Example 48 (ΔE* Values)

| | Rg Delta E | | | Rf Delta E | | | Tr Delta E | | |
|---|---|---|---|---|---|---|---|---|---|
| | 0-12 min | 0-16 min | 0-24 min | 0-12 | 0-16 | 0-24 | 0-12 | 0-16 | 0-24 |
| | 2 | 3 | 5 | 3 | 4 | 5 | 3 | 4 | 5 |
| | 1.7 | 1.4 | 2.7 | 0.8 | 2.7 | 3.2 | 2.5 | 3.2 | 5.3 |
| | | | 5.9 | | | 6.7 | | | 11.0 |
| | 1.7 | 2.4 | 3.0 | 1.9 | 3.1 | 5.1 | 2.5 | 4.3 | 4.8 |
| | | | 7.1 | | | 10.0 | | | 11.6 |
| | 1.7 | 2.2 | 3.5 | 1.4 | 1.9 | 4.6 | 2.2 | 3.0 | 4.1 |
| | | | 7.4 | | | 8.0 | | | 9.4 |
| | 1.5 | 1.9 | 3.2 | 1.2 | 1.8 | 4.7 | 2.3 | 4.4 | 2.8 |
| | | | 6.6 | | | 7.7 | | | 9.5 |

| T-Y | T-a* | T-b* | F-Y | F-a* | F-b* | G-Y | G-a* | G-b* | Rsqr |
|---|---|---|---|---|---|---|---|---|---|
| 76.8 | -2.5 | 3.0 | 5.5 | -3.3 | 11.5 | 6.5 | 0.0 | -1.5 | 2.50 |
| 74.8 | -4.5 | 0.0 | 3.5 | -7.3 | 5.5 | 4.5 | -2.0 | -5.5 | 2.10 |
| 52.7 | -8.1 | -0.1 | 10.6 | -11.5 | -12.2 | 17.4 | -0.7 | -7.7 | 1.68 |
| 52.6 | -6.5 | -1.9 | 10.7 | -12.3 | -12.6 | 17.2 | -2.2 | -6.8 | 1.55 |
| 51.9 | -7.5 | -3.2 | 10.1 | -11.4 | -14.8 | 17.0 | 0.5 | -7.1 | 1.49 |
| 50.0 | -8.1 | -5.2 | 10.1 | -11.1 | -15.3 | 17.3 | 1.6 | -6.2 | 1.49 |
| 52.2 | -8.4 | 1.2 | 8.9 | -7.4 | -11.0 | 16.6 | -0.7 | -6.2 | 1.77 |
| 51.9 | -6.4 | -2.8 | 9.0 | -7.2 | -12.9 | 15.6 | -0.3 | -7.2 | 1.61 |
| 50.3 | -7.1 | -5.2 | 8.6 | -6.8 | -14.0 | 15.4 | 1.1 | -6.4 | 1.59 |
| 50.5 | -7.4 | -5.8 | 8.2 | -5.7 | -15.6 | 15.4 | 1.8 | -6.3 | 1.59 |
| 51.4 | -8.5 | -1.7 | 9.1 | -8.1 | -10.5 | 16.5 | -2.1 | -5.2 | 1.82 |
| 52.0 | -6.5 | -2.8 | 9.3 | -7.7 | -11.8 | 15.5 | -1.7 | -6.1 | 1.62 |
| 51.0 | -6.7 | -4.1 | 9.0 | 7.8 | -12.3 | 15.1 | -1.0 | -5.8 | 1.65 |
| 50.2 | -7.0 | -5.5 | 8.3 | -6.4 | -14.5 | 14.8 | 0.6 | -5.4 | 1.65 |
| 51.3 | -8.5 | -1.8 | 9.0 | -8.1 | -10.5 | 16.4 | -2.0 | -5.0 | 1.79 |
| 51.8 | -6.5 | -2.8 | 9.3 | -7.7 | -11.5 | 15.5 | -1.9 | -5.9 | 1.64 |
| 49.8 | -7.2 | -5.8 | 9.0 | -7.8 | -12.3 | 15.2 | -1.1 | -5.6 | 1.65 |
| 51.1 | -6.7 | -4.0 | 8.2 | -6.4 | -14.6 | 14.9 | 0.6 | -5.2 | 1.63 |

Example 48 (Optical Data)

US 10,787,385 B2

LOW-E MATCHABLE COATED ARTICLES HAVING ABSORBER FILM AND CORRESPONDING METHODS

This application is a Continuation-in-Part (CIP) of U.S. application Ser. No. 16/355,966, filed Mar. 18, 2019, which is a Continuation-in-Part (CIP) of U.S. application Ser. No. 16/220,037, filed Dec. 14, 2018, which is a Continuation-in-Part (CIP) of U.S. application Ser. No. 16/035,810, filed Jul. 16, 2018 (now U.S. Pat. No. 10,031,215), the disclosures of which are all hereby incorporated herein by reference in their entireties.

This invention relates to low-E coated articles that have approximately the same color characteristics as viewed by the naked eye both before and after heat treatment (e.g., thermal tempering), and corresponding methods. Such articles may in certain example embodiments combine two or more of: (1) desirable visible transmission characteristics, (2) good durability before and/or after heat treatment, (3) a low $\Delta E^*$ value which is indicative of color stability upon heat treatment (HT), and/or (4) an absorber film designed to adjust visible transmission and provide desirable coloration for the coated article, while maintaining durability and/or thermal stability. Such coated articles may be used monolithically for windows, in insulating glass (IG) window units, laminated window units, vehicle windshields, and/or other vehicle or architectural or residential window applications.

BACKGROUND OF THE INVENTION

There is a need for substantial matchability (before heat treatment vs. after heat treatment). Glass substrates are often produced in large quantities and cut to size in order to fulfill the needs of a particular situation such as a new multi-window office building, vehicle window needs, etc. It is often desirable in such applications that some of the windows and/or doors be heat treated (i.e., tempered, heat strengthened or heat-bent) while others need not be. Office buildings often employ IG units and/or laminates for safety and/or thermal control. It is desirable that the units and/or laminates which are heat treated (HT) substantially match their non-heat treated counterparts (e.g., with regard to color, reflectance, transmission, and/or the like, at least on the side to be viewed from outside the building) for architectural and/or aesthetic purposes.

Commonly owned U.S. Pat. No. 5,688,585 discloses a solar control coated article including: glass/$Si_3N_4$/NiCr/$Si_3N_4$. One object of the '585 patent is to provide a sputter coated layer system that after heat treatment (HT) is matchable colorwise with its non-heat treated counterpart. While the coating systems of the '585 patent are excellent for their intended purposes, they suffer from certain disadvantages. In particular, they tend to have rather high emissivity and/or sheet resistance values (e.g., because no silver (Ag) layer is disclosed in the '585 patent).

It has in the prior art been possible to achieve matchability in systems other than those of the aforesaid '585 patent, between two different layer systems, one of which is heat treated and the other is not. The necessity of developing and using two different layer systems to achieve matchability creates additional manufacturing expense and inventory needs which are undesirable.

U.S. Pat. Nos. 6,014,872 and 5,800,933 (see Example B) disclose a heat treatable low-E layer system including: glass/$TiO_2$/$Si_3N_4$/NiCr/Ag/NiCr/$Si_3N_4$. Unfortunately, when heat treated this low-E layer system is not approximately matchable colorwise with its non-heat treated counterpart (as viewed from the glass side). This is because this low-E layer system has a $\Delta E^*$ (glass side) value greater than 4.1 (i.e., for Example B, $\Delta a^*_G$ is 1.49, $\Delta b^*_G$ is 3.81, and $\Delta L^*$ (glass side) is not measured; using Equation (1) below then $\Delta E^*$ on the glass side must necessarily be greater than 4.1 and is probably much higher than that).

U.S. Pat. No. 5,563,734 discloses a low-E coating system including: substrate/$TiO_2$/$NiCrN_x$/Ag/$NiCrN_x$/$Si_3N_4$. Unfortunately, it has been found that when high Nitrogen (N) flow rates are used when forming the $NiCrN_x$ layers (see the high N flow rate of 143 sccm in Table 1 of the '734 patent; translating into about 22 sccm/kW), the resulting coated articles are not color stable with heat treatment (i.e., they tend to have high $\Delta E^*$ (glass side) values greater than 6.0). In other words, if subjected to HT, the '734 patent low-E layer system would not be approximately matchable colorwise with its non-heat treated counterpart (as viewed from the glass side).

Moreover, it is sometimes desirable for a coated article to have desirable visible transmission characteristics and/or good durability (mechanical and/or chemical). Unfortunately, certain known steps that are taken to adjust or improve visible transmission characteristics and/or pre-HT durability tend to degrade post-HT durability and thermal stability. Thus, it is often difficult to obtain a combination of desirable visible transmission values, thermal stability of color, and good durability.

In view of the above, it will be apparent to those skilled in the art that there exists a need for a low-E coating or layer system that after HT substantially matches in color and/or reflection (as viewed by a naked human eye) its non-heat treated counterpart. In other words, there exists a need in the art for a low-E matchable coating or layering system. There also exists a need in the art for a heat treatable system that can combine one or more of: (1) desirable visible transmission characteristics (e.g., from about 30-75% measured monolithically, and/or from 30-70% as measured in an IG unit), (2) good durability before and/or after heat treatment, (3) a low $\Delta E^*$ value which is indicative of color stability upon heat treatment (HT), and/or (4) an absorber film designed to adjust visible transmission and provide desirable coloration for the coated article, while maintaining durability and/or thermal stability.

It is a purpose of this invention to fulfill one or more of the above-listed needs, and/or other needs which will become more apparent to the skilled artisan once given the following disclosure.

SUMMARY

An example object of this invention is to provide a low-E coating or layer system that has good color stability (a low $\Delta E^*$ value) upon heat treatment (HT). Another example object of this invention is to provide a low-E matchable coating or layering system. Another example object, in certain example embodiments, is to provide an absorber film in the low-E coating which is designed to adjust visible transmission and provide desirable coloration for the coated article, while maintaining durability and/or thermal stability.

Example embodiments of this invention relate to low-E coated articles that have approximately the same color characteristics as viewed by the naked eye both before and after heat treatment (e.g., thermal tempering), and corresponding methods. Such articles may in certain example embodiments combine two or more of: (1) desirable visible transmission characteristics, (2) good durability before and/ or after heat treatment, (3) a low ΔE* value which is indicative of color stability upon heat treatment (HT), and/or (4) an absorber film designed to adjust visible transmission and provide desirable coloration for the coated article, while maintaining durability and/or thermal stability.

In certain example embodiments, the optional absorber film may be a multi-layer absorber film including a first layer of or including silver (Ag), and a second layer of or including NiCr which may be partially or fully oxided (NiCrO$_x$). Such a multi-layer absorber film may thus, in certain example embodiments, be made up of a layer sequence of Ag/NiCrO$_x$. This layer sequence may be repeated in certain example instances. The silver based layer in the absorber film is preferably sufficiently thin so that its primary function is to absorb visible light and provide desirable coloration (as opposed to being much thicker and primarily function as an IR reflection layer). The NiCr or NiCrO$_x$ is provided over and contacting the silver of the absorber film in order to protect the silver, and also to contribute to absorption.

A single layer of NiCr (or other suitable material) may also be used as an absorber film in low-E coatings in certain example embodiments of this invention. However, it has surprisingly been found that using silver in an absorber film (single layer, or multi-layer, absorber film) provides for several unexpected advantages compared to a single layer of NiCr as the absorber. First, it has been found that a single layer of NiCr as the absorber tends to cause yellowish coloration in certain low-E coating coated articles, which may not be desirable in certain instances. In contrast, it has been surprisingly found that using silver in an absorber films tends to avoid such yellowish coloration and/or instead provide for more desirable neutral coloration of the resulting coated article. Thus, the use of silver in an absorber film has been found to provide for improved optical characteristics. Second, the use of a single layer of NiCr as the absorber tends to also involve providing silicon nitride based layers on both sides of the NiCr so as to directly sandwich and contact the NiCr therebetween. It has been found that the provision of silicon nitride in certain locations in a coating stack may lead to compromised thermal stability upon HT. In contrast, it has been surprisingly found that when using silver in an absorber film a pair of immediately adjacent silicon nitride layers are not needed, so that thermal stability upon HT may be improved. Thus, the use of silver in an absorber film has been found to provide for improved thermal stability including lower ΔE* values and therefor improved matchability between HT and non-HT versions of the same coating. The use of silver in an absorber film may also provide for improved manufacturability in certain situations.

In certain example embodiments, surprisingly, and unexpectedly, it has been found that the provision of an as-deposited crystalline or substantially crystalline (e.g., at least 50% crystalline, more preferably at least 60% crystalline) layer of or including zinc oxide, doped with at least one dopant (e.g., Sn), immediately under an infrared (IR) reflecting layer of or including silver in a low-E coating has effect of significantly improving the coating's thermal stability (i.e., lowering the ΔE* value). One or more such crystalline, or substantially crystalline (e.g., at least 50% crystalline, more preferably at least 60% crystalline), layers may be provided under one or more corresponding IR reflecting layers comprising silver, in various embodiments of this invention. Thus, the crystalline or substantially crystalline layer of or including zinc oxide, doped with at least one dopant (e.g., Sn), immediately under an infrared (IR) reflecting layer of or including silver may be used in single silver low-E coatings, double-silver low-E coatings, or triple silver low-E coatings in various embodiments of this invention. In certain example embodiments, the crystalline or substantially crystalline layer of or including zinc oxide is doped with from about 1-30% Sn, more preferably from about 1-20% Sn, most preferably from about 5-15% Sn, with an example being about 10% Sn (in terms of wt. %). The zinc oxide, doped with Sn, is in a crystallized or substantially crystallized phase (as opposed to amorphous or nanocrystalline) as deposited, such as via sputter deposition techniques from at least one sputtering target(s) of or including Zn and Sn. The crystallized phase of the doped zinc oxide based layer as deposited, combined with the layer(s) between the silver and the glass, allows the coated article to realize improved thermal stability upon optional HT (lower the ΔE* value). It is believed that the crystallized phase of the doped zinc oxide based layer as deposited (e.g., at least 50% crystalline, more preferably at least 60% crystalline), combined with the layer(s) between the IR reflecting layer and the glass, allows the silver of the IR reflecting layer to have improved crystal structure with texture but with some randomly oriented grains so that its refractive index (n) changes less upon optional HT, thereby allowing for improved thermal stability to be realized.

In certain example embodiments, it has also been surprisingly and unexpectedly found that the provision of a dielectric layer(s) of or including silicon oxide, zirconium oxide, zirconium oxynitride, silicon zirconium oxide and/or silicon zirconium oxynitride (e.g., SiZrO$_x$, ZrO$_2$, SiO$_2$, and/or SiZrO$_x$N$_y$) also provides for improved thermal stability of the coated article, and thus lower the ΔE* values upon heat treatment (HT) such as thermal tempering. In certain example embodiments, at least one dielectric layer(s) of or including silicon oxide, zirconium oxide, silicon zirconium oxide and/or silicon zirconium oxynitride (e.g., SiZrO$_x$, ZrO$_2$, SiO$_2$, and/or SiZrO$_x$N$_y$) may be provided: (i) in the bottom dielectric portion of the coating under all silver based IR reflecting layer(s), and/or (ii) in a middle dielectric portion of the coating between a pair of silver based IR reflecting layers. For example, the dielectric layer of or including silicon oxide, zirconium oxide, silicon zirconium oxide and/or silicon zirconium oxynitride may be provided directly under and contacting the lowermost doped zinc oxide based layer in certain example embodiments of this invention, and/or between a pair of zinc oxide inclusive layers in a middle dielectric portion of the low-E coating.

The dielectric layer(s) of or including silicon oxide, zirconium oxide, silicon zirconium oxide and/or silicon zirconium oxynitride may or may not be provided in combination with an as-deposited crystalline or substantially crystalline (e.g., at least 50% crystalline, more preferably at least 60% crystalline) layer(s) of or including zinc oxide, doped with at least one dopant (e.g., Sn), immediately under an infrared (IR) reflecting layer, in various example embodiments of this invention.

In certain example embodiments, it has surprisingly and unexpectedly been found that initially sputter-depositing the dielectric layer(s) of or including zirconium oxide (e.g., ZrO$_2$), zirconium oxynitride, silicon zirconium oxide and/or silicon zirconium oxynitride (e.g., SiZrO$_x$, ZrO$_2$, SiO$_2$, and/or SiZrO$_x$N$_y$) so as to comprise a monoclinic phase crystalline structure is advantageous in that it results in improved thermal stability (lower ΔE* value) and/or reduced change in visible transmission (e.g., T$_{vis}$ or TY) of the coated article upon heat treatment (HT). In certain example embodiments, the monoclinic phase for the dielectric layer (e.g., ZrO$_2$) may be achieved by using a very high oxygen gas flow for that layer during the sputter-deposition process of that layer, and using a metallic sputtering target (e.g., Zr target). For example, when sputter depositing layer 2 and/or 2″ to form a layer having monoclinic phase, the sputter process for that layer may implement an oxygen gas flow of at least 5 ml/kW, more preferably of at least 6 ml/kW, more preferably at least 8 ml/kW, and most preferably at least 10 ml/kW, where ml indicates the total oxygen gas flow in the chamber and kW indicates power to the target. It is noted that such high oxygen gas flows desired in certain example embodiments of this case are counterintuitive, and conventionally undesirable, because they reduce deposition rates and thus created added time and expense in making coated articles. While high oxygen gas flows are used to achieve the monoclinic phase in connection with metal targets in certain example embodiments when certain types of sputtering equipment is used, this invention is not so limited, as it has been found that with certain types of sputtering equipment the monoclinic phase may also be achieved with low or lower oxygen gas flows.

It has been found that a significant partial or full phase change away from monoclinic to tetragonal or cubic crystalline structure, and corresponding density change, of the layer upon HT tends to compensate for change in crystalline structure of the silver layer(s) upon said HT, which appears to result in improved thermal stability (lower ΔE* value) and/or reduced change in visible transmission (e.g., T$_{vis}$ or TY) of the coated article upon HT. It has been surprisingly found that initially sputter-depositing the dielectric layer(s) of or including zirconium oxide, zirconium oxynitride, silicon zirconium oxide and/or silicon zirconium oxynitride (e.g., SiZrO$_x$, ZrO$_2$, SiO$_2$, and/or SiZrO$_x$N$_y$) so as to comprise a monoclinic phase crystalline structure is advantageous in that it results in a high density change in the layer of at least about 0.25 g/cm$^3$, more preferably of at least about 0.30 g/cm$^3$, and most preferably of at least about 0.35 g/cm$^3$ (e.g., from about 5.7 to about 6.1 g/cm$^3$), upon HT which in turn compensates for change in crystalline structure of the silver layer(s) upon said HT, resulting in improved thermal stability (lower ΔE* value) and/or reduced change in visible transmission (T$_{vis}$ or TY) of the coated article upon heat treatment (HT). In certain example embodiments, this allows for reduced change in visible transmission (T$_{vis}$ or TY) of the coated article of no more than 1.2%, more preferably no more than 1.0%, and most preferably no more than 0.5%, due to HT, and/or a reduced ΔE* value.

It has also been surprisingly and unexpectedly found that the provision of no silicon nitride based layer directly under and contacting the lowermost doped zinc oxide based layer between the glass substrate and the lowermost silver based layer, in combination with the crystallized phase of the doped zinc oxide based layer as deposited, allows for improved thermal stability upon heat treatment (lower ΔE* values) to be realized. It has also been surprisingly and unexpectedly found that the provision of no silicon nitride based layer in the middle section of the stack between the two silver-based IR reflecting layers allows for improved thermal stability upon heat treatment (lower ΔE* values) to be realized.

In certain example embodiments, measured monolithically and/or in an IG unit with two panes, the coated article is configured to realize one or more of: (i) a transmissive ΔE* value (where transmissive optics are measured) of no greater than 3.0 (more preferably no greater than 2.8, and most preferably no greater than 2.5 or 2.3) upon HT for 8, 12 and/or 16 minutes at a temperature of about 650 degrees C., (ii) a glass side reflective ΔE* value (where glass side reflective optics are measured) of no greater than 3.0 (more preferably no greater than 2.5, more preferably no greater than 2.0, and most preferably no greater than 1.5, no greater than 1.0, and/or no greater than 0.6) upon HT for 8, 12 and/or 16 minutes at a temperature of about 650 degrees C., and/or (iii) a film side reflective ΔE* value (where film side reflective optics are measured) of no greater than 3.5 (more preferably no greater than 3.0, and most preferably no greater than 2.0, or no greater than 1.5, or 1.3) upon HT for 8, 12, 16 and/or 20 minutes at a temperature of about 650 degrees C. Of course, in commercial practice the baking times may be for different/other time periods, and these are for reference purposes. In certain example embodiments, measured monolithically, the coated article is configured to have a visible transmission (T$_{vis}$ or Y), before or after any optional HT, of at least about 30%, more preferably of at least about 40%, and most preferably of at least about 50% (e.g., from about 45-60%). Coated articles herein may have, for example, visible transmission from about 30-75% measured monolithically, and/or from 30-70% as measured in an IG unit. Among other things, the thickness, makeup, and/or number of layers of the absorber may be adjusted to adjust visible transmission. In certain example embodiments, measured monolithically, the coated article is configured to have a glass side visible reflection (R$_g$Y or RGY), measured monolithically, before or after any optional HT, of no greater than about 20%.

In an example embodiment of this invention, there is provided a coated article including a coating on a glass substrate, wherein the coating comprises: a first crystalline or substantially crystalline layer comprising zinc oxide doped with from about 1-30% Sn (wt. %), provided on the glass substrate; a first infrared (IR) reflecting layer comprising silver located on the glass substrate and directly over and contacting the first crystalline or substantially crystalline layer comprising zinc oxide doped with from about 1-30% Sn; wherein no silicon nitride based layer is located directly under and contacting the first crystalline or substantially crystalline layer comprising zinc oxide doped with from about 1-30% Sn; at least one dielectric layer having monoclinic phase and comprising an oxide of zirconium; wherein the at least one dielectric layer having monoclinic phase and comprising the oxide of zirconium is located: (1) between at least the glass substrate and the first crystalline or substantially crystalline layer comprising zinc oxide doped with from about 1-30% Sn (wt. %), and/or (2) between at least the first IR reflecting layer comprising silver and a second IR reflecting layer comprising silver of the coating; an optional absorber film including a layer comprising silver, wherein a ratio of a physical thickness of the first IR reflecting layer comprising silver to a physical thickness of the layer comprising silver of the absorber film is at least 5:1 (more preferably at least 8:1, even more preferably at least 10:1, and most preferably at least 15:1); and wherein the coated article is configured to have, measured monolithically, at least two of: (i) a transmissive ΔE* value of no greater than 3.0 due to a reference heat treatment for 12 minutes at a temperature of about 650 degrees C., (ii) a glass side reflective ΔE* value of no greater than 3.0 due to the reference heat treatment for 12 minutes at a temperature of about 650 degrees C., and (iii) a film side reflective ΔE* value of no greater than 3.5 due to the reference heat treatment for 12 minutes at a temperature of about 650 degrees C.

Such coated articles may be used monolithically for windows, in insulating glass (IG) window units (e.g., on surface #2 or surface #3 in IG window unit applications), laminated window units, vehicle windshields, and/or other vehicle or architectural or residential window applications.

This invention will now be described with respect to certain embodiments thereof as illustrated in the following drawings, wherein:

IN THE DRAWINGS

FIGS. 1(a), 1(b), 1(c), 1(d), 1(e), 1(f), 1(g), 1(h), and 1(i) are cross sectional views of coated articles according to example embodiments of this invention.

FIG. 2 is a chart illustrating sputter-deposition conditions for the sputter-deposition of the low-E coating of Example 1 on a 6 mm thick glass substrate, where the low-E coating is illustrated in general by FIG. 1(a).

FIG. 3 is a chart illustrating sputter-deposition conditions for the sputter-deposition of the low-E coating of Example 2 on a 6 mm thick glass substrate, where the low-E coating is illustrated in general by FIG. 1(a).

FIG. 4 is a chart illustrating optical characteristics of Example 1: as coated (annealed) before heat treatment in the left-most data column, after 12 minutes of heat treatment at 650 degrees C. (HT), after 16 minutes of HT at 650 degrees C. (HTX), and after 24 minutes of heat treatment at 650 degrees C. (HTXXX) in the far right data column.

FIG. 5 is a chart illustrating optical characteristics of Example 2: as coated (annealed) before heat treatment in the left-most data column, after 12 minutes of heat treatment at 650 degrees C. (HT), after 16 minutes of HT at 650 degrees C. (HTX), and after 24 minutes of heat treatment at 650 degrees C. (HTXXX) in the far right data column.

Figure 1A:
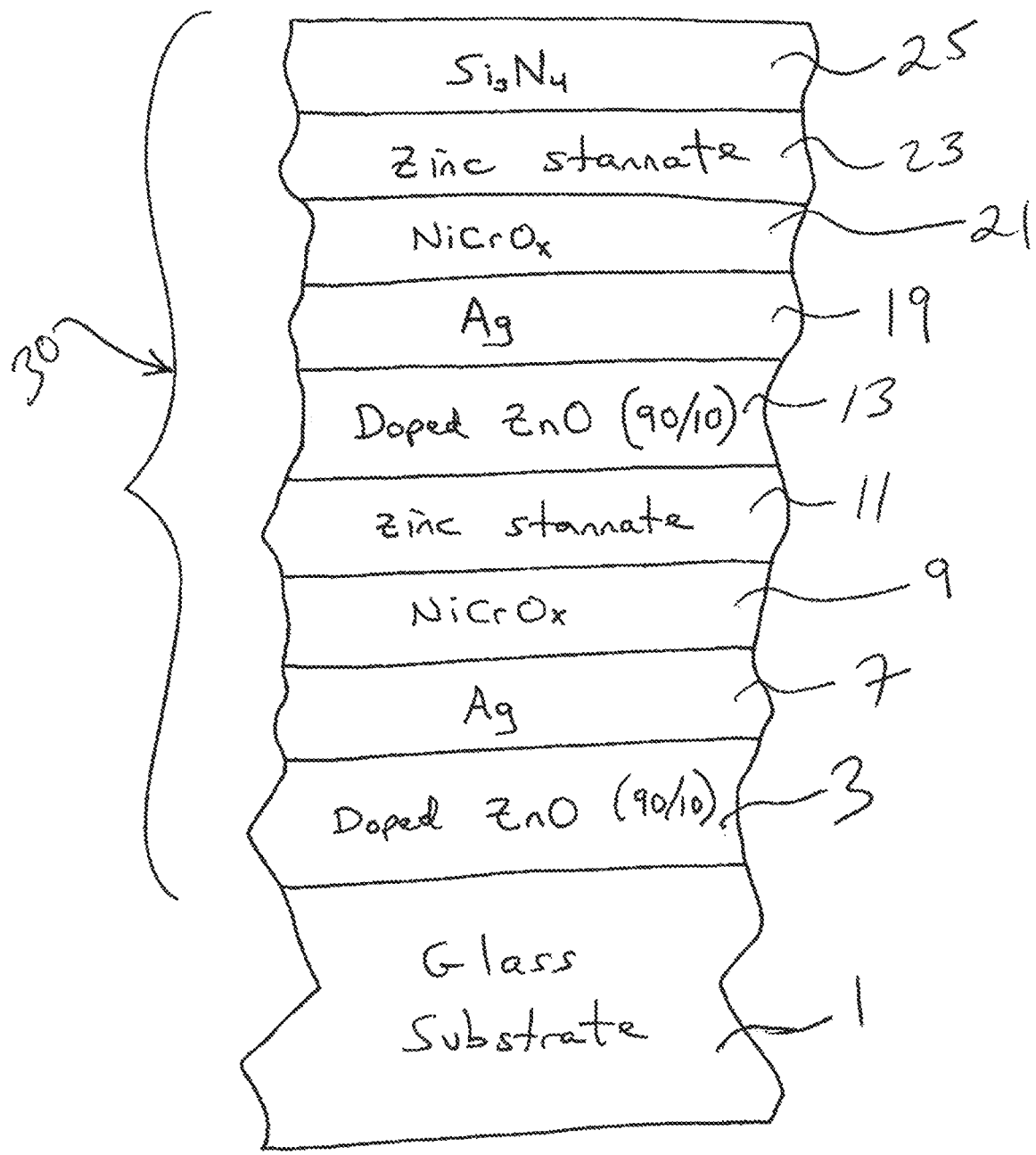

FIG. 6 is a chart illustrating sputter-deposition conditions for the sputter-deposition of the low-E coating of Example 3 on a 3.1 mm thick glass substrate, where the low-E coating is illustrated in general by FIG. 1(a).

FIG. 7 is a chart illustrating sputter-deposition conditions for the sputter-deposition of the low-E coating of Example 4 on a 3.1 mm thick glass substrate, where the low-E coating is illustrated in general by FIG. 1(a).

Figure 8:
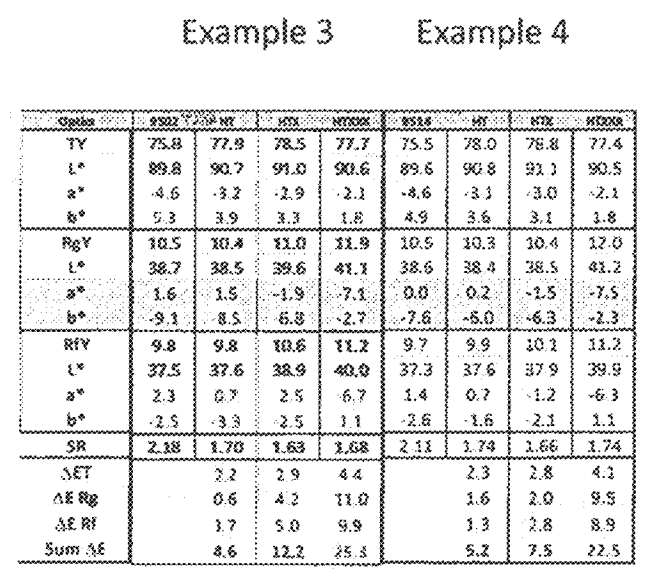

FIG. 8 is a chart illustrating optical characteristics of Examples 3-4: as coated (annealed) before heat treatment in the left-most data column, after 8 minutes of heat treatment at 650 degrees C. (HT), after 12 minutes of HT at 650 degrees C. (HTX), and after 20 minutes of heat treatment at 650 degrees C. (HTXXX) in the far right data column.

FIG. 9 is a chart illustrating sputter-deposition conditions for the sputter-deposition of the low-E coating of Example 5 on a 6 mm thick glass substrate, where the low-E coating is illustrated in general by FIG. 1(a).

Figure 10:

FIG. 10 is a chart illustrating optical characteristics of Example 5: as coated (annealed) before heat treatment in the left-most data column, after 12 minutes of heat treatment at 650 degrees C. (HT), after 16 minutes of HT at 650 degrees C. (HTX), and after 24 minutes of heat treatment at 650 degrees C. (HTXXX) in the far right data column.

FIG. 11 is a chart illustrating sputter-deposition conditions for the sputter-deposition of the low-E coating of Example 6 on a 6 mm thick glass substrate, where the low-E coating is illustrated in general by FIG. 1(a).

FIG. 12 is a chart illustrating optical characteristics of Example 6: as coated (annealed) before heat treatment in the left-most data column, after 12 minutes of heat treatment at 650 degrees C. (HT), after 16 minutes of HT at 650 degrees C. (HTX), and after 24 minutes of heat treatment at 650 degrees C. (HTXXX) in the far right data column.

FIG. 13 is chart illustrating sputter-deposition conditions for the sputter-deposition of the low-E coating of Example 7 on a 6 mm thick glass substrate, where the low-E coating is illustrated in general by FIG. 1(a).

FIG. 14 is a chart illustrating optical characteristics of Example 7: as coated (annealed) before heat treatment in the left-most data column, after 12 minutes of heat treatment at 650 degrees C. (HT), after 16 minutes of HT at 650 degrees C. (HTX), and after 24 minutes of heat treatment at 650 degrees C. (HTXXX) in the far right data column.

FIG. 15 is a chart illustrating sputter-deposition conditions for the sputter-deposition of the low-E coating of Example 8 on a 6 mm thick glass substrate, where the low-E coating is illustrated in general by FIG. 1(a).

Figure 16:
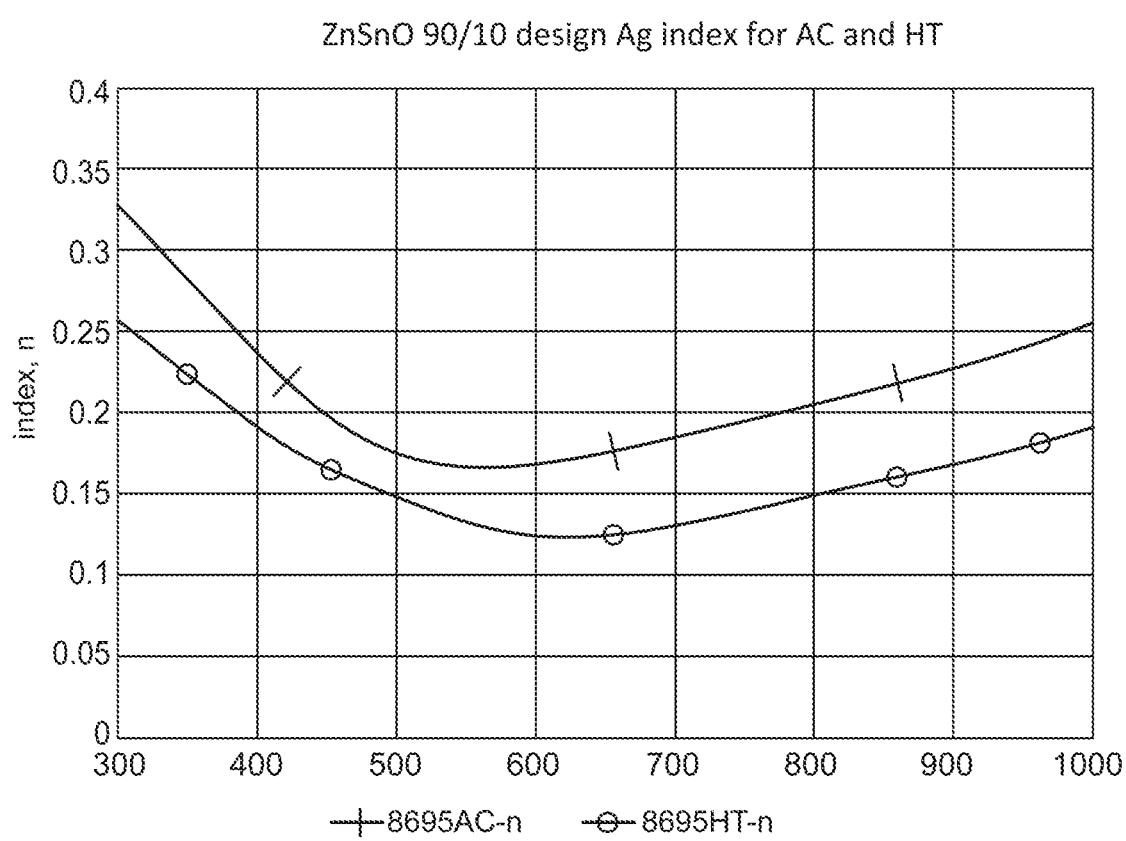

FIG. 16 is a wavelength (nm) vs. refractive index (n) graph illustrating the change in refractive index of the silver layer of Example 8 from the as coated (AC) state to the heat treated (HT) state.

FIG. 17 is a chart illustrating sputter-deposition conditions for the sputter-deposition of the low-E coating of Example 9 on a 6 mm thick glass substrate, where the low-E coating is illustrated in general by FIG. 1(a).

FIG. 18 is a chart illustrating optical characteristics of Example 9: as coated (annealed) before heat treatment in the left-most data column, after 12 minutes of heat treatment at 650 degrees C. (HT), and after 16 minutes of HT at 650 degrees C. (HTX) in the far right data column.

Figure 19:
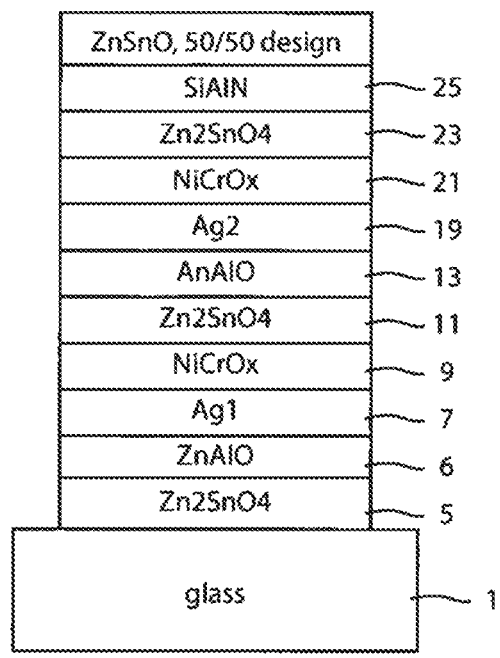

FIG. 19 is a cross sectional view of a first Comparative Example coated article.

Figure 20:
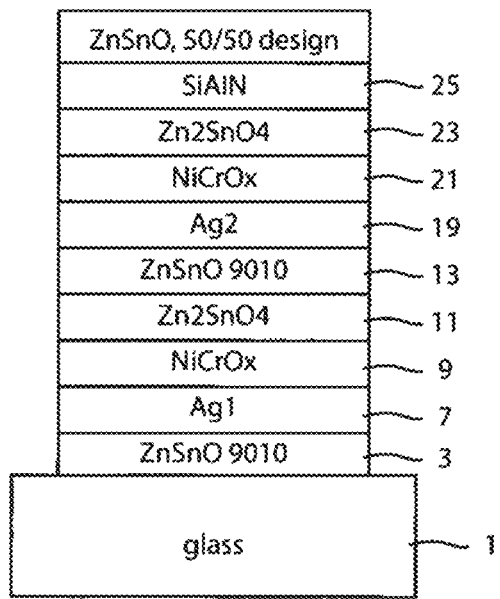

FIG. 20 is a cross sectional view of a coated article according to an embodiment of this invention, illustrating coatings of Examples 1-10.

FIG. 21 is chart illustrating sputter-deposition conditions for the sputter-deposition of the low-E coating of Example 10 on a 3.1 mm thick glass substrate, where the low-E coating is illustrated in general by FIGS. 1(a) and 10.

FIG. 22 is an XRD Lin (Cps) vs. 2-Theta-Scale graph illustrating, for Example 10, the relative small 66% change in peak height of Ag (111) due to HT.

Figure 23:
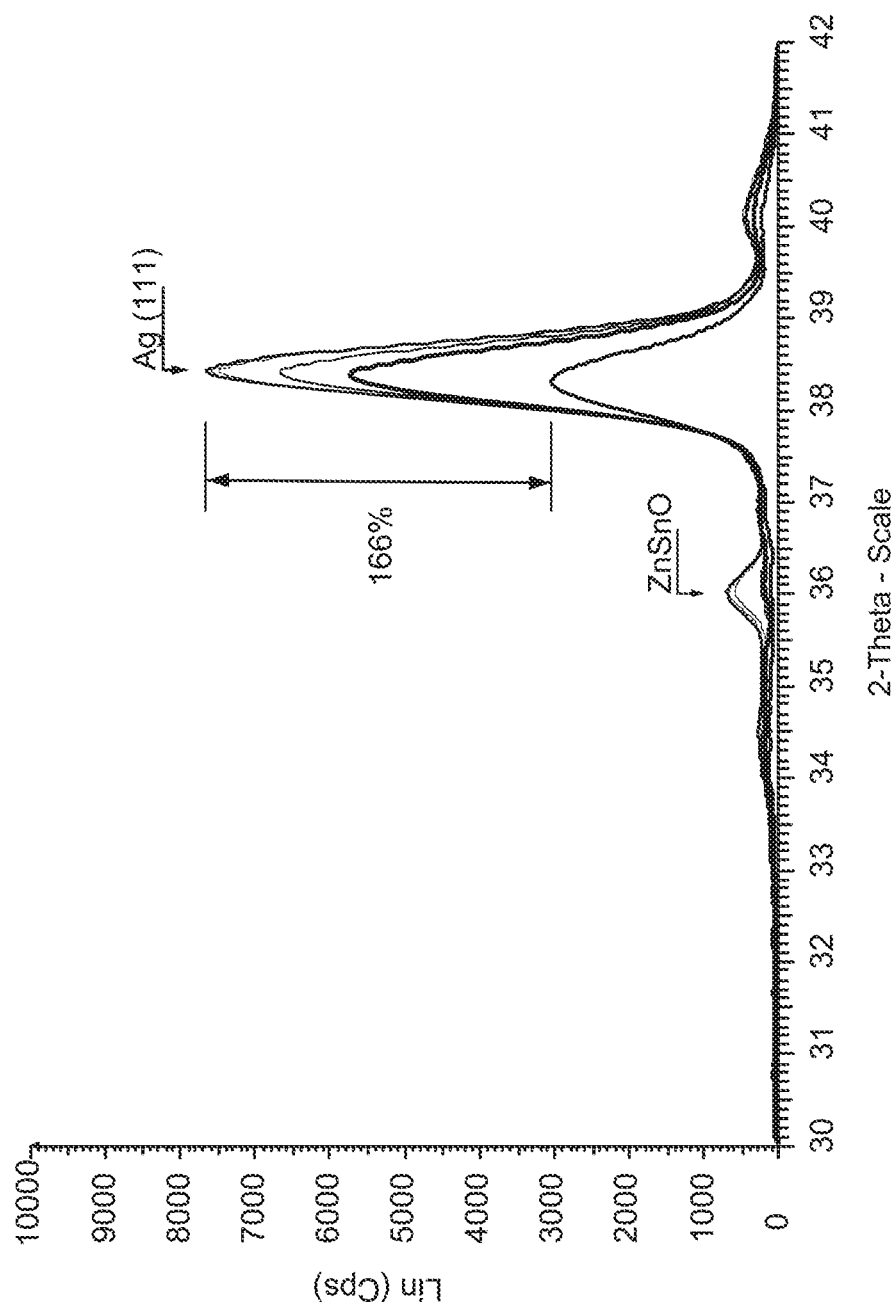

FIG. 23 is an XRD Lin (Cps) vs. 2-Theta-Scale graph illustrating, for the first Comparative Example (CE), the relative large 166% change in peak height of Ag (111) due to HT.

Figure 1B:
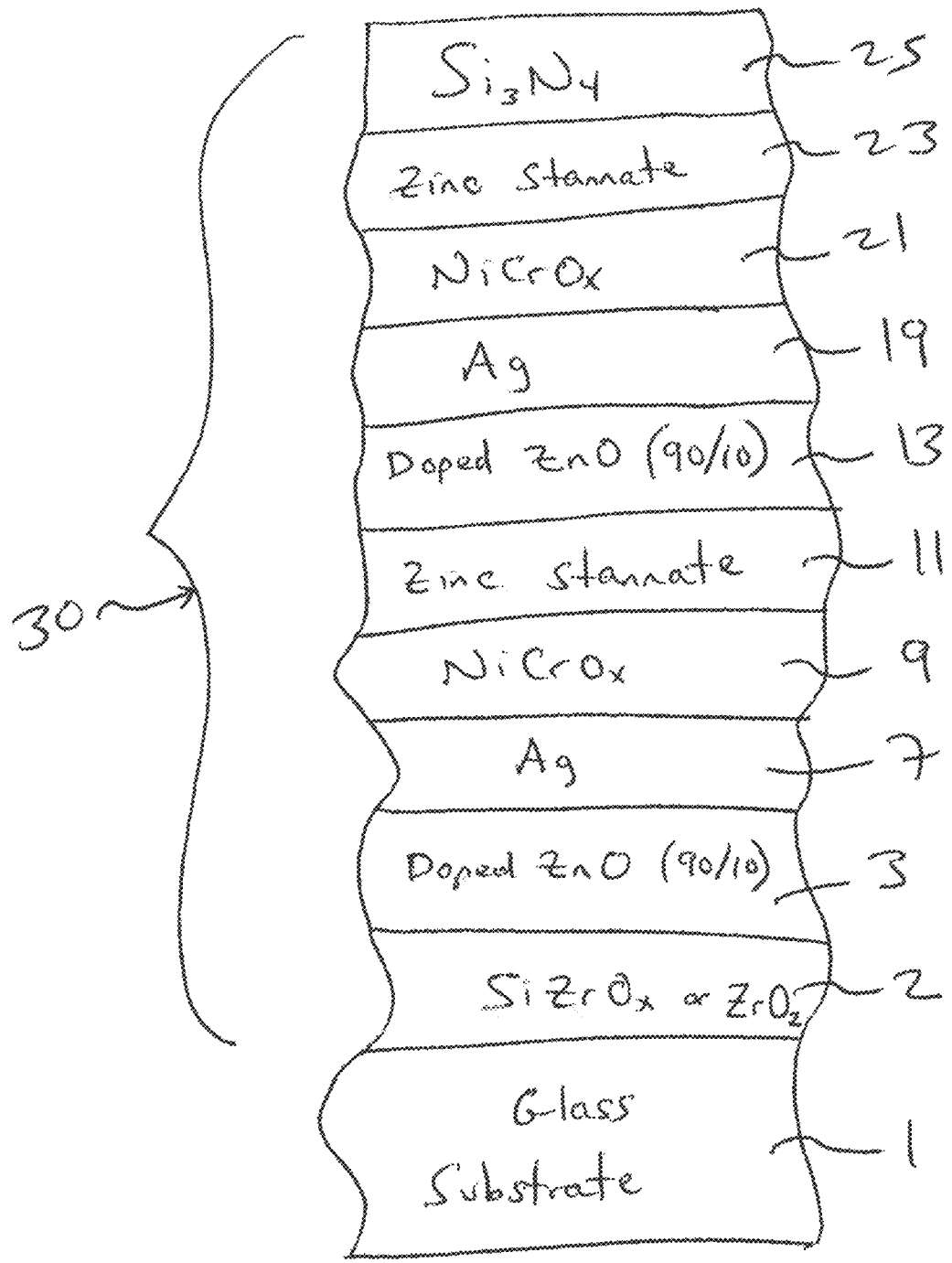
Figure 24:
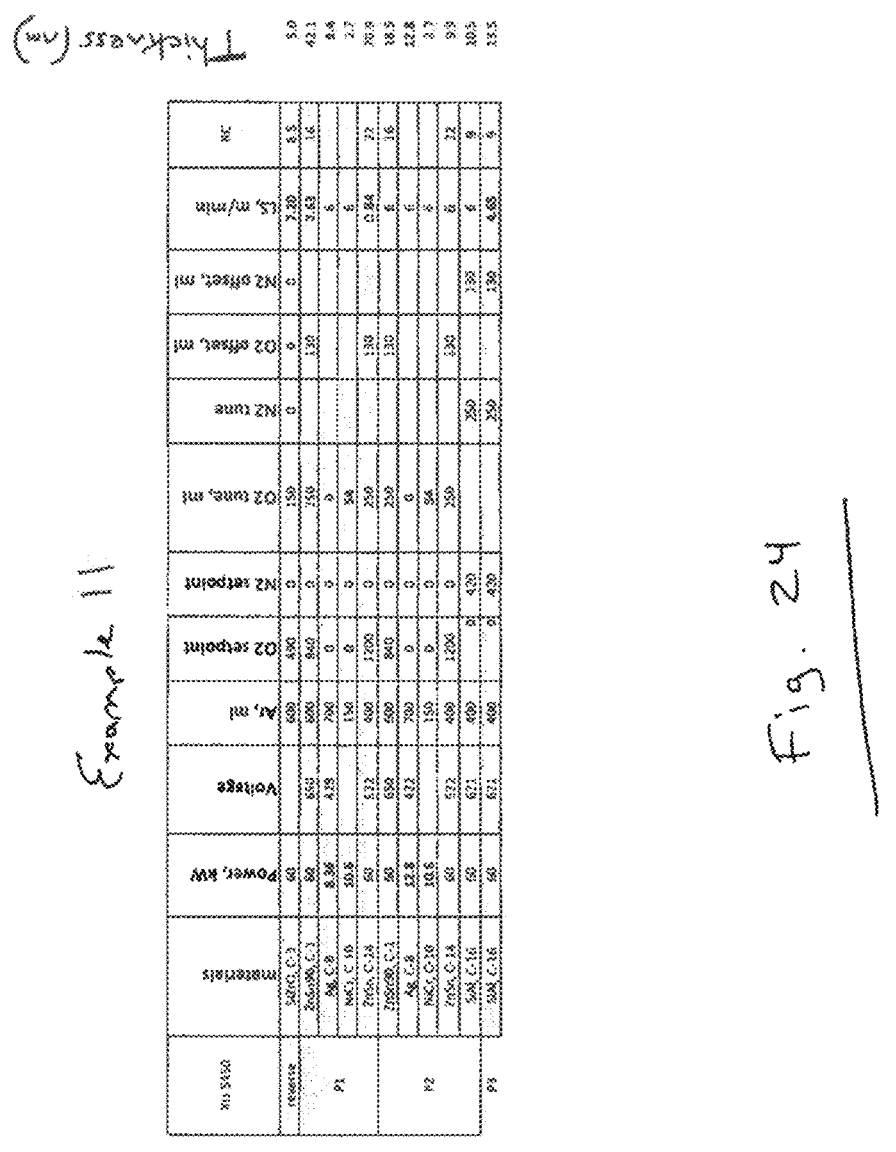

FIG. 24 is a chart illustrating sputter-deposition conditions for the sputter-deposition of the low-E coating of Example 11 on a 6 mm thick glass substrate, where the low-E coating is illustrated in general by FIG. 1(b).

FIG. 25 is a chart illustrating sputter-deposition conditions for the sputter-deposition of the low-E coating of Example 12 on a 6 mm thick glass substrate, where the low-E coating is illustrated in general by FIG. 1(b).

FIG. 26 is a chart illustrating sputter-deposition conditions for the sputter-deposition of the low-E coating of Example 13 on a 6 mm thick glass substrate, where the low-E coating is illustrated in general by FIG. 1(b).

FIG. 27 is a chart illustrating optical characteristics of Examples 11-13: as coated (annealed) before heat treatment in the left-most data column of each, after 12 minutes of heat treatment at 650 degrees C. (HT), after 16 minutes of HT at 650 degrees C. (HTX), and after 24 minutes of heat treatment at 650 degrees C. (HTXXX) in the far right data column of each.

FIG. 28 is a chart illustrating sputter-deposition conditions for the sputter-deposition of the low-E coating of Example 14 on a 6 mm thick glass substrate, where the low-E coating is illustrated in general by FIG. 1(b).

FIG. 29 is a chart illustrating optical characteristics of Example 14: as coated (annealed) before heat treatment in the left-most data column, after 12 minutes of heat treatment at 650 degrees C. (HT), after 16 minutes of HT at 650 degrees C. (HTX), and after 24 minutes of heat treatment at 650 degrees C. (HTXXX) in the far right data column.

FIG. 30 is chart illustrating sputter-deposition conditions for the sputter-deposition of the low-E coatings of Examples 15 and 16 on 6 mm thick glass substrates, where the low-E coatings of these examples are illustrated in general by FIG. 1(b) with a bottommost dielectric layer of $ZrO_2$.

FIG. 31 is a chart illustrating optical characteristics of Examples 15 and 16: as coated (annealed) before heat treatment in the left-most data column, after 12 minutes of heat treatment at 650 degrees C. (HT), and after 16 minutes of HT at 650 degrees C. (HTX) in the far right data column.

FIG. 32 is a chart illustrating sputter-deposition conditions for the sputter-deposition of the low-E coatings of Examples 17 and 18 on 6 mm thick glass substrates, where the low-E coatings of these examples are illustrated in general by FIG. 1(b) with a bottommost dielectric layer of $SiO_2$ doped with about 8% Al (wt. %) FIG. 33 is a chart illustrating optical characteristics of Examples 17 and 18: as coated (annealed) before heat treatment in the left-most data column, after 12 minutes of heat treatment at 650 degrees C. (HT), and after 16 minutes of HT at 650 degrees C. (HTX) in the far right data column.

FIG. 34 is chart illustrating sputter-deposition conditions for the sputter-deposition of the low-E coating of Comparative Example 2 (CE 2) on a 6 mm thick glass substrate.

FIG. 35 is a chart illustrating optical characteristics of Comparative Example 2 (CE 2): as coated (annealed) before heat treatment in the left-most data column, after 12 minutes of heat treatment at 650 degrees C. (HT), after 16 minutes of HT at 650 degrees C. (HTX), and after 24 minutes of heat treatment at 650 degrees C. (HTXXX) in the far right data column.

FIG. 36 illustrates at the top portion sputter-deposition conditions for the sputter-deposition of the low-E coating of Example 19 on a 6 mm thick glass substrate where the low-E coating is illustrated in general by FIG. 1(b), and at the bottom portion illustrates optical characteristics of Example 19: as coated (annealed; AC) before heat treatment, after 12 minutes of heat treatment at 650 degrees C. (HT), after 16 minutes of HT at 650 degrees C. (HTX), and after 24 minutes of heat treatment at 650 degrees C. (HTXXX).

Figure 1C:
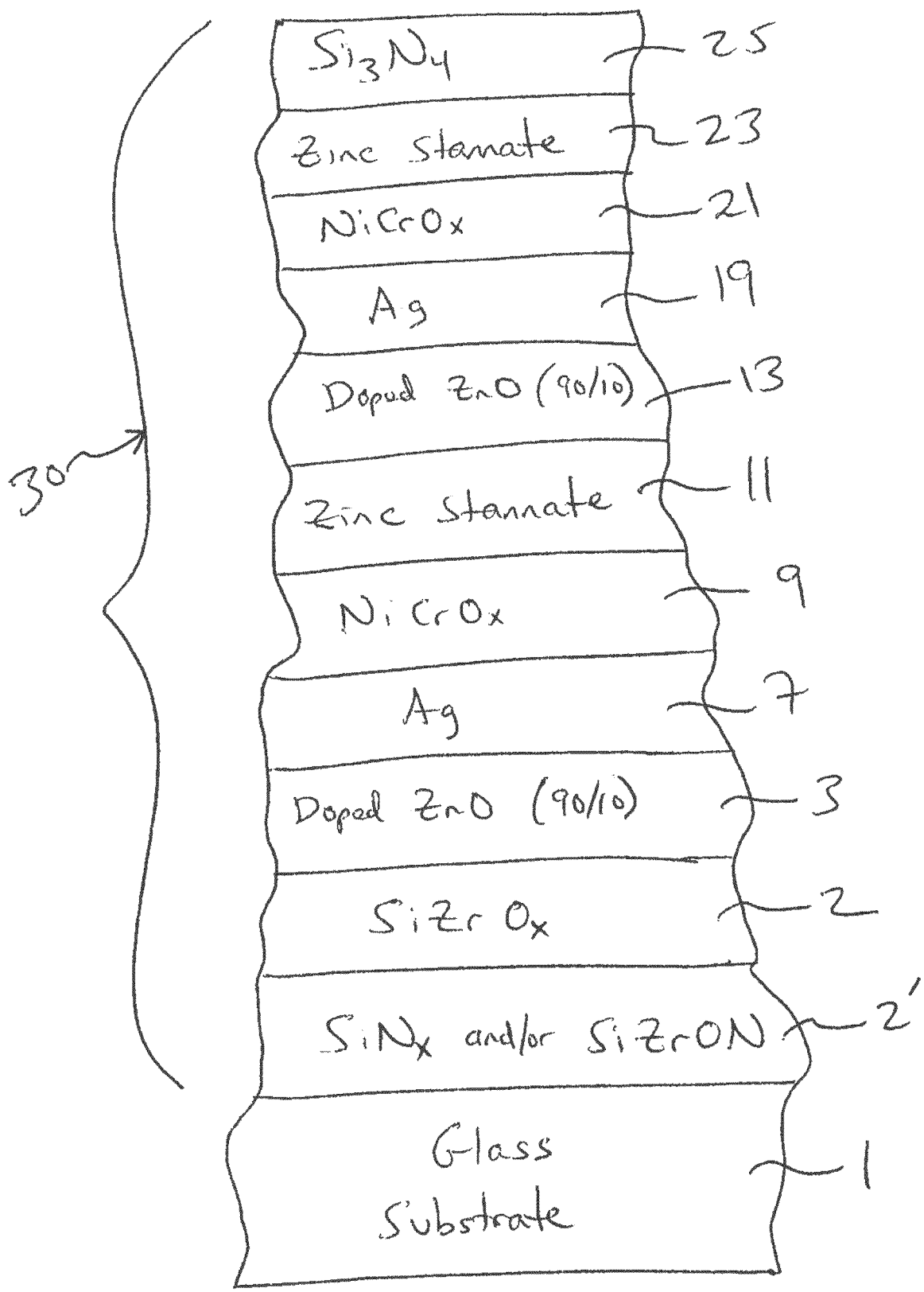
Figure 1:
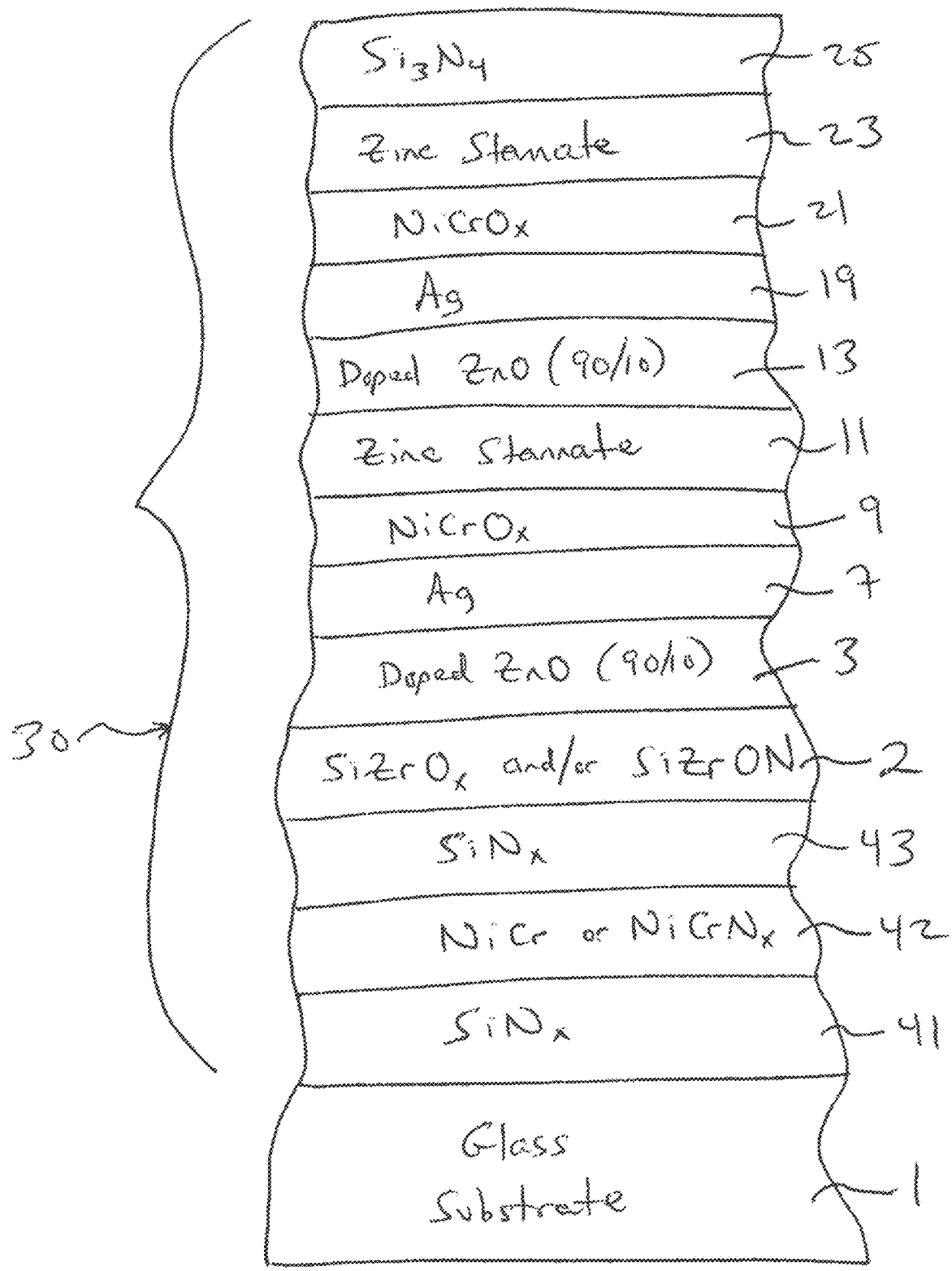
Figure 1E:
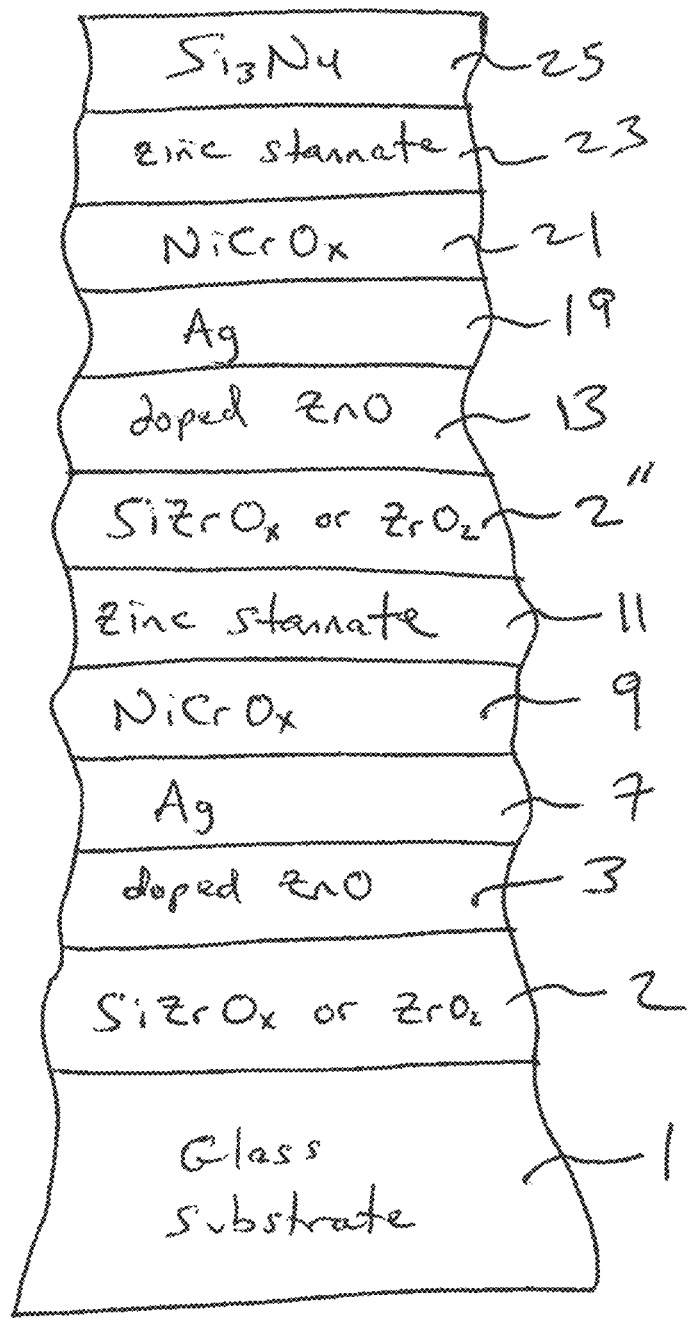

FIG. 37 illustrates at the top portion sputter-deposition conditions for the sputter-deposition of the low-E coating of Example 20 on a 6 mm thick glass substrate where the low-E coating is illustrated in general by FIG. 1(e), and at the bottom portion illustrates optical characteristics of Example 20: as coated (annealed; AC) before heat treatment, after 12 minutes of heat treatment at 650 degrees C. (HT), after 16 minutes of HT at 650 degrees C. (HTX), and after 24 minutes of heat treatment at 650 degrees C. (HTXXX).

FIG. 38 illustrates at the top portion sputter-deposition conditions for the sputter-deposition of the low-E coating of Example 21 on a 6 mm thick glass substrate where the low-E coating is illustrated in general by FIG. 1(e), and at the bottom portion illustrates optical characteristics of Example 21: as coated (annealed; AC) before heat treatment, after 12 minutes of heat treatment at 650 degrees C. (HT), after 16 minutes of HT at 650 degrees C. (HTX), and after 24 minutes of heat treatment at 650 degrees C. (HTXXX).

FIG. 39 illustrates at the top portion sputter-deposition conditions for the sputter-deposition of the low-E coating of Example 22 on a 6 mm thick glass substrate where the low-E coating is illustrated in general by FIG. 1(d), and at the bottom portion illustrates optical characteristics of Example 22: as coated (annealed; AC) before heat treatment, after 12 minutes of heat treatment at 650 degrees C. (HT), after 16 minutes of HT at 650 degrees C. (HTX), and after 24 minutes of heat treatment at 650 degrees C. (HTXXX).

Figure 1F:
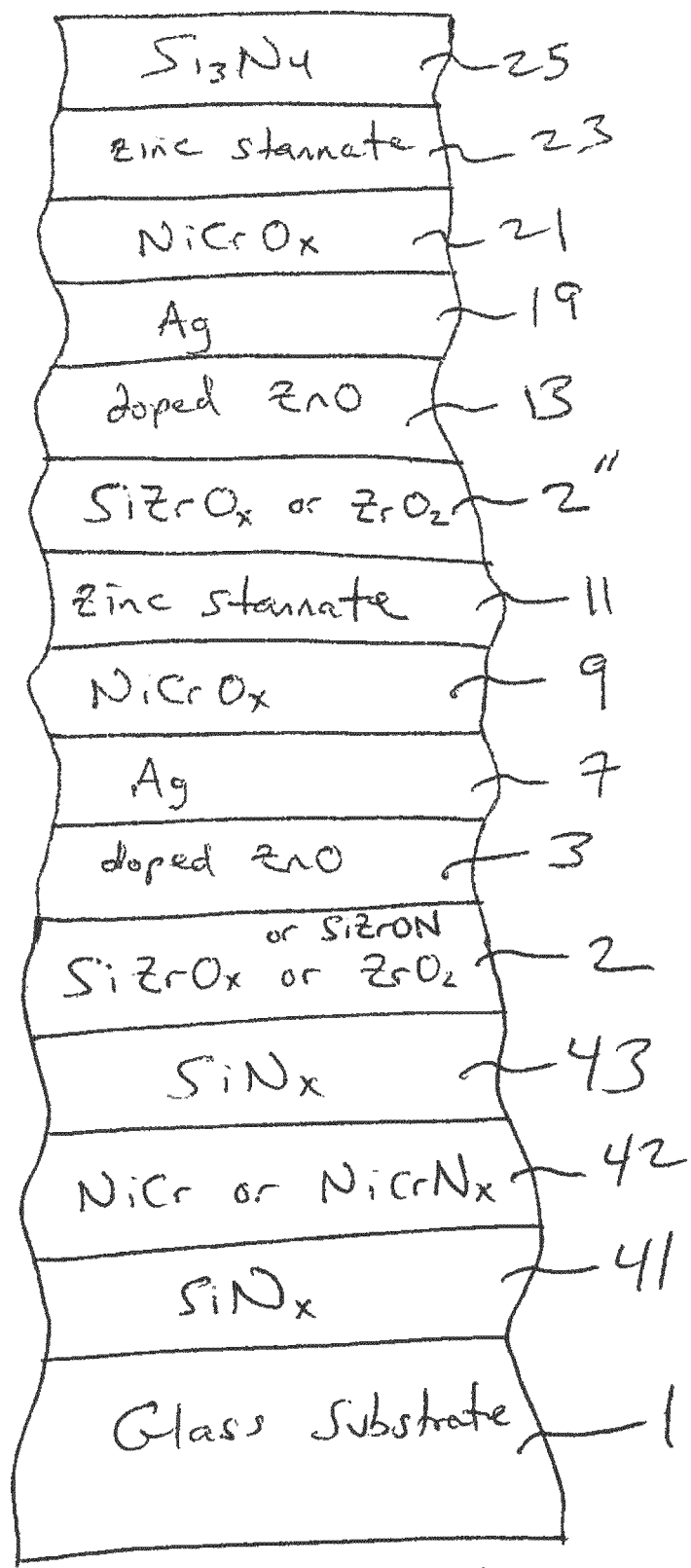

FIG. 40 illustrates at the top portion sputter-deposition conditions for the sputter-deposition of the low-E coating of Example 23 on a 6 mm thick glass substrate where the low-E coating is illustrated in general by FIG. 1(f), and at the bottom portion illustrates optical characteristics of Example 23: as coated (annealed; AC) before heat treatment, after 12 minutes of heat treatment at 650 degrees C. (HT), after 16 minutes of HT at 650 degrees C. (HTX), and after 24 minutes of heat treatment at 650 degrees C. (HTXXX).

FIG. 41 illustrates at the top portion sputter-deposition conditions for the sputter-deposition of the low-E coating of Example 24 on a 6 mm thick glass substrate where the low-E coating is illustrated in general by FIG. 1(f), and at the bottom portion illustrates optical characteristics of Example 24: as coated (annealed; AC) before heat treatment, after 12 minutes of heat treatment at 650 degrees C. (HT), after 16 minutes of HT at 650 degrees C. (HTX), and after 24 minutes of heat treatment at 650 degrees C. (HTXXX).

Figure 1G:
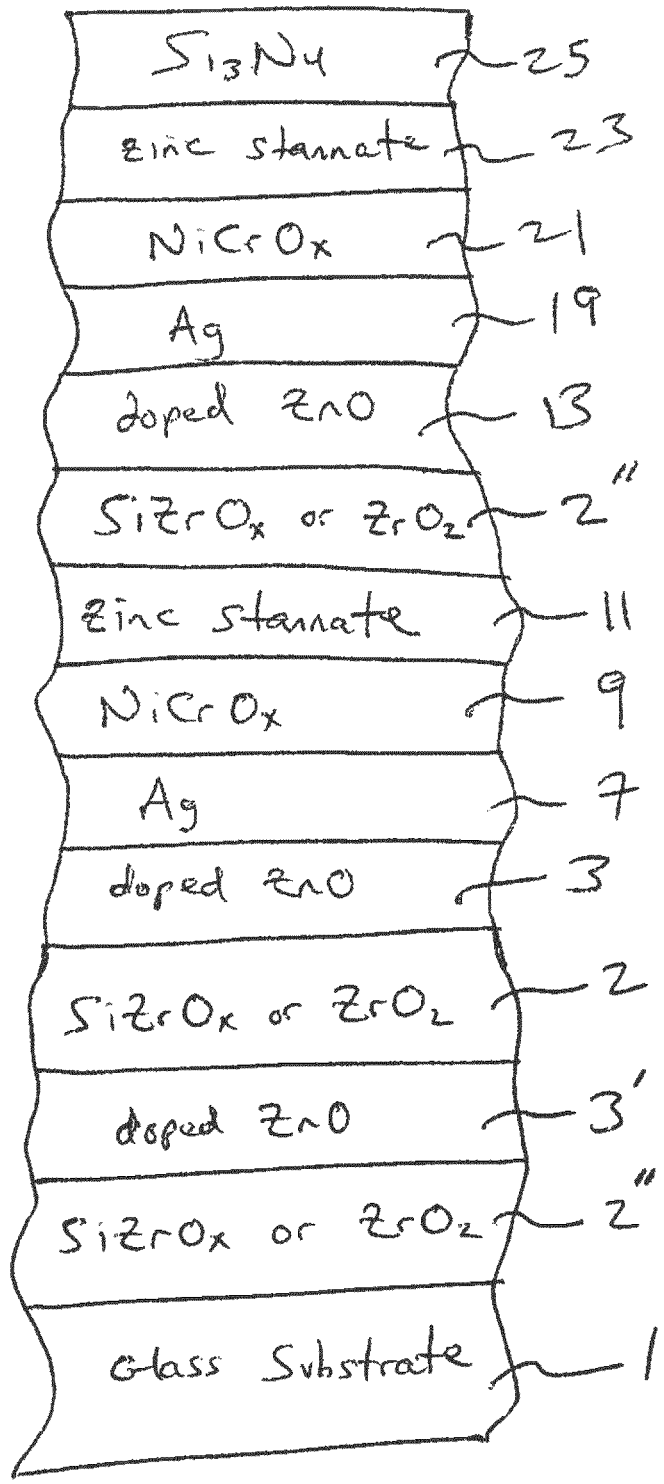

FIG. 42 illustrates at the top portion sputter-deposition conditions for the sputter-deposition of the low-E coating of Example 25 on a 6 mm thick glass substrate where the low-E coating is illustrated in general by FIG. 1(g), and at the bottom portion illustrates optical characteristics of Example 25: as coated (annealed; AC) before heat treatment, after 12 minutes of heat treatment at 650 degrees C. (HT), after 16 minutes of HT at 650 degrees C. (HTX), and after 24 minutes of heat treatment at 650 degrees C. (HTXXX).

Figure 1H:
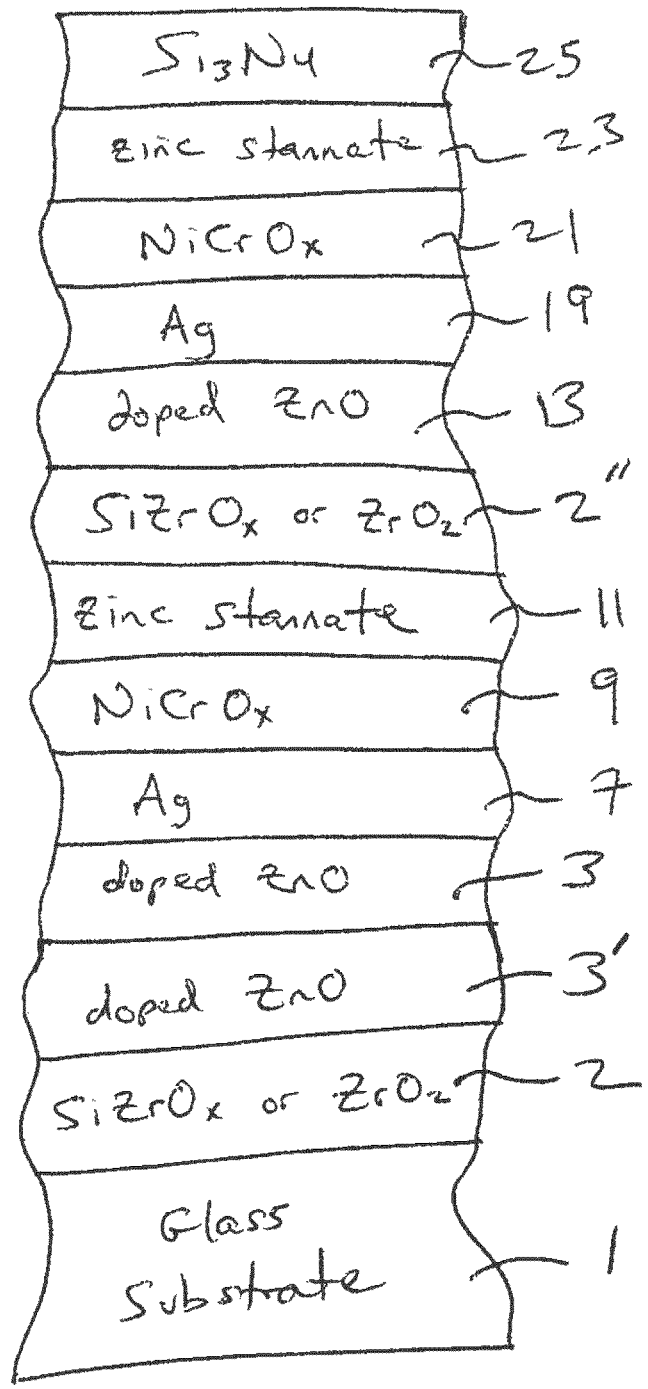

FIG. 43 illustrates at the top portion sputter-deposition conditions for the sputter-deposition of the low-E coating of Example 26 on a 6 mm thick glass substrate where the low-E coating is illustrated in general by FIG. 1(h), and at the bottom portion illustrates optical characteristics of Example 26: as coated (annealed; AC) before heat treatment, after 12 minutes of heat treatment at 650 degrees C. (HT), after 16 minutes of HT at 650 degrees C. (HTX), and after 24 minutes of heat treatment at 650 degrees C. (HTXXX).

FIG. 44 illustrates at the top portion sputter-deposition conditions for the sputter-deposition of the low-E coating of Example 27 on a 6 mm thick glass substrate where the low-E coating is illustrated in general by FIG. 1(b), and at the bottom portion illustrates optical characteristics of Example 27: as coated (annealed; AC) before heat treatment, after 12 minutes of heat treatment at 650 degrees C. (HT), after 16 minutes of HT at 650 degrees C. (HTX), and after 24 minutes of heat treatment at 650 degrees C. (HTXXX).

FIG. 45 illustrates at the top portion sputter-deposition conditions for the sputter-deposition of the low-E coating of Example 28 on a 6 mm thick glass substrate where the low-E coating is illustrated in general by FIG. 1(e), and at the bottom portion illustrates optical characteristics of Example 28: as coated (annealed; AC) before heat treatment, after 12 minutes of heat treatment at 650 degrees C. (HT), after 16 minutes of HT at 650 degrees C. (HTX), and after 24 minutes of heat treatment at 650 degrees C. (HTXXX).

FIG. 46 illustrates at the top portion sputter-deposition conditions for the sputter-deposition of the low-E coating of Example 29 on a 6 mm thick glass substrate where the low-E coating is illustrated in general by FIG. 1(h) except that no layer 2" is provided in Example 29, and at the bottom portion illustrates optical characteristics of Example 29: as coated (annealed; AC) before heat treatment, after 12 minutes of heat treatment at 650 degrees C. (HT), after 16 minutes of HT at 650 degrees C. (HTX), and after 24 minutes of heat treatment at 650 degrees C. (HTXXX).

Figure 1I:
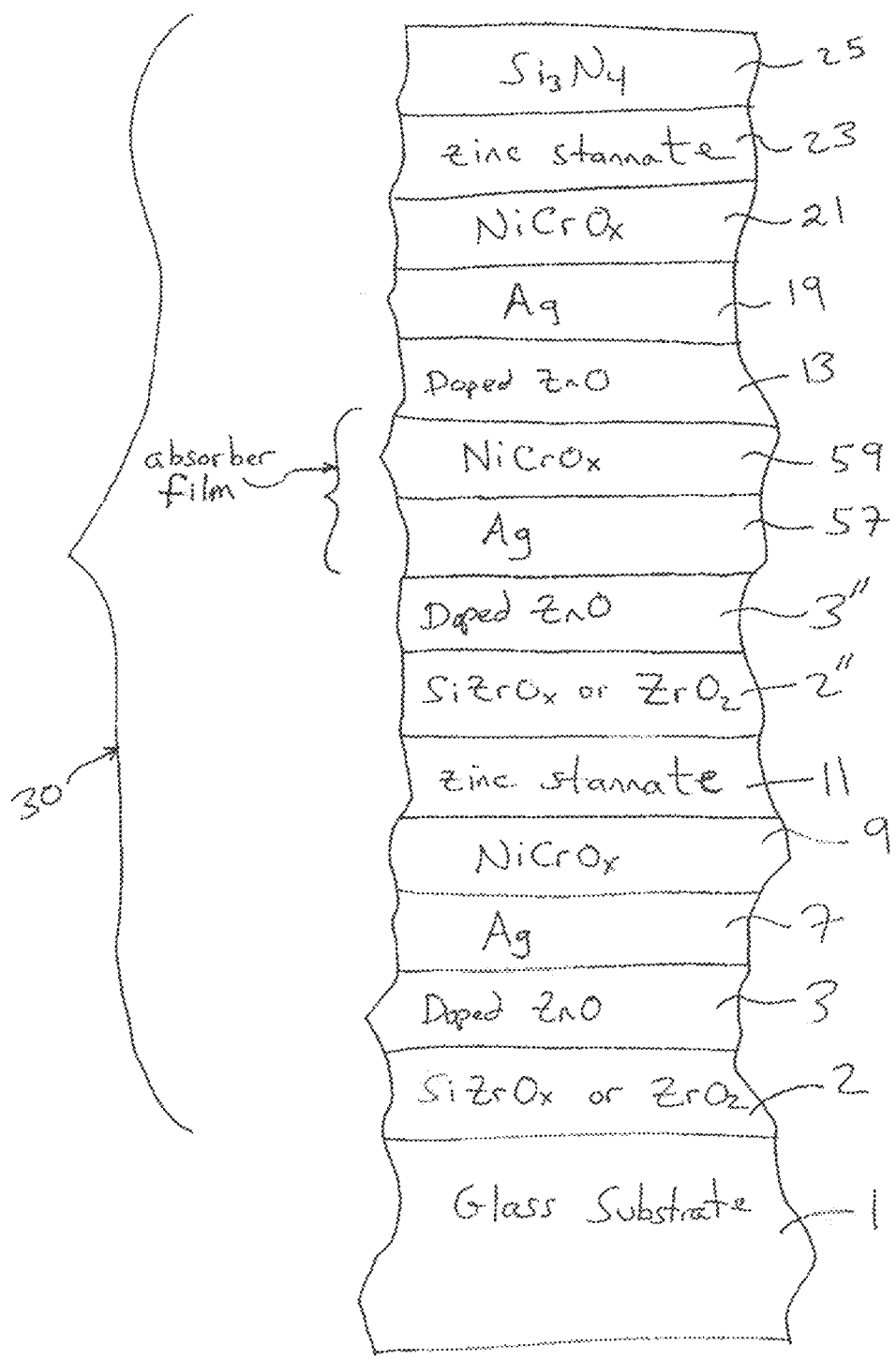

FIG. 47 illustrates at the top portion sputter-deposition conditions for the sputter-deposition of the low-E coating of Example 30 on a 6 mm thick clear glass substrate where the low-E coating is illustrated in general by FIG. 1(i); and at the bottom portion illustrates optical characteristics of Example 30 measured monolithically as coated (annealed; AC) before heat treatment, after 12 minutes of heat treatment at 650 degrees C. (HT), and after 16 minutes of HT at 650 degrees C. (HTX).

FIG. 48 illustrates at the top portion sputter-deposition conditions for the sputter-deposition of the low-E coating of Example 31 on a 6 mm thick clear glass substrate where the low-E coating is illustrated in general by FIG. 1(i); and at the bottom portion illustrates optical characteristics of Example 31 measured monolithically as coated (annealed; AC) before heat treatment, after 12 minutes of heat treatment at 650 degrees C. (HT), and after 16 minutes of HT at 650 degrees C. (HTX).

FIG. 49 illustrates at the top portion sputter-deposition conditions for the sputter-deposition of the low-E coating of Example 32 on a 6 mm thick clear glass substrate where the low-E coating is illustrated in general by FIG. 1(i); and at the bottom portion illustrates optical characteristics of Example 32 measured monolithically as coated (annealed; AC) before heat treatment, after 12 minutes of heat treatment at 650 degrees C. (HT), and after 16 minutes of HT at 650 degrees C. (HTX).

FIG. 50 illustrates at the top portion sputter-deposition conditions for the sputter-deposition of the low-E coating of Example 33 on a 6 mm thick clear glass substrate where the low-E coating is illustrated in general by FIG. 1(i); and at the bottom portion illustrates optical characteristics of Example 33 measured monolithically as coated (annealed; AC) before heat treatment, after 12 minutes of heat treatment at 650 degrees C. (HT), and after 16 minutes of HT at 650 degrees C. (HTX).

Figure 51:
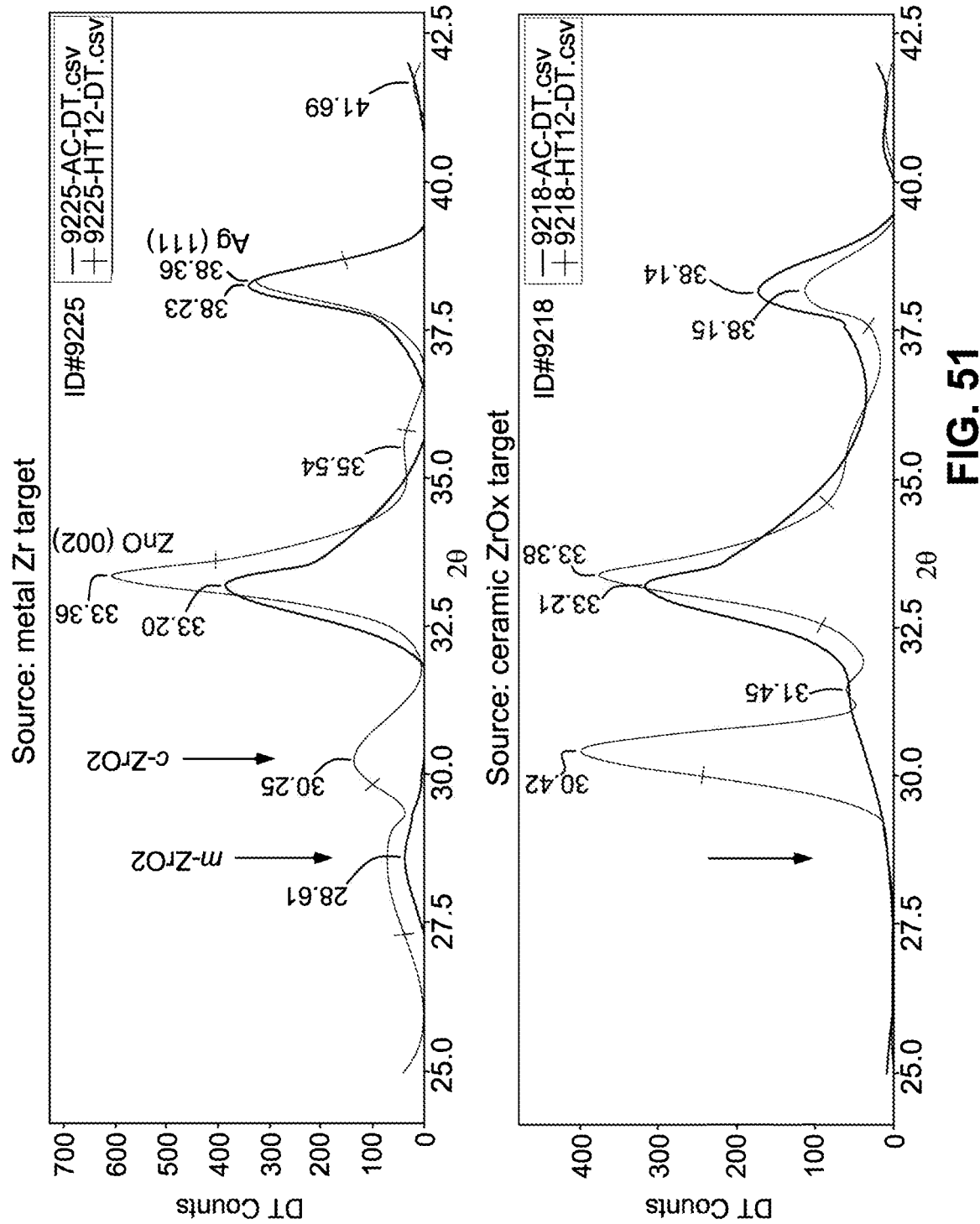

FIG. 51 illustrates graphs for sputter-depositing a $ZrO_2$ layer using a metal Zr target (upper graph) and a ceramic ZrOx target (lower graph), before and after HT, and shows that the layer comprises a monoclinic phase (see the peak at m-$ZrO_2$) when the metal target was used, but not when the ceramic target was used in this particular instance.

Figure 52:
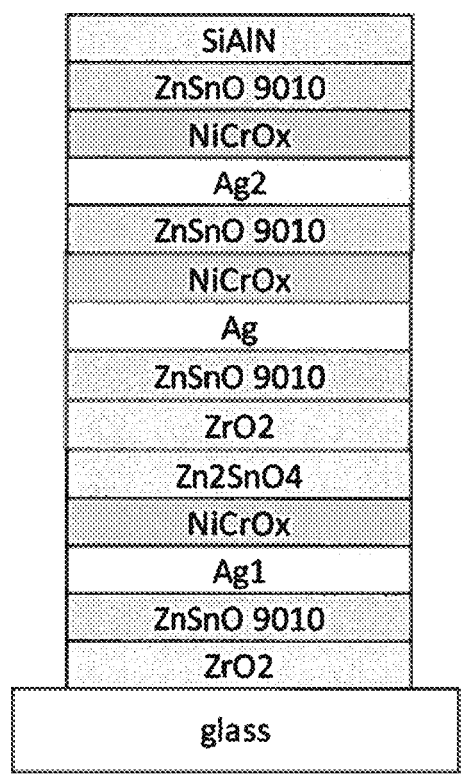

FIG. 52 is a cross sectional view of coated articles according to example embodiments of this invention, similar to FIG. 1(i) in certain respects, including the layer stack for Examples 34-42 and Comparative Examples (CEs) 43-47.

Figure 53:
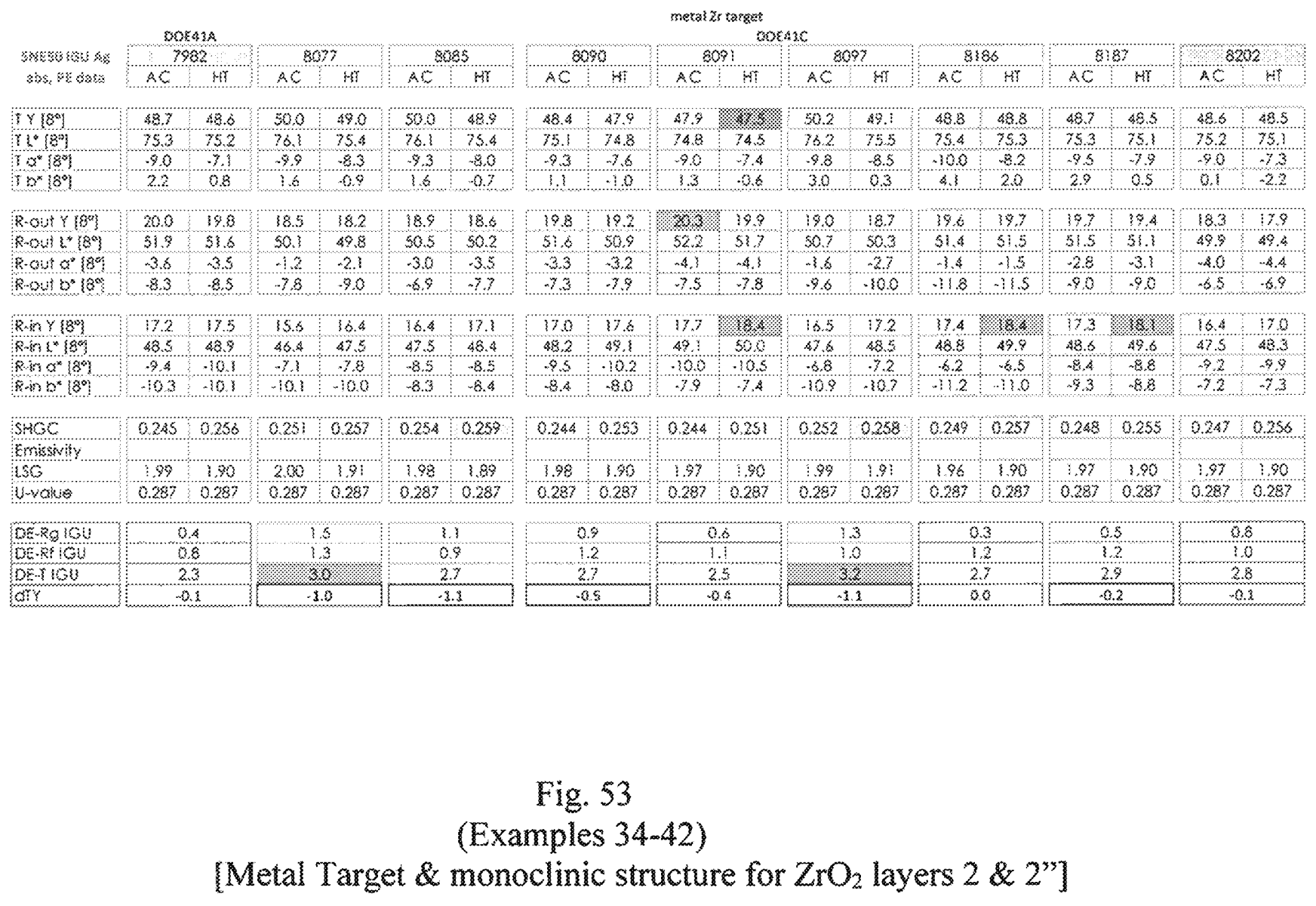

FIG. 53 illustrates the optical data of Examples 34-42 as coated (AC; annealed) before heat treatment in the left-most data column of each example, and after 12 minutes of heat treatment at 650 degrees C. (HT) in the right data column of each example, Examples 34-42 having a coating stack as shown in FIG. 1(i) and FIG. 52 with monoclinic $ZrO_2$ layers deposited with metal target, and layer thicknesses for Examples 34-42 as shown in FIG. 55; where sample 7982 is Example 34, sample 8077 is Example 35, sample 8085 is Example 36, sample 8090 is Example 37, sample 8091 is Example 38, sample 8097 is Example 39, sample 8186 is Example 40, sample 8187 is Example 41, and sample 8202 is Example 42.

FIG. 54 illustrates the optical data of Comparative Examples (CEs) 43-47 as coated (AC; annealed) before heat treatment in the left-most data column of each example, and after 12 minutes of heat treatment at 650 degrees C. (HT) in the right data column of each example, Examples 43-47 having a coating stack as shown in FIG. 1(i) and FIG. 52 with non-monoclinic $ZrO_2$ layers deposited with ceramic target, and layer thicknesses for Examples 43-47 as shown in FIG. 56; where sample 8392 is CE 43, sample 8394 is CE 44, sample 8395 is CE 45, sample 8396 is CE 46, and sample 8397 is CE 47.

FIG. 55 is a chart illustrating deposition process conditions and layer thicknesses for Example 37 having monoclinic $ZrO_2$ layers, with total oxygen flow (ml) during the sputtering process for each layer indicated by the sum of $O_2$ setpoint, $O_2$ tune, and $O_2$ offset, with the high oxygen gas flow during sputter-deposition of the $ZrO_2$ layers helping provide the monoclinic phase of the $ZrO_2$ layers of Example 37 (monoclinic Examples 34-36 and 38-42 had similar process conditions).

FIG. 56 is a chart illustrating deposition process conditions and layer thicknesses for Comparative Example (CE) 44 having non-monoclinic $ZrO_2$ layers, with total oxygen flow (ml) during the sputtering process for each layer indicated by the sum of $O_2$ setpoint, $O_2$ tune, and $O_2$ offset, with the low oxygen gas flow during sputter-deposition of the $ZrO_2$ layers together with ceramic target helping provide the non-monoclinic phase of the $ZrO_2$ layers of Example 44 (non-monoclinic Examples 43 and 45-47 had similar process conditions).

FIG. 57 is a chart illustrating deposition process conditions and layer thicknesses for Example 48 having a monoclinic $ZrO_2$ layer deposited via a ceramic target.

FIG. 58 is a chart illustrating $\Delta E^*$ values for Example 48, with different heat treatment times.

FIG. 59 is a chart illustrating optical data and sheet resistance data for coatings of Example 48.

DETAILED DESCRIPTION OF CERTAIN EXEMPLARY EMBODIMENTS OF THE INVENTION

Referring now more particularly to the accompanying drawings in which like reference numerals indicate like parts/layers/materials throughout the several views.

Certain embodiments of this invention provide a coating or layer system that may be used in coated articles that may be used monolithically for windows, in insulating glass (IG) window units (e.g., on surface #2 or surface #3 in IG window unit applications), laminated window units, vehicle windshields, and/or other vehicle or architectural or residential window applications. Certain embodiments of this invention provide a layer system that combines one or more of high visible transmission, good durability (mechanical and/or chemical) before and/or after HT, and good color stability upon heat treatment. It will be shown herein how certain layers stacks surprisingly enable this unique combination.

With regard to color stability, certain embodiments of this invention have excellent color stability (i.e., a low value of $\Delta E^*$; where A is indicative of change in view of heat treatment) with heat treatment (e.g., thermal tempering or heat bending) monolithically and/or in the context of dual pane environments such as IG units or windshields. Such heat treatments (HTs) often necessitate heating the coated substrate to temperatures of at least about 1100° F. (593° C.) and up to 1450° F. (788° C.) [more preferably from about 1100 to 1200 degrees F., and most preferably from 1150-1200 degrees F.] for a sufficient period of time to insure the end result (e.g., tempering, bending, and/or heat strengthening). Certain embodiments of this invention combine one or more of (i) color stability with heat treatment, and (ii) the use of a silver inclusive layer for selective IR reflection.

Example embodiments of this invention relate to low-E coated articles that have approximately the same color characteristics as viewed by the naked eye both before and after heat treatment (e.g., thermal tempering), and corresponding methods. Such articles may in certain example embodiments combine one or more of: (1) desirable visible transmission characteristics, (2) good durability before and/or after heat treatment, (3) a low $\Delta E^*$ value which is indicative of color stability upon heat treatment (HT), and/or (4) an absorber film designed to adjust visible transmission and provide desirable coloration for the coated article, while maintaining durability and/or thermal stability.

In certain example embodiments, the absorber film may be a multi-layer absorber film including a first layer 57 of or including silver (Ag), and a second layer 59 of or including NiCr which may be partially or fully oxidized (NiCrO$_x$). See FIG. 1(i) for example. Such a multi-layer absorber film 57, 59 may thus, in certain example embodiments, be made up of a layer sequence of Ag/NiCrO$_x$. Elements from one layer may diffuse into an adjacent layer due to HT or other factors. The NiCr based layer 59 of the absorber may be initially deposited in metallic form, or as a suboxide, in certain example embodiments. The silver based layer 57 may be a continuous layer, and/or may optionally be doped, in certain example embodiments. Moreover, the silver based layer 57 of the absorber film is preferably sufficiently thin so that its primary function is to absorb visible light and provide desirable coloration (as opposed to being much thicker and primarily function as an IR reflection layer). The NiCr or NiCrO$_x$ 59 is provided over and contacting the silver 57 of the absorber film in order to protect the silver, and also to contribute to absorption. In certain example embodiments, the silver based layer 57 of the absorber film may be no more than about 60 Å thick, more preferably no more than about 30 Å thick, more preferably no greater than about 20 Å thick, and most preferably no greater than about 15 Å thick, and possibly no greater than about 12 Å thick, in certain example embodiments of this invention. In certain example embodiments, the NiCr based layer 59 of the absorber film may be from about 5-200 Å thick, more preferably from about 10-110 Å thick, and most preferably from about 40-90 Å thick.

A single layer of NiCr (or other suitable material) may also be used as an absorber film in low-E coatings in certain example embodiments of this invention. For example, see absorber film 42 in FIGS. 1(d) and 1(f). However, it has surprisingly been found that using silver 57 in an absorber film (single layer, or multi-layer, absorber film) provides for several unexpected advantages compared to a single layer of NiCr as the absorber. First, it has been found that a single layer of NiCr as the absorber tends to cause yellowish coloration in certain low-E coating coated articles, which may not be desirable in certain instances. In contrast, it has been surprisingly found that using silver 57 in an absorber films tends to avoid such yellowish coloration and/or instead provide for more desirable neutral coloration of the resulting coated article. Thus, the use of silver 57 in an absorber film has been found to provide for improved optical characteristics. Second, the use of a single layer of NiCr 42 as the absorber tends to also involve providing silicon nitride based layers on both sides of the NiCr so as to directly sandwich and contact the NiCr therebetween. For example, see FIGS. 1(d) and 1(f). It has been found that the provision of silicon nitride in certain locations in a coating stack may lead to compromised thermal stability upon HT. In contrast, it has been surprisingly found that when using silver in an absorber film a pair of immediately adjacent silicon nitride layers are not needed, so that thermal stability upon HT may be improved. Thus, the use of silver 57 in an absorber film has been found to provide for improved thermal stability including lower $\Delta E^*$ values and therefor improved matchability between HT and non-HT versions of the same coating. The use of silver in an absorber film may also provide for improved manufacturability in certain situations.

Surprisingly, and unexpectedly, it has been found that the provision of an as-deposited crystalline or substantially crystalline layer 3, 3" (and/or 13) (e.g., at least 50% crystalline, more preferably at least 60% crystalline) of or including zinc oxide, doped with at least one dopant (e.g., Sn), immediately under and directly contacting an infrared (IR) reflecting layer of or including silver 7 (and/or 19) in a low-E coating 30 has the effect of significantly improving the coating's thermal stability (i.e., lowering the $\Delta E^*$ value). "Substantially crystalline" as used herein means at least 50% crystalline, more preferably at least 60% crystalline, and most preferably at least 70% crystalline. One or more such crystalline, or substantially crystalline, layers 3, 3" 13 may be provided under one or more corresponding IR reflecting layers comprising silver 7, 19, in various example embodiments of this invention. Thus, the crystalline or substantially crystalline layer 3 (or 3") and/or 13 of or including zinc oxide, doped with at least one dopant (e.g., Sn), immediately under an infrared (IR) reflecting layer 7 and/or 19 of or including silver may be used in single silver low-E coatings, double-silver low-E coatings (e.g., such as shown in FIG. 1 or FIG. 20), or triple silver low-E coatings in various embodiments of this invention. In certain example embodiments, the crystalline or substantially crystalline layer 3 and/or 13 of or including zinc oxide is doped with from about 1-30% Sn, more preferably from about 1-20% Sn, more preferably from about 5-15% Sn, with an example being about 10% Sn (in terms of wt. %). The zinc oxide, doped with Sn, is in a crystallized or substantially crystallized phase (as opposed to amorphous or nanocrystalline) in layer 3 and/or 13 as deposited, such as via sputter deposition techniques from at least one sputtering target(s) of or including Zn and Sn. The crystallized phase of the doped zinc oxide based layer 3 and/or 13 as deposited, combined with the layer(s) between the silver 7 and/or 19 and the glass 1, allows the coated article to realize improved thermal stability upon optional HT (lower the $\Delta E^*$ value). It is believed that the crystallized phase of the doped zinc oxide based layer 3 and/or 13 as deposited, combined with the layer(s) between the silver and the glass, allows the silver 7 and/or 19 deposited thereover to have improved crystal structure with texture but with some randomly oriented grains so that its refractive index (n) changes less upon optional HT, thereby allowing for improved thermal stability to be realized.

It has also been surprisingly and unexpectedly found that the provision of a dielectric layer(s) (e.g., 2 and/or 2") of or including silicon oxide, zirconium oxide, silicon zirconium oxide and/or silicon zirconium oxynitride (e.g., SiZrO$_x$, ZrO$_2$, SiO$_2$, and/or SiZrO$_x$N$_y$) also provides for improved thermal stability of the coated article as shown for example in FIGS. 1(b)-1(i), and thus lower the $\Delta E^*$ values upon heat treatment (HT) such as thermal tempering. In certain example embodiments, at least one dielectric layer (e.g., 2 and/or 2") of or including silicon oxide, zirconium oxide, silicon zirconium oxide and/or silicon zirconium oxynitride (e.g., SiZrO$_x$, ZrO$_2$, SiO$_2$, and/or SiZrO$_x$N$_y$) may be provided: (i) in the bottom dielectric portion of the coating under all silver based IR reflecting layer(s) (e.g., see FIGS. 1(b)-1(i)), and/or (ii) in a middle dielectric portion of the coating between a pair of silver based IR reflecting layers (e.g., see FIGS. 1(e)-1(i)). For example, the dielectric layer (e.g., 2 and/or 2") of or including silicon oxide, zirconium oxide, silicon zirconium oxide and/or silicon zirconium oxynitride may be provided directly under and contacting the lowermost doped zinc oxide based layer (e.g., 3) in certain example embodiments of this invention, and/or between a pair of zinc oxide inclusive layers (e.g., between 11 and 13, or between 11 and 3") in a middle dielectric portion of the low-E coating.

The dielectric layer(s) (e.g., 2 and/or 2") of or including silicon oxide (e.g., $SiO_2$), zirconium oxide (e.g., $ZrO_2$), silicon zirconium oxide and/or silicon zirconium oxynitride may or may not be provided in combination with an as-deposited crystalline or substantially crystalline (e.g., at least 50% crystalline, more preferably at least 60% crystalline) layer(s) (e.g., 3 and/or 13) of or including zinc oxide, doped with at least one dopant (e.g., Sn), immediately under an infrared (IR) reflecting layer, in various example embodiments of this invention. Both approaches, which may be used together, but need not be used together, improve thermal stability thereby lowering $\Delta E^*$ values. For example, in certain embodiments where the dielectric layer(s) (e.g., 2 and/or 2") of or including silicon oxide (e.g., $SiO_2$), zirconium oxide (e.g., $ZrO_2$), silicon zirconium oxide and/or silicon zirconium oxynitride is used, the contact/seed layer immediately under one or both silver(s) may be of or including zinc oxide doped with aluminum (instead of with Sn) and that contact/seed layer need not be crystalline (e.g., see FIGS. 42, 43 and 46; and Examples 25, 26 and 29).

In certain example embodiments, it has surprisingly and unexpectedly been found that initially sputter-depositing the dielectric layer(s) 2 and/or 2" of or including zirconium oxide, zirconium oxynitride, silicon zirconium oxide and/or silicon zirconium oxynitride (e.g., $SiZrO_x$, $ZrO_2$, $SiO_2$, and/or $SiZrO_xN_y$) so as to comprise a monoclinic phase crystalline structure is advantageous in that it results in improved thermal stability (lower $\Delta E^*$ value) and/or reduced change in visible transmission (e.g., $T_{vis}$ or TY) of the coated article upon heat treatment (HT). For example, see FIGS. 1(a)-1(i), 51-53, and 55. The dielectric layer(s) 2 and/or 2" may, in certain example embodiments, further include other material(s) such as Ti and/or Nb. In certain example embodiments, the monoclinic phase (e.g., see the m-$ZrO_2$ peaks in the upper graph of FIG. 51) for the dielectric layer (e.g., $ZrO_2$) 2 and/or 2" may be achieved by using a very high oxygen gas flow for that layer during the sputter-deposition process of that layer, and using a metallic sputtering target (e.g., metal Zr or SiZr target) (e.g., see FIG. 55). It is noted that such high oxygen gas flows desired in certain example embodiments of this case are counterintuitive for zirconium oxide based layers, and conventionally undesirable, because they reduce deposition rates and thus created added time and expense in making coated articles. It has been found that a significant partial or full phase change away from monoclinic phase (see m-$ZrO_2$ peaks in the upper graph of FIG. 51) to tetragonal or cubic crystalline structure (see c-$ZrO_2$ in FIG. 51), and corresponding density change, of the layer 2 and/or 2" upon HT tends to compensate for change in crystalline structure of the silver based layer(s) 7, 57, and/or 19 upon said HT, which appears to result in improved thermal stability (lower $\Delta E^*$ value) and/or reduced change in visible transmission (e.g., $T_{vis}$ or TY) of the coated article upon HT. In FIG. 51, note how the monoclinic phase (see m-$ZrO_2$ peaks in upper graph of in FIG. 51) exists in the top graph (high oxygen flow during deposition, and metal Zr target), but does not exist in the bottom graph (low oxygen flow during deposition, and ceramic ZrOx target). And, also in the top graph of FIG. 51, it can be seen how the monoclinic phase (see m-$ZrO_2$ peaks) is higher before HT, and lower after HT. It has been surprisingly found that initially sputter-depositing the dielectric layer(s) 2 and/or 2" of or including zirconium oxide, zirconium oxynitride, silicon zirconium oxide and/or silicon zirconium oxynitride (e.g., $SiZrO_x$, $ZrO_2$, $SiO_2$, and/or $SiZrO_xN_y$) so as to comprise a monoclinic phase crystalline structure is advantageous in that it results in a high density change in the layer 2 and/or 2" of at least about 0.25 g/cm$^3$, more preferably of at least about 0.30 g/cm$^3$, and most preferably of at least about 0.35 g/cm$^3$ (e.g., from about 5.7 to about 6.1 g/cm$^3$), due to HT which in turn compensates for change in crystalline structure of the silver based layer(s) 7, 19, and/or 57 due to said HT, resulting in improved thermal stability (lower $\Delta E^*$ value) and/or reduced change in visible transmission ($T_{vis}$ or TY) of the coated article upon heat treatment (HT). In certain example embodiments, this allows for reduced change in visible transmission ($T_{vis}$ or TY) of the coated article of no more than 1.2%, more preferably no more than 1.0%, and most preferably no more than 0.5%, due to HT, and/or a reduced $\Delta E^*$ value.

It has also surprisingly been found that increased thicknesses for the dielectric layer(s) 2 and/or 2" of or including silicon oxide, zirconium oxide, zirconium oxynitride, silicon zirconium oxide and/or silicon zirconium oxynitride (e.g., $SiZrO_x$, $ZrO_2$, $SiO_2$, and/or $SiZrO_xN_y$) tend to result in smaller changes in sheet resistance ($R_s$) and visible transmission upon HT, and thus lower $\Delta E^*$ values of the coated article. In certain example embodiments, one or both of the dielectric layer(s) 2 and/or 2" of or including silicon oxide, zirconium oxide, zirconium oxynitride, silicon zirconium oxide and/or silicon zirconium oxynitride (e.g., $SiZrO_x$, $ZrO_2$, $SiO_2$, and/or $SiZrO_xN_y$) may each have a physical thickness of from about 10-400 angstroms (Å), more preferably from about 40-170 Å, and most preferably from about 80-140 Å.

It has also been surprisingly and unexpectedly found that the provision of no silicon nitride based layer (e.g., $Si_3N_4$, optionally doped with 1-10% Al or the like) directly under and contacting the lowermost doped zinc oxide based layer 3 between the glass substrate 1 and the lowermost silver based layer 7, in combination with the crystallized or substantially crystallized phase of the doped zinc oxide based layer 3 as deposited, allows for improved thermal stability upon heat treatment (lower $\Delta E^*$ values) to be realized. For example, see the coatings of FIGS. 1(a)-1(d) and 1(i). Moreover, in certain example embodiments, there is no amorphous or substantially amorphous layer located between the glass substrate 1 and the first IR reflecting layer comprising silver 7. It has also been surprisingly and unexpectedly found that the provision of no silicon nitride based layer in the middle section of the stack between the two silver-based IR reflecting layers 7 and 19 allows for improved thermal stability upon heat treatment (lower $\Delta E^*$ values) to be realized (e.g., see FIGS. 1(a)-1(i)).

In certain example embodiments, it has also been found that providing an absorber layer (e.g., NiCr, $NiCrN_x$, NbZr, and/or $NbZrN_x$) 42 between the glass substrate and the dielectric layer 2 of or including silicon oxide, zirconium oxide, silicon zirconium oxide and/or silicon zirconium oxynitride (e.g., $SiZrO_x$, $ZrO_2$, $SiO_2$, and/or $SiZrO_xN_y$) may advantageously reduce glass side visible reflection ($R_gY$) of the coated article in a desirable manner and allows the visible transmission to be tuned in a desirable manner. The absorber layer 42 may be provided between and contacting a pair of silicon nitride based layers 41 and 43 (e.g., of or including $Si_3N_4$, optionally doped with 1-10% Al or the like, and optionally including from 0-10% oxygen) in certain example embodiments, such as shown in FIGS. 1(d) and 1(f) for instance. See also FIG. 39 and Example 22 for instance. In other example embodiments, the stack made up of the absorber layer 42, between nitride based dielectric layers 41 and 43, may be located at other position(s) within the stack.

In certain example embodiments, measured monolithically, in view of the above structure (e.g., see FIGS. 1(a)-1(i)), the coated article is configured to realize one or more of: (i) a transmissive ΔE* value (where transmissive optics are measured) of no greater than 3.0 (more preferably no greater than 2.8, or 2.5, and most preferably no greater than 2.3) upon HT for 8, 12 and/or 16 minutes at a temperature of about 650 degrees C., (ii) a glass side reflective ΔE* value (where glass side reflective optics are measured) of no greater than 3.0 (more preferably no greater than 2.5, more preferably no greater than 2.0, even more preferably no greater than 1.5, and most preferably no greater than 1.0, or 0.6) upon HT for 8, 12 and/or 16 minutes at a temperature of about 650 degrees C., and/or (iii) a film side reflective ΔE* value (where film side reflective optics are measured) of no greater than 3.5 (more preferably no greater than 3.0, and most preferably no greater than 2.0, more preferably no greater than 1.5, and possibly no greater than 1.2) upon HT for 8, 12 and/or 16 minutes at a temperature of about 650 degrees C.

In certain example embodiments, measured monolithically, the coated article is configured to have a visible transmission ($T_{vis}$ or Y), before or after any optional HT, of at least about 30%, more preferably of at least about 35%, more preferably of at least about 40%, more preferably of at least about 50%. In certain example embodiments, the low-E coating has a sheet resistance (SR or $R_s$) of no greater than 20 ohms/square, more preferably no greater than 10 ohms/square, and most preferably no greater than 2.5 or 2.2 ohms/square, before and/or after optional heat treatment. In certain example embodiments, the low-E coating has a hemispherical emissivity/emittance ($E_h$) of no greater than 0.08, more preferably no greater than 0.05, and most preferably no greater than 0.04.

The value ΔE* is important in determining whether or not upon heat treatment (HT) there is matchability, or substantial matchability, in the context of this invention. Color herein is described by reference to the conventional a*, b* values, which in certain embodiments of this invention are both negative in order to provide color in the desired substantially neutral color range tending to the blue-green quadrant. For purposes of example, the term Δa* is simply indicative of how much color value a* changes due to heat treatment.

The term ΔE* (and ΔE) is well understood in the art and is reported, along with various techniques for determining it, in ASTM 2244-93 as well as being reported in Hunter et. al., *The Measurement of Appearance*, 2$^{nd}$ Ed. Cptr. 9, page 162 et seq. [John Wiley & Sons, 1987]. As used in the art, ΔE* (and ΔE) is a way of adequately expressing the change (or lack thereof) in reflectance and/or transmittance (and thus color appearance, as well) in an article after or due to heat treatment. ΔE may be calculated by the "ab" technique, or by the Hunter technique (designated by employing a subscript "H"). ΔE corresponds to the Hunter Lab L, a, b scale (or $L_h$, $a_h$, $b_h$). Similarly, ΔE* corresponds to the CIE LAB Scale L*, a*, b*. Both are deemed useful, and equivalent for the purposes of this invention. For example, as reported in Hunter et. al. referenced above, the rectangular coordinate/scale technique (CIE LAB 1976) known as the L*, a*, b* scale may be used, wherein:

L* is (CIE 1976) lightness units
a* is (CIE 1976) red-green units
b* is (CIE 1976) yellow-blue units
and the distance ΔE* between $L^*_o a^*_o b^*_o$ and $L^*_1 a^*_1 b^*_1$ is:

$$\Delta E^* = [(\Delta L^*)^2 + (\Delta a^*)^2 + (\Delta b^*)^2]^{1/2} \quad (1)$$

where:

$$\Delta L^* = L^*_1 - L^*_o \quad (2)$$

$$\Delta a^* = a^*_1 - a^*_o \quad (3)$$

$$\Delta b^* = b^*_1 - b^*_o \quad (4)$$

where the subscript "o" represents the coated article before heat treatment and the subscript "1" represents the coated article after heat treatment; and the numbers employed (e.g., a*, b*, L*) are those calculated by the aforesaid (CIE LAB 1976) L*, a*, b* coordinate technique. In a similar manner, ΔE may be calculated using equation (1) by replacing a*, b*, L* with Hunter Lab values $a_h$, $b_h$, $L_h$. Also within the scope of this invention and the quantification of ΔE* are the equivalent numbers if converted to those calculated by any other technique employing the same concept of ΔE* as defined above.

In certain example embodiments of this invention, the low-E coating 30 includes two silver-based IR reflecting layers (e.g., see FIGS. 1(a)-1(i)), although this invention is not so limited in all instances (e.g., three silver based IR reflecting layers can be used in certain instances). It will be recognized that the coated articles of FIGS. 1(a)-1(i) are illustrated in monolithic form. However, these coated articles may also be used in IG window units for example.

Because of materials stability, baking at high temperature (e.g., 580-650 degrees C.) causes change to chemical compositions, crystallinity and microstructures or even phases of dielectric layer materials. High temperature also causes interface diffusion or even reaction, as a consequence composition, roughness and index change at interface locations. As a result, optical properties such as index n/k and optical thickness change upon heat treatment. The IR materials, for example Ag, have undergone change too. Typically, Ag materials go through crystallization, grain growth or even orientation change upon heat treatment. These changes often cause conductivity and particularly index n/k changes which have big impact to the optical and thermal properties of a low-E coating. In addition, the dielectric and the change of dielectrics also has a significant impact on IR reflecting layers such as silver undergoing heat treatment. Moreover, silver may have more change in one layer stack than in others merely because of the materials and the layer stacks themselves. If the silver changes are beyond some limit, then it may not be acceptable aesthetically after heat treatment. We have found that to get thermal stability of a low-E coating, doped zinc oxide crystallized materials on glass either directly or indirectly with a thin modification layer(s) may be used under silver of an IR reflecting layer. Crystalline or substantially crystalline doped zinc oxide in these locations has been found to change less during heat treatment, and result in smaller silver changes with respect to properties such as indices (e.g., n and/or k) and thus less overall color change upon heat treatment.

FIG. 1(a) is a side cross sectional view of a coated article according to an example non-limiting embodiment of this invention, where the low-E coating 30 has two silver-based IR reflecting layers 7 and 19. The coated article includes substrate 1 (e.g., clear, green, bronze, or blue-green glass substrate from about 1.0 to 10.0 mm thick, more preferably from about 3.0 mm to 8.0 mm thick), and low-E coating (or layer system) 30 provided on the substrate 1 either directly or indirectly. The coating (or layer system) 30 includes, in FIG. 1(a) for example: dielectric layer 3 of or including zinc oxide, doped with at least one metal dopant (e.g., Sn and/or Al), which is crystalline or substantially crystalline as deposited; infrared (IR) reflecting layer of or including silver 7 located over and directly contacting layer 3; contact layer 9 of or including Ni and/or Cr (e.g., NiCr, NiCrO$_x$, NiCrN$_x$, NiCrON, NiCrM, NiCrMoO$_x$, etc.), Ti, or other suitable material, over and directly contacting the IR reflecting layer 7; dielectric layer 11 of or including zinc stannate (e.g., ZnSnO, Zn$_2$SnO$_4$, or other suitable stoichiometry) or other suitable material, which may be amorphous or substantially amorphous as deposited; another dielectric layer 13 of or including zinc oxide, doped with at least one dopant (e.g., Sn), which is crystalline or substantially crystalline as deposited; another infrared (IR) reflecting layer of or including silver 19 located over and directly contacting layer 13; another contact layer 21 of or including Ni and/or Cr (e.g., NiCr, NiCrO$_x$, NiCrN$_x$, NiCrON, NiCrM, NiCrMoO$_x$, etc.), Ti, or other suitable material, over and directly contacting the IR reflecting layer 19; another dielectric layer 23 of or including zinc stannate (e.g., ZnSnO, Zn$_2$SnO$_4$, or other suitable stoichiometry) or other suitable material such as tin oxide, which may be amorphous or substantially amorphous as deposited; and amorphous or substantially amorphous dielectric layer 25 of or including silicon nitride (e.g., Si$_3$N$_4$, or other suitable stoichiometry) which may optionally be doped with Al and/or O. The layers shown in FIG. 1(a) may be deposited by sputter-deposition or in any other suitable manner.

As explained herein, it has been found that the presence of as-deposited crystalline or substantially crystalline layer 3 and/or 13 of or including zinc oxide, doped with at least one dopant (e.g., Sn), immediately under and directly contacting an infrared (IR) reflecting layer of or including silver 7 and/or 19 in a low-E coating 30 has the effect of significantly improving the coating's thermal stability (i.e., lowering the ΔE* value). In certain example embodiments, the crystalline or substantially crystalline layer 3 and/or 13 of or including zinc oxide is doped with from about 1-30% Sn, more preferably from about 1-20% Sn, more preferably from about 5-15% Sn, with an example being about 10% Sn (in terms of wt. %).

In certain example embodiments, the dielectric zinc stannate (e.g., ZnSnO, Zn$_2$SnO$_4$, or the like) based layers 11 and 23 may be deposited in an amorphous or substantially amorphous state (it/they may become crystalline or substantially crystalline upon heat treatment). It has been found that having similar amounts of Zn and Sn in the layer, or more Sn than Zn in the layer, helps ensure that the layer is deposited in an amorphous or substantially amorphous state. For example, the metal content of amorphous zinc stannate based layers 11 and 23 may include from about 30-70% Zn and from about 30-70% Sn, more preferably from about 40-60% Zn and from about 40-60% Sn, with examples being about 52% Zn and about 48% Sn, or about 50% Zn and 50% Sn (weight %, in addition to the oxygen in the layer) in certain example embodiments of this invention. Thus, for example, the amorphous or substantially amorphous zinc stannate based layers 11 and/or 23 may be sputter-deposited using a metal target comprising about 52% Zn and about 48% Sn, or about 50% Zn and about 50% Sn, in certain example embodiments of this invention. Optionally, the zinc stannate based layers 11 and 23 may be doped with other metals such as Al or the like. Depositing layers 11 and 23 in an amorphous, or substantially amorphous, state, while depositing layers 3 and 13 in a crystalline, or substantially crystalline, state, has been found to advantageously allow for improved thermal stability to be realized in combination with good optical characteristics such as acceptable transmission, color, and reflection. It is noted that zinc stannate layers 11 and/or 23 may be replaced with respective layer(s) of other material(s) such as tin oxide, zinc oxide, zinc oxide doped with from 1-20% Sn (as discussed elsewhere herein regarding layers 11, 13), or the like.

Dielectric layer 25, which may be an overcoat, may be of or include silicon nitride (e.g., Si$_3$N$_4$, or other suitable stoichiometry) in certain embodiments of this invention, in order to improve the heat treatability and/or durability of the coated article. The silicon nitride may optionally be doped with Al and/or O in certain example embodiments, and also may be replaced with other material such as silicon oxide or zirconium oxide in certain example embodiments.

Infrared (IR) reflecting layers 7 and 19 are preferably substantially or entirely metallic and/or conductive, and may comprise or consist essentially of silver (Ag), gold, or any other suitable IR reflecting material. IR reflecting layers 7 and 19 help allow the coating to have low-E and/or good solar control characteristics. The IR reflecting layers may, however, be slightly oxidized in certain embodiments of this invention.

Other layer(s) below or above the illustrated coating in FIG. 1 may also be provided. Thus, while the layer system or coating is "on" or "supported by" substrate 1 (directly or indirectly), other layer(s) may be provided therebetween. Thus, for example, the coating of FIG. 1(a) may be considered "on" and "supported by" the substrate 1 even if other layer(s) are provided between layer 3 and substrate 1. Moreover, certain layers of the illustrated coating may be removed in certain embodiments, while other layer(s) may be added between the various layers or the various layer(s) may be split with other layer(s) added between the split sections in other embodiments of this invention without departing from the overall spirit of certain embodiments of this invention.

While various thicknesses and materials may be used in layers in different embodiments of this invention, example thicknesses and materials for the respective layers on the glass substrate 1 in the FIG. 1(a) embodiment are as follows, from the glass substrate outwardly:

TABLE 1

Example Materials/Thicknesses; FIG. 1(a) Embodiment

| Layer Glass | Preferred Range (Å) | More Preferred (Å) | Example (Å) |
| --- | --- | --- | --- |
| Sn-doped ZnO (layer 3) | 20-900 (or 100-900) Å | 350-550 Å | 470 Å |
| Ag (layer 7) | 60-260 Å | 110-170 Å | 151 Å |
| NiCrO$_x$ (layer 9) | 10-100 Å | 20-45 Å | 41 Å |
| ZnSnO (layer 11) | 200-1200 Å | 500-900 Å | 736 Å |
| Sn-doped ZnO (layer 13) | 60-900 Å | 120-400 Å | 177 Å |
| Ag (layer 19) | 80-280 Å | 150-250 Å | 232 Å |
| NiCrO$_x$ (layer 21) | 10-100 Å | 20-45 Å | 41 Å |

TABLE 1-continued

Example Materials/Thicknesses; FIG. 1(a) Embodiment

| Layer<br>Glass | Preferred Range (Å) | More<br>Preferred (Å) | Example<br>(Å) |
|---|---|---|---|
| ZnSnO (layer 23) | 10-750 Å | 70-200 Å | 108 Å |
| $Si_3N_4$ (layer 25) | 10-750 Å | 100-240 Å | 191 Å |

The FIG. 1(b) embodiment is the same as the FIG. 1(a) embodiment discussed above and elsewhere herein, except that the low-E coating 30 in the FIG. 1(b) embodiment also includes a substantially transparent dielectric layer 2 of or including silicon zirconium oxide, zirconium oxide, silicon oxide, and/or silicon zirconium oxynitride (e.g., $SiZrO_x$, $ZrO_2$, $SiO_2$, $SiAlO_2$, and/or $SiZrO_xN_y$) under and directly contacting the doped zinc oxide based layer 3. It has been found that this additional layer 2 provides for further improved thermal stability of the coated article, and thus an even lower the $\Delta E^*$ value (e.g., a lower glass side reflective $\Delta E^*$ value) upon heat treatment (HT) such as thermal tempering. The dielectric layer 2 of or including silicon zirconium oxide, zirconium oxide, silicon oxide, and/or silicon zirconium oxynitride (e.g., $SiZrO_x$, $ZrO_2$, $SiO_2$, $SiAlO_2$, and/or $SiZrO_xN_y$) may be provided directly under and contacting the lowermost doped zinc oxide based layer 3 in certain example embodiments of this invention, as shown in FIG. 1(b). In certain example embodiments of this invention, dielectric layer 2 of or including silicon zirconium oxide, zirconium oxide, silicon oxide, and/or silicon zirconium oxynitride (e.g., $SiZrO_x$, $ZrO_2$, $SiO_2$, $SiAlO_2$, and/or $SiZrO_xN_y$) may be from about 20-600 Å thick, more preferably from about 40-400 Å thick, and most preferably from about 50-300 Å thick. The thicknesses above for the FIG. 1(a) embodiment may also apply to FIGS. 1(b)-1(i).

When layer 2 (or 2', or 2") is of or includes $SiZrO_x$ and/or $SiZrO_xN_y$, it has been found that providing more Si than Zr in that layer is advantageous from an optical point of view with a low refractive index (n) and improved antireflection and other optical characteristics. For example, in certain example embodiments, when layer 2 (or 2', or 2") is of or includes $SiZrO_x$ and/or $SiZrO_xN_y$, metal content of the layer may comprise from 51-99% Si, more preferably from 70-97% Si, and most preferably from 80-90% Si, and from 1-49% Zr, more preferably from 3-30% Zr, and most preferably from 10-20% Zr (atomic %). In example embodiments, transparent dielectric layer 2 of or including $SiZrO_x$ and/or $SiZrO_xN_y$ may have a refractive index (n), measured at 550 nm, of from about 1.48 to 1.68, more preferably from about 1.50 to 1.65, and most preferably from about 1.50 to 1.62.

The FIG. 1(c) embodiment is the same as the FIG. 1(b) embodiment discussed above and elsewhere herein, except that the low-E coating 30 in the FIG. 1(c) embodiment also includes a substantially transparent dielectric layer 2' of or including silicon nitride (e.g., $Si_3N_4$, optionally doped with 1-10% Al or the like, and optionally including from 0-10% oxygen, or other suitable stoichiometry) and/or silicon zirconium oxynitride, located between and contacting the glass substrate 1 and the dielectric layer 2. Layer 2' may also be of or including aluminum nitride (e.g., AN).

The FIG. 1(d) embodiment is the same as the FIG. 1(b) embodiment discussed above and elsewhere herein, except that the low-E coating 30 in the FIG. 1(d) embodiment also includes a metallic or substantially metallic absorber layer 42 sandwiched between and contacting silicon nitride based layers 41 and 43 (e.g., $Si_3N_4$, optionally doped with 1-10% Al or the like, and optionally including from 0-10% oxygen). Dielectric layer(s) 41 and/or 43 may also be of or include aluminum nitride (e.g., AN) in certain example embodiments. The absorber layer 42 may be of or including NiCr, NbZr, Nb, Zr, or nitrides thereof, or other suitable material, in example embodiments of this invention. The absorber layer 42 preferably contains from 0-10% oxygen (atomic %), more preferably from 0-5% oxygen. In certain example embodiments, it has been found that providing an absorber layer (e.g., NiCr, $NiCrN_x$, NbZr, and/or $NbZrN_x$) 42 between the glass substrate and the dielectric layer 2 of or including silicon zirconium oxide, zirconium oxide, silicon oxide, and/or silicon zirconium oxynitride (e.g., $SiZrO_x$, $ZrO_2$, $SiO_2$, $SiAlO_2$, and/or $SiZrO_xN_y$) advantageously reduces glass side visible reflection ($R_gY$) of the coated article in a desirable manner, and allows the visible transmission to be tuned in a desirable manner See, for example, FIG. 39 and Example 22. In certain example embodiments, the absorber layer 42 may be from about 10-150 Å thick, more preferably from about 30-80 Å thick. In certain example embodiments, the silicon nitride based layers 41 and 43 may be from about 50-300 Å thick, more preferably from about 70-140 Å thick. For instance, in Example 22 and FIG. 39, the absorber layer 42 is a nitride of NiCr, and is about 1.48 nm thick. In other example embodiments, the stack made up of the absorber layer 42, between nitride based dielectric layers 41 and 43, may be located at other position(s) within the stack.

Referring to FIGS. 1(a)-1(d), another transparent dielectric layer (not shown) of or including $ZrO_2$, $SiZrO_x$ and/or $SiZrO_xN_y$ may be provided either between layers 11 and 13. In certain example embodiments, zinc stannate inclusive layer 11 may be omitted, or may be replaced with such another transparent dielectric layer of or including $ZrO_2$, $SiZrO_x$ and/or $SiZrO_xN_y$. It is also possible for doped zinc oxide layer 13 to be split with such another layer transparent dielectric layer of or including $ZrO_2$, $SiZrO_x$ and/or $SiZrO_xN_y$. For example, in certain example embodiments, when such an additional layer is of or includes $SiZrO_x$ and/or $SiZrO_xN_y$, metal content of the layer may comprise from 51-99% Si, more preferably from 70-97% Si, and most preferably from 80-90% Si, and from 1-49% Zr, more preferably from 3-30% Zr, and most preferably from 10-20% Zr (atomic %), and may contain from 0-20% nitrogen, more preferably from 0-10% nitrogen, and most preferably from 0-5% nitrogen (atomic %). For instance, at least one dielectric layer (e.g., 2 and/or 2") of or including silicon oxide, zirconium oxide, zirconium oxynitride, silicon zirconium oxide and/or silicon zirconium oxynitride (e.g., $SiZrO_x$, $ZrO_2$, $SiO_2$, and/or $SiZrO_xN_y$) may be provided: (i) in the bottom dielectric portion of the coating under all silver based IR reflecting layer(s) (e.g., see FIGS. 1(b)-1(i)), and/or (ii) in a middle dielectric portion of the coating between a pair of silver based IR reflecting layers (e.g., see FIGS. 1(e)-1(i)).

As explained above and shown in the figures, the coated article may include a dielectric layer(s) 2, 2" (e.g., $ZrO_2$ or $SiZrO_x$) as shown in FIGS. 1(b)-(i), which may possibly be located under and directly contacting the first crystalline or substantially crystalline layer 3 comprising zinc oxide doped with from about 1-30% Sn, and/or below a zinc oxide inclusive layer 3". The dielectric layer(s) 2 (and 2") may be of or include silicon oxide optionally doped with Al, zirconium oxide (e.g., $ZrO_2$), zirconium oxynitride, silicon zirconium oxide and/or silicon zirconium oxynitride (e.g., $SiZrO_x$, $ZrO_2$, $SiO_2$, and/or $SiZrO_xN_y$). The dielectric layer 2 (or 2″) may be in direct contact with the glass substrate 1 (e.g., see FIGS. 1(b), 1(e), 1(g), 1(h)). The dielectric layer(s) 2, 2″ may each have a physical thickness of from about 10-600 Å, more preferably from about 40-400 Å, more preferably from about 50-300 Å, and most preferably from about 50-200 Å, or from about 40-170 or 80-140 Å. The dielectric layer(s) 2, 2″ is/are preferably an oxide based dielectric layer, and preferably contains little or no nitrogen. For example, the dielectric layer(s) 2, 2″ may each comprise from 0-20% nitrogen, more preferably from 0-10% nitrogen, and most preferably from 0-5% nitrogen (atomic %).

The FIG. 1(i) embodiment is based on the embodiments of FIGS. 1(a)-(b), 1(e), and 1(h) discussed herein, and layer and performance descriptions regarding those embodiments also apply to FIG. 1(i). However, the FIG. 1(i) embodiment also includes an absorber film made up of layers 57 and 59, where the absorber film is provided in the central portion of the layer stack and over dielectric layers 11, 2″ and 3″ as described herein. Layer 3″ may be zinc stannate, zinc oxide, zinc aluminum oxide, or dope zinc oxide as discussed above in different embodiments of this invention. Layer 2″ is discussed above, and may be of or include silicon oxide optionally doped with Al, zirconium oxide (e.g., $ZrO_2$), silicon zirconium oxide and/or silicon zirconium oxynitride (e.g., $SiZrO_x$, $ZrO_2$, $SiO_2$, and/or $SiZrO_xN_y$).

In the FIG. 1(i) embodiment, the absorber film may be a multi-layer absorber film including a first layer 57 of or including silver (Ag), and a second layer 59 of or including NiCr which may be partially or fully oxided ($NiCrO_x$), and possibly slightly nitrided. Such a multi-layer absorber film 57, 59 may thus, in certain example embodiments, be made up of a layer sequence of $Ag/NiCrO_x$. This layer sequence may be repeated in certain example instances. For example, the absorber film may be made up of a layer sequence of $Ag/NiCrO_x/Ag/NiCrO_x$, or $Ag/NiCrO_x/Ag/NiCrO_x/Ag/NiCrO_x$, in certain example embodiments of this invention, which each of the layers in the sequence contributing to the light absorption. Elements from one layer may diffuse into an adjacent layer due to HT or other factors. The NiCr based layer 59 of the absorber may be initially deposited in metallic form, or as a suboxide, in certain example embodiments. The silver based layer 57 may be a continuous layer, and/or may optionally be doped, in certain example embodiments. Examples 30-47 of example embodiments of this invention relate to at least the FIG. 1(i) embodiment (see FIGS. 47-56). Moreover, as explained herein, in certain example embodiments, in certain example embodiments it has surprisingly and unexpectedly been found that initially sputter-depositing the dielectric layer(s) 2 and/or 2″ of or including silicon oxide, zirconium oxide, zirconium oxynitride, silicon zirconium oxide and/or silicon zirconium oxynitride (e.g., $SiZrO_x$, $ZrO_2$, $SiO_2$, and/or $SiZrO_xN_y$) so as to comprise a monoclinic phase crystalline phase (see m-$ZrO_2$ peaks in the upper graph of FIG. 51) is advantageous in that it results in improved thermal stability (lower ΔE* value) and/or reduced change in visible transmission (e.g., $T_{vis}$ or TY) of the coated article upon heat treatment (HT).

The silver based layer 57 of the absorber film is preferably sufficiently thin so that its primary function is to absorb visible light and provide desirable coloration (as opposed to being much thicker and primarily function as an IR reflection layer). The NiCr or $NiCrO_x$ 59 is provided over and contacting the silver 57 of the absorber film in order to protect the silver, and also to contribute to absorption. In certain example embodiments, the silver based layer 57 of the absorber film may be no more than about 30 Å thick, more preferably no greater than about 20 Å thick, and most preferably no greater than about 15 Å thick, and possibly no greater than about 12 Å thick, in certain example embodiments of this invention. In certain example embodiments, the NiCr based layer 59 of the absorber film may be from about 5-200 Å thick, more preferably from about 10-110 Å thick, and most preferably from about 40-90 Å thick. In certain example embodiments, the ratio of $Ag/NiCrO_x$ in the absorber film may be 1:Z (where 0.1<Z<20, more preferably where 2<Z<15, and most preferably where 3<Z<12), with an example being about 1:5.

With respect to the silver based layer 57 of the absorber film being sufficiently thin so that its primary function is to absorb visible light and provide desirable coloration (as opposed to being much thicker and primarily function as an IR reflection layer), the ratio of the physical thickness of the IR reflecting layer 7 (e.g., silver) to the physical thickness of the silver based layer 57 is preferably at least 5:1, more preferably at least about 8:1, even more preferably at least about 10:1, and even more preferably at least about 15:1. Likewise, the ratio of the physical thickness of the IR reflecting layer 19 (e.g., silver) to the physical thickness of the silver based layer 57 is preferably at least 5:1, more preferably at least about 8:1, even more preferably at least about 10:1, and even more preferably at least about 15:1.

While a single layer of NiCr (or other suitable material) may also be used as an absorber film in low-E coatings in certain example embodiments of this invention (e.g., see absorber film 42 in FIGS. 1(d) and 1(f)), it has surprisingly been found that using silver 57 in an absorber film (single layer, or multi-layer, absorber film) of FIG. 1(i) provides for several unexpected advantages compared to a single layer of NiCr as the absorber. First, it has been found that a single layer of NiCr as the absorber tends to cause yellowish coloration in certain low-E coating coated articles, which may not be desirable in certain instances. In contrast, it has been surprisingly found that using silver 57 in an absorber films tends to avoid such yellowish coloration and/or instead provide for more desirable neutral coloration of the resulting coated article. Thus, the use of silver 57 in an absorber film has been found to provide for improved optical characteristics. Second, the use of a single layer of NiCr 42 as the absorber tends to also involve providing silicon nitride based layers on both sides of the NiCr so as to directly sandwich and contact the NiCr therebetween. For example, see FIGS. 1(d) and 1(f). It has been found that the provision of silicon nitride in certain locations in a coating stack may lead to compromised thermal stability upon HT. In contrast, it has been surprisingly found that when using silver in an absorber film as shown in FIG. 1(i) for example, a pair of immediately adjacent silicon nitride layers are not needed, so that thermal stability upon HT may be improved. Thus, the use of silver 57 in an absorber film has been found to provide for improved thermal stability including lower ΔE* values and therefor improved matchability between HT and non-HT versions of the same coating. The use of silver in an absorber film may also provide for improved manufacturability in certain situations.

While the absorber film 57, 59 in FIG. 1(i) is provided in the central portion of the layer stack between the IR reflecting layers 7 and 19, it is also possible to provide such an absorber film 57, 59 instead in the lower portion of the layer stack below the bottom IR reflecting layer 7, or in another suitable location. For example, the FIG. 1(i) embodiment may be modified by moving directly adjacent and contacting layers 57 and 59 to a position between layers 2 and 3, so that layers 2 and 57 contact each other, and layers 59 and 3 contact each other. As another example, the FIG. 1(i) embodiment may be modified by moving the sequence of three layers 3"/57/59 from the central portion of the stack to a position between layers 2 and 3 in FIG. 1(i), so that layers 2 and 3" contact each other, and layers 59 and 3 contact each other. However, it has been surprisingly found that by providing the absorber film 57, 59 in the central portion of the layer stack as shown in FIG. 1(i), optical characteristics such as SHGC and glass side reflectance may be improved.

FIG. 1(i) illustrates layer 59 of the absorber film as of or including NiCrO$_x$ (partially or fully oxided). However, layer 59 of the absorber film may be of or include other metal based materials (e.g., NiCr, Ni, Cr, NiCrO$_x$, NiCrN$_x$, NiCrON, NiCrM, NiCrMoO$_x$, Ti, or other suitable material).

It is noted that zinc stannate layers 11 and/or 23 may be replaced with respective layer(s) of other material(s) such as tin oxide, zinc oxide, zinc oxide doped with from 1-20% Sn (as discussed elsewhere herein regarding layers 3, 3", 13), or the like, in any embodiment herein.

While various thicknesses and materials may be used in layers in different embodiments of this invention, example thicknesses and materials for the respective layers on the glass substrate 1 in the FIG. 1(i) embodiment are as follows, from the glass substrate outwardly:

TABLE 1'

Example Materials/Thicknesses; FIG. 1(i) Embodiment

| Layer Glass | Preferred Range (Å) | More Preferred (Å) | Example (Å) |
|---|---|---|---|
| ZrO$_x$/SiZrO$_x$ (layer 2) | 30-600 Å | 40-400 Å | 50-200 Å |
| Sn-doped ZnO (layer 3) | 20-900 (or 100-900) Å | 100-550 Å | 223 Å |
| Ag (layer 7) | 60-260 Å | 100-170 Å | 151 Å |
| NiCrO$_x$ (layer 9) | 10-100 Å | 20-45 Å | 41 Å |
| ZnSnO (layer 11) | 100-1200 Å | 150-500 Å | 280 Å |
| ZrO$_x$/SiZrO$_x$ (layer 2") | 30-600 Å | 40-400 Å | 50-200 Å |
| Sn-doped ZnO (layer 3") | 20-900 Å | 50-150 Å | 100 Å |
| Ag (layer 57) | 3-30 Å | 4-20 Å | 5-15 Å |
| NiCrO$_x$ (layer 59) | 5-200 Å | 10-110 Å | 40-90 Å |
| Sn-doped ZnO (layer 13) | 60-900 Å | 120-400 Å | 331 Å |
| Ag (layer 19) | 80-280 Å | 120-250 Å | 156 Å |
| NiCrO$_x$ (layer 21) | 10-100 Å | 20-45 Å | 41 Å |
| ZnSnO (layer 23) | 10-750 Å | 70-200 Å | 103 Å |
| Si$_3$N$_4$ (layer 25) | 10-750 Å | 100-240 Å | 214 Å |

In certain embodiments of this invention, layer systems herein (e.g., see FIGS. 1(a)-(i)) provided on clear monolithic glass substrates (e.g., 6 mm thick glass substrates for example reference purposes) have color as follows before heat treatment, as viewed from the glass side of the coated article (R$_G$ %) (Ill. C, 2 degree Observer):

TABLE 2

Reflection/Color (R$_G$) Before and/or After Heat Treatment

|  | General | Preferred |
|---|---|---|
| R$_g$Y (%) | 5-35%, or 5-20% | 8-18% |
| a$_g$* | −5.0 to +4.0 | −3.5 to +2.0 |
| b$_g$* | −16.0 to 0.0 | −14.0 to −5.0 |

Comparative Examples 1 and 2

FIG. 19 is a cross sectional view of a first Comparative Example (CE) coated article, and FIG. 23 is an XRD Lin (Cps) vs. 2-Theta-Scale graph illustrating, for the first Comparative Example (CE), the relative large 166% change in Ag (111) peak height due to heat treatment.

A difference between the first Comparative Example coating (see FIG. 19), and Examples 1-24, 27-28, and 30-33 below, is that the lowermost dielectric stack of the coating in the first Comparative Example is made up of a Zn$_2$SnO$_4$ layer, and a zinc oxide based layer that is doped with aluminum. The metal content of the zinc stannate layer (Zn$_2$SnO$_4$ is a form of zinc stannate) is about 50% Zn and about 50% Sn (wt. %); and thus the zinc stannate layer is sputter-deposited in amorphous form. The overall thickness of the lowermost dielectric stack in the first CE was about 400-500 angstroms, with the zinc stannate layer making up the majority of that thickness. FIG. 23 illustrates, for the first Comparative Example (CE), the relative large 166% change in Ag (111) peak height due to heat treatment at about 650 degrees C. which is indicative of a significant change in structure of the silver layers during the heat treatment, and which is consistent with the ΔE* values over 4.0 realized by the Comparative Example. Thus, the first CE was undesirable because of the significant changes in the Ag (111) peak, and the high of ΔE* values over 4.0, due to heat treatment. In contrast with the first Comparative Example, Examples 1-24, 27-28, and 30-33 below had a crystalline or substantially crystalline layer 3, 13 with a metal content of either 90(Zn)/10(Sn) or 85(Zn)/15(Sn) directly under and contacting silver 7, 19, and realized significantly improved/lower ΔE* values.

A second Comparative Example (CE 2) is shown in FIGS. 34-35. FIG. 34 is chart illustrating sputter-deposition conditions for the sputter-deposition of the low-E coating of Comparative Example 2 (CE 2) on a 6 mm thick glass substrate. The layer stack of CE 2 is the same as that shown in FIG. 1(b) of the instant application, except that the lowermost dielectric layer in CE 2 is made of silicon nitride (doped with about 8% aluminum) instead of the SiZrO$_x$ shown in FIG. 1(b). Thus, the bottom dielectric stack in CE 2 is made up of only this silicon nitride based layer and a zinc oxide layer 3 doped with about 10% Sn. The thicknesses of the layers of the coating of CE 2 are in the far right column of FIG. 34. For example, the bottom silicon nitride based layer, doped with Al (sputtered from an SiAl target in an atmosphere of Ar and N$_2$ gas), is 10.5 nm thick in CE 2, the zinc oxide layer 3 doped with about 10% Sn directly under the bottom silver is 32.6 nm thick in CE 2, and so forth.

It can be seen in FIG. 35 that CE 2 suffers from relatively high glass side reflective ΔE* values (ΔE* R$_g$) and film side reflective ΔE* values (ΔE* R$_f$) over 4.0, due to heat treatments of 12, 16, and 24 minutes. For example, FIG. 35 shows that CE has a relatively high glass side reflective ΔE* value (ΔE* R$_g$) of 4.9 and a relatively high film side reflective ΔE* value (ΔE* R$_f$) of 5.5 due to heat treatment for 12 minutes. FIG. 35 is a chart illustrating optical characteristics of Comparative Example 2 (CE 2): as coated (annealed) before heat treatment in the left-most data column, after 12 minutes of heat treatment at 650 degrees C. (HT), after 16 minutes of HT at 650 degrees C. (HTX), and after 24 minutes of heat treatment at 650 degrees C. (HTXXX) in the far right data column. These relatively high ΔE* values of CE 2 are undesirable.

Accordingly, Comparative Example 2 (CE 2) in FIGS. 34-35 demonstrates that undesirably high ΔE* values are realized, even when a crystalline or substantially crystalline zinc oxide layer 3 doped with about 10% Sn is provided directly below the bottom silver layer 7, when the only layer between that layer 3 and the glass substrate 1 is a silicon nitride based layer. The difference between the CE 2 coating, and Examples 1-24, 27-28, and 30-33 below, is that Examples 1-24, 27-28, and 30-33 below were surprisingly and unexpectedly able to realize much improved (lower) $\Delta E^*$ values using the crystalline or substantially crystalline zinc oxide layer 3 doped with about 10% or 15% Sn, by not having a silicon nitride based layer located directly below and contacting the crystalline or substantially crystalline zinc oxide layer 3 doped with about 10% or 15% Sn.

Examples 11-14, 19-21, and 26-33 below also demonstrate that replacing the bottom silicon nitride based layer of CE 2 with a $SiZrO_x$ or $ZrO_2$ layer 2 dramatically improves/lowers $\Delta E^*$ values in an unexpected manner.

Examples 1-48

Surprisingly and unexpectedly, it was found that when the lowermost dielectric stack 5, 6 of the Comparative Example (CE) (made up mostly by the zinc stannate layer which is amorphous as deposited) in FIG. 19 was replaced with a crystalline or substantially crystalline Sn-doped zinc oxide layer 3 of similar thickness (the rest of the stack remained substantially the same) contacting the silver based layer, with no silicon nitride based layer directly under and contacting the crystalline or substantially crystalline layer 3, the result was a much more thermally stable product with significant lower $\Delta E^*$ values and a much smaller change in Ag (111) peak height due to heat treatment at about 650 degrees C. The metal content of the crystalline or substantially crystalline Sn-doped zinc oxide layer 3 in Examples 1-24, 27-28, and 30-48 was approximately 90% Zn and 10% Sn (wt. %) (see also 85% Zn, and 15% Sn metal content for "85" regarding layer 13 in Example 19), which helped allow the Sn-doped zinc oxide layers 3, 13 in Examples 1-24, 27-28, 30-48 to be sputter-deposited in crystalline or substantially crystalline form (as opposed to the amorphous form in the CE). For instance, FIG. 20 illustrates the layer stack of Example 10, FIG. 21 illustrates the sputter-deposition conditions and layer thicknesses of Example 10, and FIG. 22 illustrates the much smaller 66% change in Ag (111) peak height due to heat treatment at about 650 degrees C. for Example 10 which is consistent with the much lower $\Delta E^*$ values realized by Examples 1-24, 27-28 and 30-33. FIG. 16 also illustrates the relatively small refractive index (n) shift, upon heat treatment, for Example 8.

The Example coated articles (each annealed and heat treated), Examples 1-48, were made in accordance with certain example embodiments of this invention. Indicated example coatings 30 were sputter-deposited via the sputtering conditions (e.g., gas flows, voltage, and power), sputtering targets, and to the layer thicknesses (nm) shown in FIGS. 2, 3, 6, 7, 9, 11, 13, 15, 21, 24-26, 28, 30, 32, and 36-57. For example, FIG. 2 shows the sputtering conditions, sputtering targets used for sputter-depositing, and the layer thicknesses for the coating of Example 1, FIG. 3 shows the sputtering conditions, sputtering targets used for sputter-depositing, and the layer thicknesses for the coating of Example 2, FIG. 6 shows the sputtering conditions, sputtering targets used for sputter-depositing, and the layer thicknesses for the coating of Example 3, FIG. 7 shows the sputtering conditions, sputtering targets used for sputter-depositing, and the layer thicknesses for the coating of Example 4, and so forth. Meanwhile, data for the indicated Examples, including visible transmission (TY or $T_{vis}$), glass side visible reflectance ($R_gY$ or RGY), film side visible reflectance ($R_fY$ or RFY), a* and b* color values, L* values, and sheet resistance (SR or $R_s$) are shown in FIGS. 4, 5, 8, 10, 12, 14, 18, 27, 29, 31, 33, and 36-56. As explained above, $\Delta E^*$ values are calculated using the L*, a*, and b* values, taken before and after heat treatment, for a given example. For instance, a glass side reflective $\Delta E^*$ value ($\Delta E^*_G$ or $\Delta E^* R_g$) is calculated using the glass side reflective L*, a*, and b* values, taken before and after heat treatment, for a given example. As another example, a film side reflective $\Delta E^*$ value ($\Delta E^*_F$ or $\Delta E^* R_f$) is calculated using the glass side reflective L*, a*, and b* values, taken before and after heat treatment, for a given example. As another example, a transmissive $\Delta E^*$ value ($\Delta E^*_T$) is calculated using the glass side reflective L*, a*, and b* values, taken before and after heat treatment, for a given example.

For examples having approximately 3 mm thick glass substrates, in FIGS. 4, 5, 8, 10, 12, 14, and 18, "HT" refers to heat treatment at 650 degrees for about 8 minutes, "HTX" refers to heat treatment at 650 degrees for about 12 minutes, and "HTXXX" refers to heat treatment at 650 degrees for about 20 minutes. And for examples having approximately 6 mm thick glass substrates, in FIGS. 4, 5, 8, 10, 12, 14, 18, 27, 29, 31, 33, and 36-56 "HT" refers to heat treatment at 650 degrees for about 12 minutes, "HTX" refers to heat treatment at 650 degrees for about 16 minutes, and "HTXXX" refers to heat treatment at 650 degrees for about 24 minutes. The heat treatment temperatures and times are for reference purposes only (e.g., to simulate examples of different tempering and/or heat bending processes).

FIGS. 4 and 5, for instance, illustrate the $\Delta E^*$ values for Examples 1 and 2, respectively. The data for Example 1 is explained below in detail, for purposes of example and explanation, and that discussion also applies to the data for Examples 2-33.

As shown in FIG. 4, Example 1 as coated (prior to heat treatment) had a visible transmission (TY or $T_{vis}$) of 74.7%, a transmissive L* value of 89.3, a transmissive a* color value of −4.7, a transmissive b* color value of 5.8, a glass side reflectance ($R_gY$) of 9.6%, a glass side reflective L* value of 37.1, a glass side reflective a* color value of −1.1, a glass side reflective b* color value of −10.1, a film side reflectance ($R_fY$) of 9.9%, a film side reflective L* value of 37.7, a film side reflective a* color value of −1.5, a film side reflective b* color value of −5.7, and a sheet resistance (SR) of 2.09 ohms/square. FIG. 2 shows the thicknesses of the layers in Example 1. In particular, FIG. 2 shows that the layer thicknesses for Example 1 were are follows: glass/crystalline Sn-doped ZnO (47.0 nm)/Ag (15.1 nm)/$NiCrO_x$ (4.1 nm)/amorphous zinc stannate (73.6 nm)/crystalline Sn-doped ZnO (17.7 nm)/Ag (23.2 nm)/$NiCrO_x$ (4.1 nm)/amorphous zinc stannate (10.8 nm)/silicon nitride doped with aluminum (19.1 nm).

The coated article of Example 1, which had a 6 mm thick glass substrate 1, was then heat treated. As shown in FIG. 4, Example 1 following heat treatment at 650 degrees C. for about 12 minutes had a visible transmission (TY or $T_{vis}$) of 77.0%, a transmissive L* value of 90.3, a transmissive a* color value of −3.5, a transmissive b* color value of 4.9, a glass side reflectance ($R_gY$) of 9.8%, a glass side reflective L* value of 37.5, a glass side reflective a* color value of −0.7, a glass side reflective b* color value of −10.5, a film side reflectance ($R_fY$) of 10.2%, a film side reflective L* value of 38.1, a film side reflective a* color value of −1.4, a film side reflective b* color value of −8.0, a sheet resistance (SR) of 1.75, a transmissive $\Delta E^*$ value of 1.8, a glass side reflective $\Delta E^*$ value 0.7, and a film side reflective $\Delta E^*$ value of 2.4.

It will be appreciated that these ΔE* values for Example 1 (and also those for Examples 2-48) are much improved (significantly lower) than those of the prior art discussed in the background and compared to the values over 4.0 for the Comparative Examples (CEs) discussed above. Thus, the data from the examples demonstrates, for example, that when the lowermost dielectric stacks of the Comparative Examples was replaced with at least a crystalline or substantially crystalline Sn-doped zinc oxide layer of similar thickness (the rest of the stack remained substantially the same), with no silicon nitride based layer directly under and contacting the crystalline or substantially crystalline Sn-doped zinc oxide layer 3, the result was a much more thermally stable product with significant lower ΔE* values and a much smaller change in Ag (111) peak height due to heat treatment.

Other examples show these same unexpected results, compared to the Comparative Example. In general, the Examples demonstrate that the crystalline or substantially crystalline Sn-doped zinc oxide layer, and/or the layer(s) 2, 2" of or including $SiZrO_x$, $ZrO_x$, $SiO_2$, significantly improved ΔE* values. For example, Examples 1-10 had layer stacks generally shown by FIG. 1(*a*) where the only dielectric layer beneath the bottom silver was the crystalline or substantially crystalline Sn-doped zinc oxide layer 3 with a metal content of approximately 90% Zn and 10% Sn (wt. %). In Examples 11-14, 19-24, 27-28 metal content of the crystalline or substantially crystalline Sn-doped zinc oxide layer 3 was approximately 90% Zn and 10% Sn (wt. %), directly over a $SiZrO_x$ layer 2 where metal content of the layer 2 was about 85% Si and 15% Zr (atomic %). In Examples 30-48 the crystalline or substantially crystalline Sn-doped zinc oxide layer 3 was approximately 90% Zn and 10% Sn (wt. %), and provided directly over a $ZrO_2$ layer 2 as shown in FIGS. 1(*i*) and 52. In Examples 15-16 metal content of the crystalline or substantially crystalline Sn-doped zinc oxide layer 3 was approximately 90% Zn and 10% Sn (wt. %), directly over a $ZrO_2$ layer 2; and in Examples 17-18 metal content of the crystalline or substantially crystalline Sn-doped zinc oxide layer 3 was approximately 90% Zn and 10% Sn (wt. %), directly over a $SiO_2$ layer 2 doped with about 8% Al (atomic %). These examples surprisingly and unexpectedly realized much improved ΔE* values compared to the Comparative Examples 1-2.

The layer stacks of Examples 1-10 are generally illustrated by FIG. 1(*a*). The layer stacks of Examples 11-14, 19 and 27 are generally illustrated by FIG. 1(*b*), with layer 2 being of $SiZrO_x$. The layer stacks of Examples 15-16 are generally illustrated by FIG. 1(*b*), with layer 2 being of $ZrO_2$. The layer stacks of Examples 17-18 are generally illustrated by FIG. 1(*b*), with layer 2 being of $SiO_2$. The layer stacks of Examples 20-21 and 28 are generally illustrated by FIG. 1(*e*), with layers 2 and 2" being of $SiZrO_x$. The layer stacks of Examples 23-24 are generally illustrated by FIG. 1(*f*), with layers 2 and 2" being of $SiZrO_x$. The layer stack of Example 25 is generally illustrated by FIG. 1(*g*), with layers 2 and 2" being of $SiZrO_x$. The layer stack of Example 22 is generally illustrated by FIG. 1(*d*), with layer 2 being of $SiZrO_x$. The layer stack of Example 26 is generally illustrated by FIG. 1(*h*), with layers 2 and 2" being of $SiZrO_x$, oxide layer 3' having a meal content 90% Zn and 10% Sn, and oxide layers 3, 13 being zinc oxide doped with about 4-8% Al. The layer stack of Example 29 is generally illustrated by FIG. 1(*h*), except that layer 2" is not present in Example 29, and with layer 2 being of $SiZrO_x$, oxide layer 3' having a metal content 90% Zn and 10% Sn, and oxide layers 3, 13 being zinc oxide doped with about 4-8% Al. The layer stacks of Examples 30-48 are generally illustrated by FIGS. 1(*i*) and 52, with layers 2 and 2" being of $ZrO_2$. These examples surprisingly and unexpectedly realized much improved ΔE* values compared to the Comparative Examples 1-2. These examples demonstrate that the crystalline or substantially crystalline Sn-doped zinc oxide layer(s) (e.g., layer 3 and/or 13), and/or the dielectric layer(s) 2, 2" of or including $SiZrO_x$, $ZrO_x$, $SiO_2$, significantly improved/lowered ΔE* values.

For instance, comparing Examples 23-24 ($SiZrO_x$ layer 2" added to the center dielectric portion of the coating as shown in FIG. 1(*f*)) to Example 22 (no such layer 2" in the center dielectric portion as shown in FIG. 1(*d*)) demonstrates and evidences that the addition of the $SiZrO_x$ layer 2" in Examples 23-24 unexpectedly improved/lowered at least glass side reflective ΔE* values. Thus, it will be appreciated that the addition of the $SiZrO_x$ layer 2" provides for unexpected results.

Furthermore, comparing Example 28 ($SiZrO_x$ layer 2" added to the center dielectric portion of the coating as shown in FIG. 1(*e*)) to Example 27 (no such layer 2" in the center dielectric portion as shown in FIG. 1(*b*)) further demonstrates and evidences that the addition of the $SiZrO_x$ layer 2" in Example 28 unexpectedly improved/lowered glass side reflective ΔE* values. Thus, it will again be appreciated that the addition of the $SiZrO_x$ or $ZrO_2$ layer 2" provides for unexpected results with respect to improving thermal stability.

Examples 30-48 are generally illustrated by FIGS. 1(*i*) and 52 including absorber film 57, 59, with layers 2 and 2" being of $ZrO_2$ in these examples. These examples surprisingly and unexpectedly realized much improved ΔE* values compared to the Comparative Examples 1-2. Examples 30-48 demonstrate that the crystalline or substantially crystalline Sn-doped zinc oxide layer(s) (e.g., layer 3 and/or 13), and the dielectric layer(s) 2, 2" of or including $ZrO_2$, significantly improved/lowered ΔE* values in an unexpected manner Examples 30-48 further demonstrate that providing the absorber film including silver inclusive layer 57 and $NiCrO_x$ inclusive layer 59 allows the visible transmission to be tuned to a desirable value without sacrificing thermal stability or desired color of the resulting coated article. For example, Examples 30-48 with the Ag/$NiCrO_x$ absorber film (57, 59) as shown in FIG. 1(*i*) have surprisingly more neutral glass side reflective b* values (Rg b*, or R-out b*) values compared to Examples 23-24 where the single NiCr layer absorber was utilized.

Comparing Examples 34-42 and 48, to Comparative Examples (CEs) 43-47, it can be seen that it has surprisingly and unexpectedly been found that initially sputter-depositing the dielectric layer(s) 2 and/or 2" of or including silicon oxide, zirconium oxide, zirconium oxynitride, silicon zirconium oxide and/or silicon zirconium oxynitride (e.g., $SiZrO_x$, $ZrO_2$, $SiO_2$, and/or $SiZrO_xN_y$) so as to comprise a monoclinic phase crystalline structure in Examples 34-42 and 48 is advantageous in that it results in improved thermal stability (lower ΔE* value) and/or reduced change in visible transmission (e.g., $T_{vis}$ or TY) of the coated article upon heat treatment (HT). Generally speaking, CEs 43-47, which may still be according to certain example embodiments of this invention, had less preferred (higher) ΔE* values due to nonmonoclinic $ZrO_2$ layers 2, 2", compared to Examples 34-42 and 48 which had monoclinic $ZrO_2$ layers 2, 2" and thus improved/lower ΔE* values. In certain example embodiments, in connection with certain sputtering equipment, the monoclinic phase (e.g., see the m-$ZrO_2$ peaks in the upper graph of FIG. 51) for the dielectric layer (e.g., $ZrO_2$) 2 and/or 2" may be achieved by using a high oxygen gas flow for that layer during the sputter-deposition process of that layer, and using a metallic sputtering target (e.g., metal Zr or SiZr target) (e.g., see FIG. 55), as in Examples 34-42. In this respect, FIG. 51 illustrates graphs for sputter-depositing a $ZrO_2$ layer using a metal Zr target (upper graph) and a ceramic ZrOx target (lower graph), before and after HT, and shows that the layer comprises a monoclinic phase (see the peak at m-$ZrO_2$) when the metal target with high gas flow (e.g., see FIG. 55) was used, but not when the ceramic target was used in certain situations. It is noted, however, that it has been found that monoclinic phase for layer 2 and/or 2" may indeed be achieved when the sputter-depositing uses a ceramic target such as in Example 48, with low or high oxygen gas flows, depending upon the type of sputtering equipment used.

FIG. 52 (see also FIG. 1(*i*)) is a cross sectional view of coated articles according to Examples 34-42, 48 and Comparative Examples (CEs) 43-47. FIG. 53 illustrates the optical data of Examples 34-42 as coated (AC; annealed) before heat treatment in the left-most data column of each example, and after 12 minutes of heat treatment at 650 degrees C. (HT) in the right data column of each example, Examples 34-42 having a coating stack as shown in FIG. 1(*i*) and FIG. 52 with monoclinic $ZrO_2$ layers 2 and 2" deposited with metal Zr target, and layer thicknesses for Examples 34-42 as shown in FIG. 55; where sample 7982 is Example 34, sample 8077 is Example 35, sample 8085 is Example 36, sample 8090 is Example 37, sample 8091 is Example 38, sample 8097 is Example 39, sample 8186 is Example 40, sample 8187 is Example 41, and sample 8202 is Example 42. FIG. 55 is a chart illustrating deposition process conditions and layer thicknesses for Example 37 having monoclinic $ZrO_2$ layers, with total oxygen flow (ml) during the sputtering process for each layer indicated by the sum of $O_2$ setpoint, $O_2$ tune, and $O_2$ offset, with the high oxygen gas flow during sputter-deposition of the $ZrO_2$ layers helping provide the monoclinic phase of the $ZrO_2$ layers 2 and 2" of Example 37 (monoclinic Examples 34-36 and 38-42 had similar process conditions). In the FIG. 52 and FIG. 1(*i*) embodiments, it is noted, for example, that the center $ZrO_2$ layer 2" may be omitted in certain example instances.

FIG. 57 is a chart illustrating deposition process conditions and layer thicknesses for Example 48 having monoclinic $ZrO_2$ layer 2 (layer 2" was omitted), where the ZrO layer 2 having monoclinic phase was sputter-deposited using a ceramic $ZrO_x$ target. The layer stack of Example 48 is shown in FIGS. 1(*i*) and 52 (with layer 2" omitted), and the respective layer thicknesses are provided in FIG. 57. FIG. 58 illustrates the ΔE* values for coatings according to Example 48 after various heat treatment times, and FIG. 59 illustrates optical data and sheet resistance data for the coatings according to Example 48.

FIG. 54 illustrates the optical data of Comparative Examples (CEs) 43-47 as coated (AC; annealed) before heat treatment in the left-most data column of each example, and after 12 minutes of heat treatment at 650 degrees C. (HT) in the right data column of each example, Examples 43-47 having a coating stack as shown in FIG. 1(*i*) and FIG. 52 with non-monoclinic $ZrO_2$ layers deposited with ceramic target, and layer thicknesses for Examples 43-47 as shown in FIG. 56; where sample 8392 is CE 43, sample 8394 is CE 44, sample 8395 is CE 45, sample 8396 is CE 46, and sample 8397 is CE 47. FIG. 56 is a chart illustrating deposition process conditions and layer thicknesses for Comparative Example (CE) 44 having nonmonoclinic $ZrO_2$ layers 2 and 2", with total oxygen flow (ml) during the sputtering process for each layer indicated by the sum of $O_2$ setpoint, $O_2$ tune, and $O_2$ offset, with the low oxygen gas flow during sputter-deposition of the $ZrO_2$ layers together with ceramic ZrOx target helping provide the non-monoclinic phase of the $ZrO_2$ layers of Example 44 (nonmonoclinic Examples 43 and 45-47 had similar process conditions).

Comparing Examples 34-42, 48 to Comparative Examples (CEs) 43-47, it can be seen that Examples 34-42, 48 with the monoclinic $ZrO_2$ layers 2 and 2" as-deposited realized lower/better ΔE* values, and thus improved thermal stability and color matching upon HT, than did Examples 43-47 which had nonmonoclinic phase $ZrO_2$ layers 2 and 2". Certain terms are prevalently used in the glass coating art, particularly when defining the properties and solar management characteristics of coated glass. Such terms are used herein in accordance with their well known meaning. For example, as used herein:

Intensity of reflected visible wavelength light, i.e. "reflectance" is defined by its percentage and is reported as $R_xY$ or $R_x$ (i.e. the Y value cited below in ASTM E-308-85), wherein "X" is either "G" for glass side or "F" for film side. "Glass side" (e.g. "G" or "g") means, as viewed from the side of the glass substrate opposite that on which the coating resides, while "film side" (i.e. "F" or "f") means, as viewed from the side of the glass substrate on which the coating resides.

Color characteristics are measured and reported herein using the CIE LAB a*, b* coordinates and scale (i.e. the CIE a*b* diagram, Ill. CIE-C, 2 degree observer). Other similar coordinates may be equivalently used such as by the subscript "h" to signify the conventional use of the Hunter Lab Scale, or Ill. CIE-C, 10° observer, or the CIE LUV u*v* coordinates. These scales are defined herein according to ASTM D-2244-93 "Standard Test Method for Calculation of Color Differences From Instrumentally Measured Color Coordinates" 9/15/93 as augmented by ASTM E-308-85, Annual Book of ASTM Standards, Vol. 06.01 "Standard Method for Computing the Colors of Objects by 10 Using the CIE System" and/or as reported in IES LIGHTING HANDBOOK 1981 Reference Volume.

Visible transmittance can be measured using known, conventional techniques. For example, by using a spectrophotometer, such as a Perkin Elmer Lambda 900 or Hitachi U4001, a spectral curve of transmission is obtained. Visible transmission is then calculated using the aforesaid ASTM 308/2244-93 methodology. A lesser number of wavelength points may be employed than prescribed, if desired. Another technique for measuring visible transmittance is to employ a spectrometer such as a commercially available Spectrogard spectrophotometer manufactured by Pacific Scientific Corporation. This device measures and reports visible transmittance directly. As reported and measured herein, visible transmittance (i.e. the Y value in the CIE tristimulus system, ASTM E-308-85), as well as the a*, b*, and L* values, and glass/film side reflectance values, herein use the Ill. C., 2 degree observer standard.

Another term employed herein is "sheet resistance". Sheet resistance ($R_s$) is a well known term in the art and is used herein in accordance with its well known meaning. It is here reported in ohms per square units. Generally speaking, this term refers to the resistance in ohms for any square of a layer system on a glass substrate to an electric current passed through the layer system. Sheet resistance is an indication of how well the layer or layer system is reflecting infrared energy, and is thus often used along with emittance as a measure of this characteristic. "Sheet resistance" may for example be conveniently measured by using a 4-point probe ohmmeter, such as a dispensable 4-point resistivity probe with a Magnetron Instruments Corp. head, Model M-800 produced by Signatone Corp. of Santa Clara, Calif.

The terms "heat treatment" and "heat treating" as used herein mean heating the article to a temperature sufficient to achieve thermal tempering, heat bending, and/or heat strengthening of the glass inclusive coated article. This definition includes, for example, heating a coated article in an oven or furnace at a temperature of least about 580 degrees C., more preferably at least about 600 degrees C., including 650 degrees C., for a sufficient period to allow tempering, bending, and/or heat strengthening. In certain instances, the heat treatment may be for at least about 8 minutes or more as discussed herein.

In an example embodiment of this invention, there is provided a coated article including a coating on a glass substrate, wherein the coating comprises: a first crystalline or substantially crystalline layer comprising zinc oxide doped with from about 1-30% Sn (wt. %), provided on the glass substrate; a first infrared (IR) reflecting layer comprising silver located on the glass substrate and directly over and contacting the first crystalline or substantially crystalline layer comprising zinc oxide doped with from about 1-30% Sn; wherein no silicon nitride based layer is located directly under and contacting the first crystalline or substantially crystalline layer comprising zinc oxide doped with from about 1-30% Sn; at least one dielectric layer having monoclinic phase and comprising an oxide of zirconium (e.g., $ZrO_2$), and optionally further including other element(s) such as Si; wherein the at least one dielectric layer comprising the oxide of zirconium is located: (1) between at least the glass substrate and the first crystalline or substantially crystalline layer comprising zinc oxide doped with from about 1-30% Sn (wt. %), and/or (2) between at least the first IR reflecting layer comprising silver and a second IR reflecting layer comprising silver of the coating; optionally an absorber film including a layer comprising silver, wherein a ratio of a physical thickness of the first IR reflecting layer comprising silver to a physical thickness of the layer comprising silver of the absorber film is at least 5:1 (more preferably at least 8:1, even more preferably at least 10:1, and most preferably at least 15:1); and wherein the coated article is configured to have, measured monolithically, at least two of: (i) a transmissive $\Delta E^*$ value of no greater than 3.0 due to a reference heat treatment for 12 minutes at a temperature of about 650 degrees C., (ii) a glass side reflective $\Delta E^*$ value of no greater than 3.0 due to the reference heat treatment for 12 minutes at a temperature of about 650 degrees C., and (iii) a film side reflective $\Delta E^*$ value of no greater than 3.5 due to the reference heat treatment for 12 minutes at a temperature of about 650 degrees C.

The coated article of the immediately preceding paragraph may be configured to have, measured monolithically, all three of: (i) a transmissive $\Delta E^*$ value of no greater than 3.0 due to a reference heat treatment for 12 minutes at a temperature of about 650 degrees C., (ii) a glass side reflective $\Delta E^*$ value of no greater than 3.0 due to the reference heat treatment for 12 minutes at a temperature of about 650 degrees C., and (iii) a film side reflective $\Delta E^*$ value of no greater than 3.5 due to the reference heat treatment for 12 minutes at a temperature of about 650 degrees C.

In the coated article of any of the preceding two paragraphs, the least one dielectric layer comprising the oxide of zirconium may be located at least between at least the glass substrate and the first crystalline or substantially crystalline layer comprising zinc oxide doped with from about 1-30% Sn (wt. %).

In the coated article of any of the preceding three paragraphs, the least one dielectric layer comprising the oxide of zirconium may be located at least between at least the first IR reflecting layer comprising silver and the second IR reflecting layer comprising silver of the coating.

In the coated article of any of the preceding four paragraphs, the at least one dielectric layer comprising the oxide of zirconium may include both a first layer comprising an oxide of zirconium, and a second layer comprising an oxide of zirconium (each of which may further include additional element(s) such as Si); wherein the first layer may be located between at least the glass substrate and the first crystalline or substantially crystalline layer comprising zinc oxide doped with from about 1-30% Sn (wt. %); and wherein the second layer may be located between at least the first IR reflecting layer comprising silver and the second IR reflecting layer comprising silver of the coating.

In the coated article of any of the preceding five paragraphs, the at least one dielectric layer may comprise or consist essentially of the oxide of zirconium and/or an oxide of silicon and zirconium (e.g., $SiZrO_x$). For instance, the dielectric layer comprising the oxide of silicon and zirconium may have a metal content of from 51-99% Si and from 1-49% Zr, more preferably from 70-97% Si and from 3-30% Zr (atomic %).

In the coated article of any of the preceding six paragraphs, the at least one dielectric layer may comprise $ZrO_2$.

In the coated article of any of the preceding seven paragraphs, the first crystalline or substantially crystalline layer comprising zinc oxide may be doped with from about 1-20% Sn, more preferably from about 5-15% Sn (wt. %).

In the coated article of any of the preceding eight paragraphs, the first crystalline or substantially crystalline layer comprising zinc oxide doped with Sn may be crystalline or substantially crystalline as sputter-deposited.

The coated article according to any of the preceding nine paragraphs may be configured to have, measured monolithically, all of: (i) a transmissive $\Delta E^*$ value of no greater than 2.5 due to a reference heat treatment for 12 minutes at a temperature of about 650 degrees C., (ii) a glass side reflective $\Delta E^*$ value of no greater than 2.5 due to the reference heat treatment for 12 minutes at a temperature of about 650 degrees C., and (iii) a film side reflective $\Delta E^*$ value of no greater than 3.0 due to the reference heat treatment for 12 minutes at a temperature of about 650 degrees C.

The coated article according to any of the preceding ten paragraphs may be configured to have, measured monolithically, at least two of: (i) a transmissive $\Delta E^*$ value of no greater than 2.3 due to a reference heat treatment for 16 minutes at a temperature of about 650 degrees C., (ii) a glass side reflective $\Delta E^*$ value of no greater than 2.0 due to the reference heat treatment for 16 minutes at a temperature of about 650 degrees C., and (iii) a film side reflective $\Delta E^*$ value of no greater than 3.0 due to the reference heat treatment for 16 minutes at a temperature of about 650 degrees C.

The coated article according to any of the preceding eleven paragraphs may be configured so that the coating may have a sheet resistance ($R_s$) of no greater than 20 ohms/square, more preferably no greater than 10 ohms/square, and most preferably no greater than 2.5 ohms/square.

The coated article according to any of the preceding twelve paragraphs may have, measured monolithically, a visible transmission of at least 35%, more preferably of at least 50%, and more preferably of at least 68%.

In the coated article of any of the preceding thirteen paragraphs, the coating as deposited may further comprise a first amorphous or substantially amorphous layer comprising zinc stannate located on the glass substrate over at least the first IR reflecting layer comprising silver. The first amorphous or substantially amorphous layer comprising zinc stannate may have a metal content of from about 40-60% Zn and from about 40-60% Sn (wt. %).

In the coated article of any of the preceding fourteen paragraphs, the coating may further comprise a contact layer located over and directly contacting the first IR reflecting layer comprising silver. The contact layer may comprise Ni and/or Cr, and may or may not be oxided and/or nitrided.

In the coated article of any of the preceding fifteen paragraphs, the coating may further comprise: the second IR reflecting layer comprising silver located on the glass substrate over at least the first IR reflecting layer comprising silver, a second crystalline or substantially crystalline layer comprising zinc oxide doped with from about 1-30% Sn (wt. %), located under and directly contacting the second IR reflecting layer comprising silver; and wherein no silicon nitride based layer need be located between the glass substrate and the second IR reflecting layer comprising silver.

In the coated article of any of the preceding sixteen paragraphs, the coating may further comprise an amorphous or substantially amorphous layer, as deposited, comprising zinc stannate located on the glass substrate over at least the second IR reflecting layer comprising silver. The amorphous or substantially amorphous layer comprising zinc stannate, which is amorphous or substantially amorphous as deposited, may have a metal content of from about 40-60% Zn and from about 40-60% Sn (wt. %). In certain example embodiments, the coating may further comprise a layer comprising silicon nitride located over at least the amorphous or substantially amorphous layer comprising zinc stannate.

The coated article of any of the preceding seventeen paragraphs may be thermally tempered.

The coated article of any of the preceding eighteen paragraphs may further comprise a metallic or substantially metallic absorber layer located between the glass substrate and the first IR reflecting layer. The absorber layer may be sandwiched between and contacting first and second layers comprising silicon nitride. The absorber layer may comprise Ni and Cr (e.g., NiCr, NiCrMo), or any other suitable material such as NbZr. The dielectric layer comprising at least one of (a), (b), and (c) may be located between at least the absorber layer and the first crystalline or substantially crystalline layer comprising zinc oxide.

In the coated article of any of the preceding nineteen paragraphs, the at least one dielectric layer comprising the oxide of zirconium may comprise from 0-20% nitrogen, more preferably from 0-10% nitrogen, and most preferably from 0-5% nitrogen (atomic %).

In the coated article of any of the preceding twenty paragraphs, the absorber film may further comprises a layer comprising an oxide of Ni and/or Cr located over and directly contacting the layer comprising silver of the absorber film. In the coated article of any of the preceding twenty-one paragraphs, the absorber film may be located over the first IR reflecting layer, so that the first IR reflecting layer is located between at least the absorber film and the glass substrate.

In the coated article of any of the preceding twenty-two paragraphs, the ratio of the physical thickness of the first IR reflecting layer comprising silver to the physical thickness of the layer comprising silver of the absorber film may be at least 8:1, more preferably at least 10:1, and even more preferably at least 15:1.

In the coated article of any of the preceding twenty-three paragraphs, the layer comprising silver of the absorber film may be less than 30 Å thick, more preferably less than 20 Å thick, and even more preferably less than 15 Å thick.

In the coated article of any of the preceding twenty-four paragraphs, the coated article need not be thermally tempered.

In the coated article of any of the preceding twenty-five paragraphs, the at least one dielectric layer having monoclinic phase and comprising the oxide of zirconium may includes two such layers comprising zirconium oxide and may be located both: (1) between at least the glass substrate and the first crystalline or substantially crystalline layer comprising zinc oxide doped with from about 1-30% Sn (wt. %), and (2) between at least the first IR reflecting layer comprising silver and the absorber film.

In the coated article of any of the preceding twenty-six paragraphs, the at least one dielectric layer having monoclinic phase may comprise from 0-5% nitrogen (atomic %).

In the coated article of any of the preceding twenty-seven paragraphs, the at least one dielectric layer having monoclinic phase may comprise an oxide of zirconium (e.g., $ZrO_2$), and may optionally further include Si.

In the coated article of any of the preceding twenty-seven paragraphs, the at least one dielectric layer having monoclinic phase may consist essentially of an oxide of zirconium.

In the coated article of any of the preceding twenty-eight paragraphs, the at least one dielectric layer having monoclinic phase may be configured to realize a density change of at least 0.25 $g/cm^3$ upon said reference heat treatment, more preferably to realize a density change of at least 0.30 $g/cm^3$ upon said reference heat treatment, and most preferably to realize a density change of at least 0.35 $g/cm^3$ upon said reference heat treatment.

In the coated article of any of the preceding twenty-nine paragraphs, the at least one dielectric layer having monoclinic phase may comprise an oxide of zirconium, and may have a metal content of at least 80% Zr.

In the coated article of any of the preceding thirty paragraphs, the at least one dielectric layer having monoclinic phase may comprise an oxide of zirconium and/or may have a thickness of from 40-250 Å, more preferably from 40-170 Å, and most preferably from 80-140 Å.

In the coated article of any of the preceding thirty-one paragraphs, the coated article may be configured to have, measured monolithically, two or three of: (i) a transmissive ΔE* value of no greater than 3.0 upon a reference heat treatment for 12 minutes at a temperature of about 650 degrees C., (ii) a glass side reflective ΔE* value of no greater than 1.5 upon the reference heat treatment for 12 minutes at a temperature of about 650 degrees C., and (iii) a film side reflective ΔE* value of no greater than 1.5 upon the reference heat treatment for 12 minutes at a temperature of about 650 degrees C.

The coated article of any of the preceding thirty-two paragraphs may be provided as a monolithic window, or in an IG window unit coupled to another glass substrate.

In the coated article of any of the preceding thirty-three paragraphs, the at least one dielectric layer comprising monoclinic phase may further comprise tetragonal phase before and/or after a reference heat treatment.

In an example embodiment, there is provided a method of making a coated article including a coating on a glass substrate, the method comprising: sputter-depositing a layer comprising zinc on the glass substrate; sputter-depositing a first infrared (IR) reflecting layer comprising silver on the glass substrate over and contacting the layer comprising zinc oxide; sputter-depositing at least one dielectric layer (e.g., oxide of zirconium, such as $ZrO_2$) having monoclinic phase on the glass substrate, wherein the dielectric layer having monoclinic phase comprises an oxide of zirconium (and which may further include other element(s) such as Si); wherein the at least one dielectric layer having monoclinic phase and comprising the oxide of zirconium is located: (1) between at least the glass substrate and the layer comprising zinc oxide, and/or (2) between at least the first IR reflecting layer comprising silver and a second IR reflecting layer comprising silver of the coating; and wherein the coated article is configured to have, measured monolithically, at least two of: (i) a transmissive $\Delta E^*$ value of no greater than 3.0 upon a reference heat treatment for 12 minutes at a temperature of about 650 degrees C., (ii) a glass side reflective $\Delta E^*$ value of no greater than 3.0 upon the reference heat treatment for 12 minutes at a temperature of about 650 degrees C., and (iii) a film side reflective $\Delta E^*$ value of no greater than 3.5 upon the reference heat treatment for 12 minutes at a temperature of about 650 degrees C. T In the method of the immediately preceding paragraph, said sputter-depositing at least one dielectric layer having monoclinic phase on the glass substrate may use an oxygen gas flow of at least 6 ml/kW, more preferably an oxygen gas flow of at least 8 or 10 ml/kW.

In the method of any of the preceding two paragraphs, the at least one dielectric layer having monoclinic phase may comprise $ZrO_2$, and may further include Si.

In the method of any of the preceding three paragraphs, the coated article may be configured to have, measured monolithically, at least two or all three of: (i) a transmissive $\Delta E^*$ value of no greater than 3.0 upon a reference heat treatment for 12 minutes at a temperature of about 650 degrees C., (ii) a glass side reflective $\Delta E^*$ value of no greater than 1.5 upon the reference heat treatment for 12 minutes at a temperature of about 650 degrees C., and (iii) a film side reflective $\Delta E^*$ value of no greater than 1.5 upon the reference heat treatment for 12 minutes at a temperature of about 650 degrees C.

The method of any of the preceding four paragraphs may further comprise heat treating the coated article via said reference heat treatment so that the at least one dielectric layer having monoclinic phase realizes a density change of at least 0.25 $g/cm^3$ upon said reference heat treatment, more preferably at least 0.30 $g/cm^3$, and most preferably of at least 0.35 $g/cm^3$.

In the method of any of the preceding five paragraphs, said sputter-depositing of the at least one dielectric layer having monoclinic phase on the glass substrate may use a metal target, or a ceramic target.

In the method of any of the preceding six paragraphs, said at least one dielectric layer comprising monoclinic phase may further comprise tetragonal phase before and/or after said reference heat treatment.

In the method of any of the preceding seven paragraphs, the at least one dielectric layer comprising monoclinic phase may be configured to have a monoclinic peak thereof reduce upon said reference heat treatment.

Once given the above disclosure many other features, modifications and improvements will become apparent to the skilled artisan. Such other features, modifications and improvements are therefore considered to be a part of this invention, the scope of which is to be determined by the following claims:

What is claimed is:

1. A coated article including a coating on a glass substrate, wherein the coating comprises:
    a first crystalline or substantially crystalline layer comprising zinc oxide doped with from about 1-30% Sn (wt. %), provided on the glass substrate;
    a first infrared (IR) reflecting layer comprising silver located on the glass substrate and directly over and contacting the first crystalline or substantially crystalline layer comprising zinc oxide doped with from about 1-30% Sn;
    wherein no silicon nitride based layer is located directly under and contacting the first crystalline or substantially crystalline layer comprising zinc oxide doped with from about 1-30% Sn;
    at least one dielectric layer having monoclinic phase and comprising an oxide of zirconium;
    wherein the at least one dielectric layer having monoclinic phase and comprising the oxide of zirconium is located: (1) between at least the glass substrate and the first crystalline or substantially crystalline layer comprising zinc oxide doped with from about 1-30% Sn (wt. %), and/or (2) between at least the first IR reflecting layer comprising silver and a second IR reflecting layer comprising silver of the coating;
    an absorber film including a layer comprising silver, wherein a ratio of a physical thickness of the first IR reflecting layer comprising silver to a physical thickness of the layer comprising silver of the absorber film is at least 5:1, and wherein the layer comprising silver of the absorber film does not directly contact the first IR reflecting layer; and
    wherein the coated article is configured to have, measured monolithically, all of: (i) a transmissive $\Delta E^*$ value of no greater than 3.0 upon a reference heat treatment for 12 minutes at a temperature of about 650 degrees C., and (ii) a glass side reflective $\Delta E^*$ value of no greater than 3.0 upon the reference heat treatment for 12 minutes at a temperature of about 650 degrees C.

2. The coated article of claim 1, wherein the absorber film further comprises a layer comprising an oxide of Ni and/or Cr located over and directly contacting the layer comprising silver of the absorber film.

3. The coated article of claim 1, wherein the absorber film is located over the first IR reflecting layer, so that the first IR reflecting layer is located between at least the absorber film and the glass substrate.

4. The coated article of claim 1, wherein the ratio of the physical thickness of the first IR reflecting layer comprising silver to the physical thickness of the layer comprising silver of the absorber film is at least 8:1.

5. The coated article of claim 1, wherein the ratio of the physical thickness of the first IR reflecting layer comprising silver to the physical thickness of the layer comprising silver of the absorber film is at least 10:1.

6. The coated article of claim 1, wherein the ratio of the physical thickness of the first IR reflecting layer comprising silver to the physical thickness of the layer comprising silver of the absorber film is at least 15:1.

7. The coated article of claim 1, wherein the layer comprising silver of the absorber film is less than 60 Å thick.

8. The coated article of claim 1, wherein the layer comprising silver of the absorber film is less than 30 Å thick.

9. The coated article of claim 1, wherein the layer comprising silver of the absorber film is less than 15 Å thick.

10. The coated article of claim 1, wherein the coated article is configured to have, measured monolithically, all three of: (i) a transmissive $\Delta E^*$ value of no greater than 3.0 upon a reference heat treatment for 12 minutes at a temperature of about 650 degrees C., (ii) a glass side reflective $\Delta E^*$ value of no greater than 3.0 upon the reference heat treatment for 12 minutes at a temperature of about 650 degrees C., and (iii) a film side reflective $\Delta E^*$ value of no greater than 3.5 upon the reference heat treatment for 12 minutes at a temperature of about 650 degrees C.

11. The coated article of claim 1, wherein the at least one dielectric layer comprising monoclinic phase is located at least between at least the glass substrate and the first crystalline or substantially crystalline layer comprising zinc oxide doped with from about 1-30% Sn (wt. %).

12. The coated article of claim 1, wherein the at least one dielectric layer comprising monoclinic phase is located at least between at least the first IR reflecting layer comprising silver and the second IR reflecting layer comprising silver of the coating.

13. The coated article of claim 1, wherein the first crystalline or substantially crystalline layer comprising zinc oxide is doped with from about 1-20% Sn (wt. %).

14. The coated article of claim 1, wherein the first crystalline or substantially crystalline layer comprising zinc oxide is doped with from about 5-15% Sn (wt. %).

15. The coated article of claim 1, wherein the first crystalline or substantially crystalline layer comprising zinc oxide doped with Sn is crystalline or substantially crystalline as sputter-deposited.

16. The coated article of claim 1, wherein the coated article is configured to have, measured monolithically, all of: (i) a transmissive $\Delta E^*$ value of no greater than 2.5 upon a reference heat treatment for 12 minutes at a temperature of about 650 degrees C., (ii) a glass side reflective $\Delta E^*$ value of no greater than 2.5 upon the reference heat treatment for 12 minutes at a temperature of about 650 degrees C., and (iii) a film side reflective $\Delta E^*$ value of no greater than 3.0 upon the reference heat treatment for 12 minutes at a temperature of about 650 degrees C.

17. The coated article of claim 1, wherein the coated article is configured to have, measured monolithically, at least two of: (i) a transmissive $\Delta E^*$ value of no greater than 2.3 upon a reference heat treatment for 16 minutes at a temperature of about 650 degrees C., (ii) a glass side reflective $\Delta E^*$ value of no greater than 2.0 upon the reference heat treatment for 16 minutes at a temperature of about 650 degrees C., and (iii) a film side reflective $\Delta E^*$ value of no greater than 3.0 upon the reference heat treatment for 16 minutes at a temperature of about 650 degrees C.

18. The coated article of claim 1, wherein said coating has a sheet resistance ($R_s$) of no greater than 10 ohms/square.

19. The coated article of claim 1, wherein said coated article, measured monolithically, has a visible transmission of at least 40%.

20. The coated article of claim 1, wherein the coating as deposited further comprises a first amorphous or substantially amorphous layer comprising zinc stannate located on the glass substrate over at least the first IR reflecting layer comprising silver.

21. The coated article of claim 20, wherein the first amorphous or substantially amorphous layer comprising zinc stannate has a metal content of from about 40-60% Zn and from about 40-60% Sn (wt. %).

22. The coated article of claim 1, wherein the at least one dielectric layer comprising monoclinic phase may be configured to have a monoclinic peak thereof reduce upon said reference heat treatment.

23. The coated article of claim 1, wherein the coating further comprises:
  a second IR reflecting layer comprising silver located on the glass substrate over at least the first IR reflecting layer comprising silver,
  a second crystalline or substantially crystalline layer comprising zinc oxide doped with from about 1-30% Sn (wt. %), located under and directly contacting the second IR reflecting layer comprising silver;
  wherein no silicon nitride based layer is located between the glass substrate and the second IR reflecting layer comprising silver; and
  wherein the layer comprising silver of the absorber film does not directly contact any of the first and second IR reflecting layers.

24. The coated article of claim 1, wherein the coated article is not thermally tempered.

25. The coated article of claim 1, wherein the at least one dielectric layer comprising monoclinic phase comprises $ZrO_2$.

26. The coated article of claim 1, wherein the at least one dielectric layer comprising monoclinic phase consists essentially of the oxide of zirconium.

27. The coated article of claim 1, wherein the at least one dielectric layer comprising monoclinic phase is configured to realize a density change of at least 0.25 g/cm$^3$ upon said reference heat treatment.

28. The coated article of claim 1, wherein the at least one dielectric layer comprising monoclinic phase is configured to realize a density change of at least 0.30 g/cm$^3$ upon said reference heat treatment.

29. The coated article of claim 1, wherein the at least one dielectric layer comprising monoclinic phase is configured to realize a density change of at least 0.35 g/cm$^3$ upon said reference heat treatment.

30. The coated article of claim 1, wherein the at least one dielectric layer comprising monoclinic phase comprises an oxide of zirconium, and has a metal content of at least 80% Zr.

31. The coated article of claim 1, wherein the at least one dielectric layer comprising monoclinic phase and comprising the oxide of zirconium has a thickness of from 40-170 Å.

32. The coated article of claim 1, wherein the at least one dielectric layer comprising monoclinic phase and comprising the oxide of zirconium, further comprises Si.

33. The coated article of claim 1, wherein the coated article is configured to have, measured monolithically, at least two of: (i) a transmissive $\Delta E^*$ value of no greater than 3.0 upon a reference heat treatment for 12 minutes at a temperature of about 650 degrees C., (ii) a glass side reflective $\Delta E^*$ value of no greater than 1.5 upon the reference heat treatment for 12 minutes at a temperature of about 650 degrees C., and (iii) a film side reflective $\Delta E^*$ value of no greater than 1.5 upon the reference heat treatment for 12 minutes at a temperature of about 650 degrees C.

34. The coated article of claim 1, wherein the coated article is configured to have, measured monolithically, all three of: (i) a transmissive $\Delta E^*$ value of no greater than 3.0 upon a reference heat treatment for 12 minutes at a temperature of about 650 degrees C., (ii) a glass side reflective ΔE* value of no greater than 1.5 upon the reference heat treatment for 12 minutes at a temperature of about 650 degrees C., and (iii) a film side reflective ΔE* value of no greater than 1.5 upon the reference heat treatment for 12 minutes at a temperature of about 650 degrees C.

35. A coated article including a coating on a glass substrate, wherein the coating comprises:
a layer comprising zinc oxide provided on the glass substrate;
a first infrared (IR) reflecting layer comprising silver located on the glass substrate and directly over and contacting the layer comprising zinc oxide;
wherein no silicon nitride based layer is located directly under and contacting the layer comprising zinc oxide;
at least one dielectric layer comprising monoclinic phase and comprising an oxide of zirconium;
wherein the at least one dielectric layer comprising monoclinic phase and comprising the oxide of zirconium is located: (1) between at least the glass substrate and the layer comprising zinc oxide, and/or (2) between at least the first IR reflecting layer comprising silver and a second IR reflecting layer comprising silver of the coating; and
wherein the coated article is configured to have, measured monolithically, all of: (i) a transmissive ΔE* value of no greater than 3.0 upon a reference heat treatment for 12 minutes at a temperature of about 650 degrees C., and (ii) a glass side reflective ΔE* value of no greater than 3.0 upon the reference heat treatment for 12 minutes at a temperature of about 650 degrees C.

36. The coated article of claim 35, wherein the coated article is not thermally tempered.

37. The coated article of claim 35, wherein the at least one dielectric layer comprising monoclinic phase includes two layers comprising zirconium oxide, one of which is located (1) between at least the glass substrate and the layer comprising zinc oxide, and the other of which is located (2) between at least the first and second IR reflecting layers comprising silver.

38. The coated article of claim 35, wherein the at least one dielectric layer comprising monoclinic phase comprises from 0-5% nitrogen (atomic %).

39. The coated article of claim 35, wherein the at least one dielectric layer comprising monoclinic phase and comprising the oxide of zirconium, further includes Si.

40. The coated article of claim 35, wherein the at least one dielectric layer comprising monoclinic phase consists essentially of an oxide of zirconium.

41. The coated article of claim 35, wherein the at least one dielectric layer comprising monoclinic phase is configured to realize a density change of at least 0.25 g/cm³ upon said reference heat treatment, and
wherein the at least one dielectric layer comprising monoclinic phase may be configured to have a monoclinic peak thereof reduce upon said reference heat treatment.

42. The coated article of claim 35, wherein the at least one dielectric layer comprising monoclinic phase is configured to realize a density change of at least 0.30 g/cm³ upon said reference heat treatment.

43. The coated article of claim 35, wherein the at least one dielectric layer comprising monoclinic phase is configured to realize a density change of at least 0.35 g/cm³ upon said reference heat treatment.

44. The coated article of claim 35, wherein the at least one dielectric layer comprising monoclinic phase has a metal content of at least 80% Zr.

45. The coated article of claim 35, wherein the at least one dielectric layer comprising monoclinic phase has a thickness of from 40-250 Å.

46. The coated article of claim 35, wherein the at least one dielectric layer comprising monoclinic phase further comprises tetragonal phase.

47. The coated article of claim 35, wherein the coated article is configured to have, measured monolithically, at least two of: (i) a transmissive ΔE* value of no greater than 3.0 upon a reference heat treatment for 12 minutes at a temperature of about 650 degrees C., (ii) a glass side reflective ΔE* value of no greater than 1.5 upon the reference heat treatment for 12 minutes at a temperature of about 650 degrees C., and (iii) a film side reflective ΔE* value of no greater than 1.5 upon the reference heat treatment for 12 minutes at a temperature of about 650 degrees C.

48. The coated article of claim 35, wherein the coated article is configured to have, measured monolithically, all three of: (i) a transmissive ΔE* value of no greater than 3.0 upon a reference heat treatment for 12 minutes at a temperature of about 650 degrees C., (ii) a glass side reflective ΔE* value of no greater than 1.5 upon the reference heat treatment for 12 minutes at a temperature of about 650 degrees C., and (iii) a film side reflective ΔE* value of no greater than 1.5 upon the reference heat treatment for 12 minutes at a temperature of about 650 degrees C.

49. A method of making a coated article including a coating on a glass substrate, the method comprising:
sputter-depositing a layer comprising zinc oxide on the glass substrate;
sputter-depositing a first infrared (IR) reflecting layer comprising silver on the glass substrate over and contacting the layer comprising zinc oxide;
sputter-depositing at least one dielectric layer comprising monoclinic phase on the glass substrate, wherein the dielectric layer comprising monoclinic phase comprises an oxide of zirconium;
wherein the at least one dielectric layer comprising monoclinic phase and comprising the oxide of zirconium is located: (1) between at least the glass substrate and the layer comprising zinc oxide, and/or (2) between at least the first IR reflecting layer comprising silver and a second IR reflecting layer comprising silver of the coating; and
wherein the coated article is configured to have, measured monolithically, all of: (i) a transmissive ΔE* value of no greater than 3.0 upon a reference heat treatment for 12 minutes at a temperature of about 650 degrees C., and (ii) a glass side reflective ΔE* value of no greater than 3.0 upon the reference heat treatment for 12 minutes at a temperature of about 650 degrees C.

50. The method of claim 49, wherein said sputter-depositing the at least one dielectric layer comprising monoclinic phase on the glass substrate uses an oxygen gas flow of at least 6 ml/kW.

51. The method of claim 49, wherein said sputter-depositing the at least one dielectric layer comprising monoclinic phase on the glass substrate uses an oxygen gas flow of at least 8 ml/kW.

52. The method of claim 49, wherein said at least one dielectric layer comprising monoclinic phase comprises $ZrO_2$.

53. The method of claim 49, wherein the coated article is configured to have, measured monolithically, all three of: (i) a transmissive ΔE* value of no greater than 3.0 upon a reference heat treatment for 12 minutes at a temperature of about 650 degrees C., (ii) a glass side reflective ΔE* value of no greater than 1.5 upon the reference heat treatment for 12 minutes at a temperature of about 650 degrees C., and (iii) a film side reflective ΔE* value of no greater than 1.5 upon the reference heat treatment for 12 minutes at a temperature of about 650 degrees C.

54. The method of claim 49, further comprising heat treating the coated article via said reference heat treatment so that the at least one dielectric layer comprising monoclinic phase realizes a density change of at least 0.25 g/cm$^3$ upon said reference heat treatment.

55. The method of claim 49, wherein said sputter-depositing the at least one dielectric layer comprising monoclinic phase on the glass substrate uses a metal target.

56. The method of claim 55, wherein said sputter-depositing at least one dielectric layer comprising monoclinic phase on the glass substrate uses an oxygen gas flow of at least 6 ml/kW.

57. The method of claim 49, wherein said sputter-depositing the at least one dielectric layer comprising monoclinic phase on the glass substrate uses a ceramic target.

58. The method of claim 49, wherein said at least one dielectric layer comprising monoclinic phase further comprises tetragonal phase.

59. The method of claim 49, wherein the at least one dielectric layer comprising monoclinic phase is configured to have a monoclinic peak thereof reduce upon said reference heat treatment.

60. A coated article including a coating on a glass substrate, wherein the coating comprises:
- a layer comprising zinc oxide provided on the glass substrate;
- a first infrared (IR) reflecting layer comprising silver located on the glass substrate and directly over and contacting the layer comprising zinc oxide;
- wherein no silicon nitride based layer is located directly under and contacting the layer comprising zinc oxide;
- at least one dielectric layer comprising monoclinic phase and comprising metal oxide;
- wherein the at least one dielectric layer comprising monoclinic phase and comprising metal oxide is located: (1) between at least the glass substrate and the layer comprising zinc oxide, and/or (2) between at least the first IR reflecting layer comprising silver and a second IR reflecting layer comprising silver of the coating; and
- wherein the coated article is configured to have, measured monolithically, all of: (i) a transmissive ΔE* value of no greater than 3.0 upon a reference heat treatment for 12 minutes at a temperature of about 650 degrees C., and (ii) a glass side reflective ΔE* value of no greater than 3.0 upon the reference heat treatment for 12 minutes at a temperature of about 650 degrees C.

* * * * *